US011935986B2

(12) United States Patent
Kim et al.

(10) Patent No.: US 11,935,986 B2
(45) Date of Patent: Mar. 19, 2024

(54) DISPLAY DEVICE AND MANUFACTURING METHOD THEREFOR

(71) Applicant: Samsung Display Co., Ltd., Yongin-si (KR)

(72) Inventors: Dong Uk Kim, Yongin-si (KR); Jin Oh Kwag, Yongin-si (KR); Keun Kyu Song, Yongin-si (KR); Sung-Chan Jo, Yongin-si (KR); Hyun Min Cho, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 379 days.

(21) Appl. No.: 17/298,445

(22) PCT Filed: May 30, 2019

(86) PCT No.: PCT/KR2019/006537
§ 371 (c)(1),
(2) Date: May 28, 2021

(87) PCT Pub. No.: WO2020/111417
PCT Pub. Date: Jun. 4, 2020

(65) Prior Publication Data
US 2022/0029058 A1    Jan. 27, 2022

(30) Foreign Application Priority Data
Nov. 30, 2018  (KR) .................. 10-2018-0152420

(51) Int. Cl.
*H01L 33/38* (2010.01)
*H01L 25/075* (2006.01)
(Continued)

(52) U.S. Cl.
CPC ........ *H01L 33/382* (2013.01); *H01L 25/0753* (2013.01); *H01L 33/005* (2013.01);
(Continued)

(58) Field of Classification Search
CPC . H01L 25/0753; H01L 25/167; H01L 33/005; H01L 33/24; H01L 33/382;
(Continued)

(56) References Cited

U.S. PATENT DOCUMENTS 5,102,824 A    4/1992  Neugebauer et al.
5,231,049 A    7/1993  Neugebauer et al.
(Continued)

FOREIGN PATENT DOCUMENTS

CN    104838508 A    8/2015
CN    104871231 A    8/2015
(Continued)

OTHER PUBLICATIONS

International Search Report for corresponding Application No. PCT/KR2019/006537 dated Sep. 10, 2019, 4pp.

*Primary Examiner* — Brook Kebede
(74) *Attorney, Agent, or Firm* — Lewis Roca Rothgerber Christie LLP

(57) ABSTRACT

A display device may include: a substrate including a display area and a non-display area; and pixels in the display area, and each including sub-pixels. Each sub-pixel may include a pixel circuit layer, and a display element layer including at least one light emitting element. The display element layer may include: a first electrode on the pixel circuit layer; a second electrode on the first electrode and electrically insulated from the first electrode; the light emitting element including a first end portion coupled to the first electrode and a second end portion coupled to the second electrode, and between the first electrode and the second electrode; an intermediate layer enclosing at least one area of the light emitting element, and on the first electrode; a connection line electrically connected to the second electrode. The second electrode may be on the intermediate layer.

20 Claims, 26 Drawing Sheets

(51) Int. Cl.
*H01L 33/00* (2010.01)
*H01L 33/24* (2010.01)
*H01L 33/62* (2010.01)

(52) U.S. Cl.
CPC .............. *H01L 33/24* (2013.01); *H01L 33/62* (2013.01); *H01L 2933/0016* (2013.01); *H01L 2933/0066* (2013.01)

(58) Field of Classification Search
CPC ............ H01L 33/62; H01L 2933/0016; H10K 59/131; H10K 59/17; H10K 59/32; H10K 59/35; H10K 59/50; H10K 59/65; H10K 59/80516; H10K 59/80517; H10K 59/80518; H10K 59/80524; H10K 59/82; H10K 59/8731
See application file for complete search history.

(56) References Cited

U.S. PATENT DOCUMENTS

| | | | |
|---|---|---|---|
| 7,897,971 B2 | 3/2011 | Kurokawa et al. | |
| 8,872,214 B2 | 10/2014 | Negishi et al. | |
| 9,059,114 B2 | 6/2015 | Do et al. | |
| 9,112,112 B2 | 8/2015 | Do et al. | |
| 9,343,448 B2 | 5/2016 | Sakariya et al. | |
| 10,373,985 B2 | 8/2019 | Kim et al. | |
| 10,461,123 B2 | 10/2019 | Kim et al. | |
| 10,818,820 B2 | 10/2020 | Kim | |
| 2011/0089850 A1 | 4/2011 | Shibata et al. | |
| 2014/0159043 A1 | 6/2014 | Sakariya et al. | |
| 2017/0186971 A1* | 6/2017 | Kanamoto | H10K 85/6572 |
| 2017/0294451 A1* | 10/2017 | Kim | H01L 25/167 |
| 2017/0294565 A1 | 10/2017 | Kim | |
| 2018/0010754 A1 | 1/2018 | Albou et al. | |

FOREIGN PATENT DOCUMENTS

| | | |
|---|---|---|
| KR | 10-2004-0029385 A | 4/2004 |
| KR | 10-1209449 B1 | 12/2012 |
| KR | 10-2016-0079523 A | 7/2016 |
| KR | 10-2017-0104086 A | 9/2017 |
| KR | 10-2017-0117282 A | 10/2017 |
| KR | 10-2018-0072909 A | 7/2018 |
| KR | 10-2019-0120467 A | 10/2019 |
| KR | 10-2020-0013824 A | 2/2020 |
| TW | 200924198 A | 6/2009 |
| WO | WO 2014/093063 A1 | 6/2014 |
| WO | WO 2014/093065 A1 | 6/2014 |

\* cited by examiner

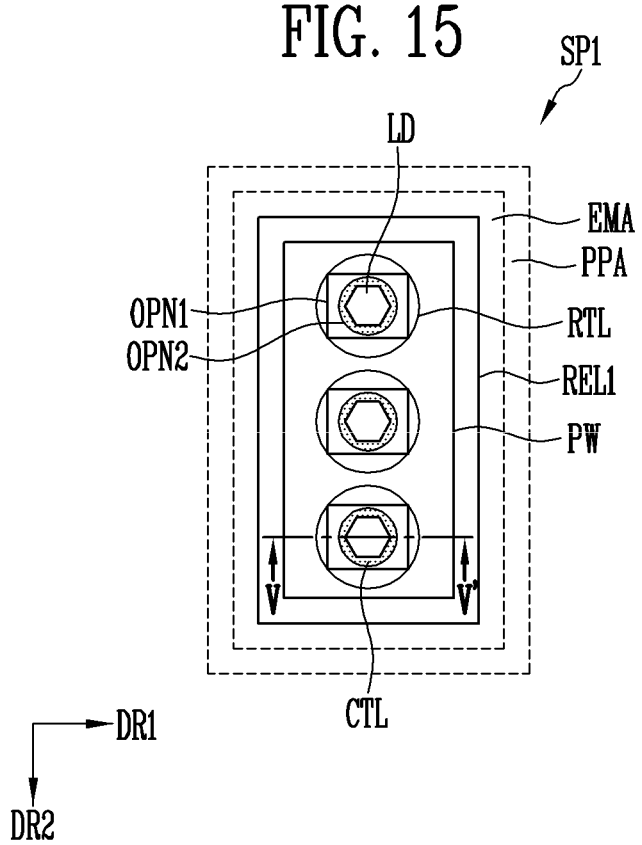

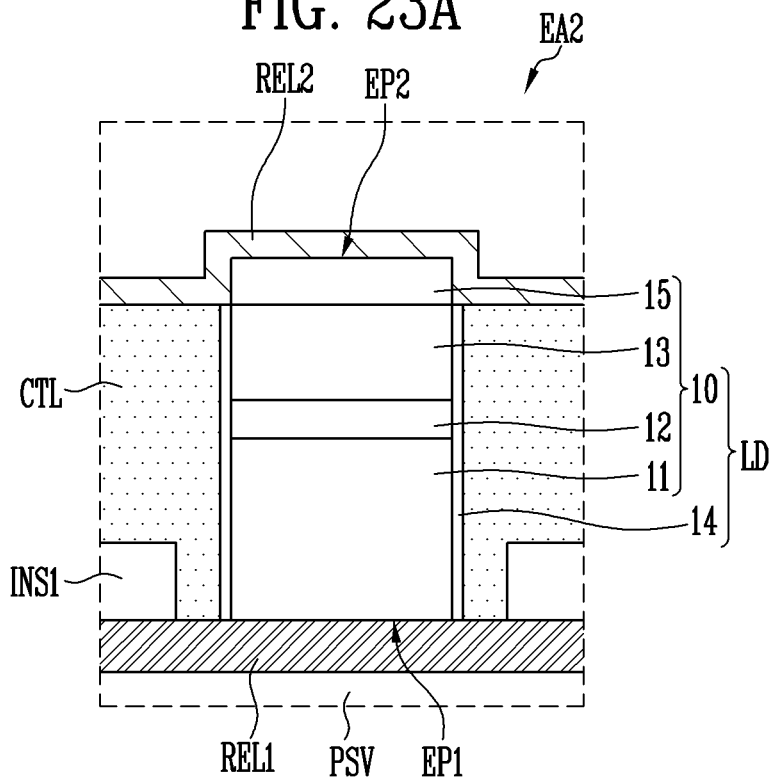
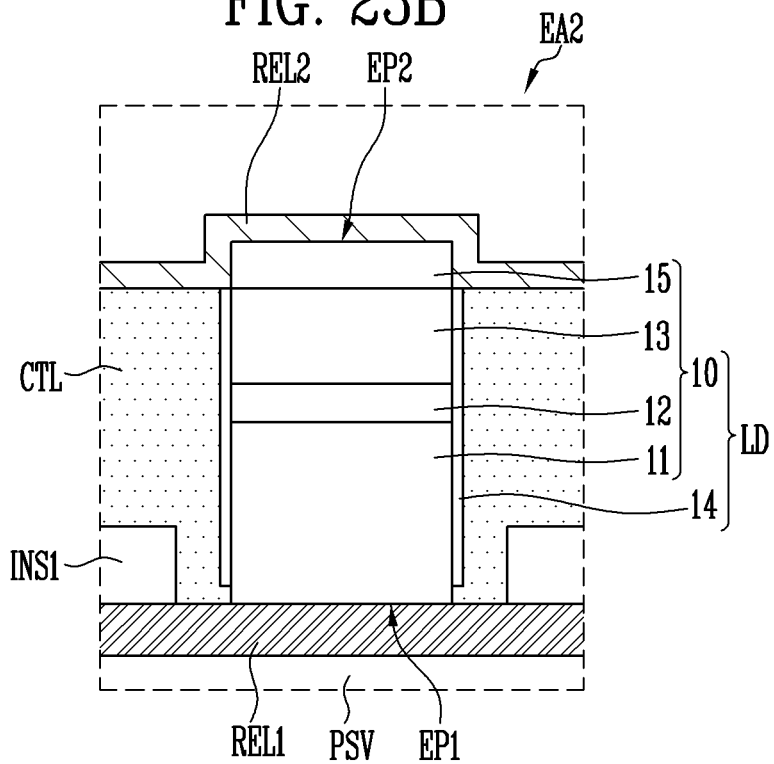

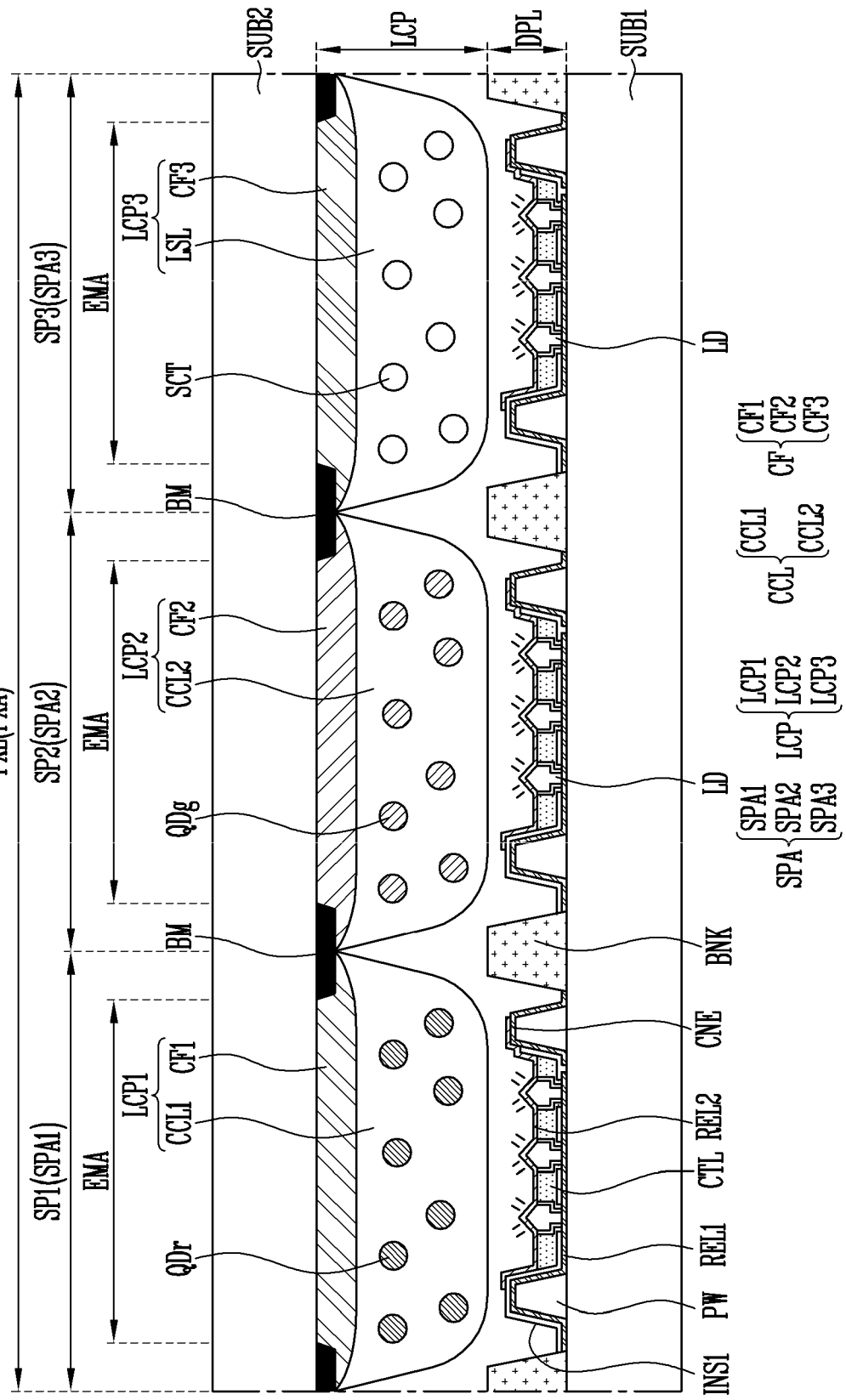

DISPLAY DEVICE AND MANUFACTURING METHOD THEREFOR

CROSS-REFERENCE TO RELATED APPLICATIONS

This application is a National Phase patent application and claims priority to and the benefit of International Application Number PCT/KR2019/006537, filed on May 30, 2019, which claims priority to Korean Patent Application Number 10-2018-0152420, filed on Nov. 30, 2018, the entire contents of each of which are hereby incorporated by reference.

FIELD

Various embodiments of the present disclosure relate to a display device, and, for example, to a display device including a subminiature light emitting element and a method of manufacturing the display device.

BACKGROUND

A light emitting diode may have relatively satisfactory durability even under poor environmental conditions, and have excellent performances in terms of lifetime and luminance. Recently, research on the technology of applying such light emitting diodes to various display devices has become appreciably more active.

As a part of such research, technologies of fabricating a light emitting diode having a subminiature size corresponding to the microscale or the nanoscale using an inorganic crystalline structure, e.g., a structure obtained by growing a nitride-based semiconductor are being developed.

To apply the light emitting diode to an electronic device including a lighting device, a display device, or the like, there is a need to couple the light emitting diode to an electrode so that the voltage of the power supply may be applied to the light emitting diode. With regard to application purposes of the light emitting diode, a method of reducing space needed for the electrode, or a method of fabricating the light emitting diode, various researches on arrangement relationship between the light emitting diode and the electrode have been conducted.

SUMMARY

Various embodiments of the present disclosure are directed to a display device capable of enhancing light output efficiency of light emitting elements.

Various embodiments of the present disclosure are directed to a method of manufacturing the display device.

A display device in accordance with an embodiment of the present disclosure may include: a substrate including a display area and a non-display area; and a plurality of pixels in the display area, and each including a plurality of sub-pixels. Each of the sub-pixels may include a pixel circuit layer, and a display element layer including at least one light emitting element to emit light. The display element layer may include: a first electrode on the pixel circuit layer; a second electrode on the first electrode and electrically insulated from the first electrode; the light emitting element including a first end portion coupled to the first electrode and a second end portion coupled to the second electrode, and between the first electrode and the second electrode; an intermediate layer enclosing at least one area of the light emitting element, and on the first electrode; and a connection line provided on an identical surface with the first electrode and electrically connected to the second electrode. The second electrode may be on the intermediate layer.

In accordance with an embodiment of the present disclosure, the first end portion of the light emitting element may be on a lower end portion of the light emitting element with respect to a longitudinal direction of the light emitting element. The second end portion of the light emitting element may be on an upper end portion of the light emitting element with respect to the longitudinal direction of the light emitting element.

In accordance with an embodiment of the present disclosure, the first end portion of the light emitting element may be in direct contact with the first electrode, and the second end portion of the light emitting element may be in direct contact with the second electrode.

In accordance with an embodiment of the present disclosure, the light emitting element may be aligned in an emission area of each of the plurality of sub-pixels with respect to the longitudinal direction of the light emitting element.

In accordance with an embodiment of the present disclosure, the second electrode may overlap with the first electrode, in a plan view.

In accordance with an embodiment of the present disclosure, the intermediate layer may include a hardening material, and expose the second end portion of the light emitting element.

In accordance with an embodiment of the present disclosure, the light emitting element may include: a core-shell light emitting pattern comprising a first semiconductor layer (or a first conductive semiconductor layer), an active layer configured to enclose at least a portion of the first conductive semiconductor layer, a second semiconductor layer (or a second conductive semiconductor layer) enclosing at least a portion of the active layer, and an electrode layer enclosing at least a portion of the second conductive semiconductor layer; and an insulating film enclosing a portion of an outer peripheral (e.g., circumferential) surface of the core-shell light emitting pattern. A portion of the electrode layer may be in direct contact with the second electrode rather than being covered with the insulating film.

In accordance with an embodiment of the present disclosure, the intermediate layer may include a plurality of conductive particles.

In accordance with an embodiment of the present disclosure, the display device may further include an insulating pattern between the intermediate layer and the second electrode.

In accordance with an embodiment of the present disclosure, the display element layer may further include a contact electrode on an identical surface with the connection line and provided integrally with the connection line.

In accordance with an embodiment of the present disclosure, the display device may further include a partition wall (or a bank pattern) between the pixel circuit layer and the first electrode, and between the pixel circuit layer and the contact electrode, the partition wall having an opening that exposes one area of the first electrode.

In accordance with an embodiment of the present disclosure, the intermediate layer may be charged into the opening of the partition wall.

In accordance with an embodiment of the present disclosure, the partition wall may have a height greater than a length of the light emitting element.

In accordance with an embodiment of the present disclosure, the display device may further include an insulating layer covering each of at least a portion of the first electrode on the partition wall and at least a portion of the contact electrode on the partition wall.

In accordance with an embodiment of the present disclosure, the display element layer may further include a reflective layer on the partition wall and overlapping with the first electrode. Here, the intermediate layer may be in contact with at least one area of the reflective layer.

In accordance with an embodiment of the present disclosure, the reflective layer may include any one selected from conductive material having a set reflectivity, and a dielectric mirror comprising a plurality of dielectric thin-films having different refractive indexes.

A method of manufacturing a display device in accordance with an embodiment of the present disclosure may include: forming, on a substrate, a partition wall having an opening that exposes at least a portion of the substrate; forming a first electrode and a contact electrode spaced apart from the first electrode on the partition wall; supplying a solvent including a plurality of light emitting elements into the opening; preparing a base substrate having one surface on which a conductive layer is located, and locating the base substrate over the substrate such that the conductive layer faces the partition wall; aligning the plurality of light emitting elements between the first electrode and the conductive layer by applying a corresponding alignment voltage to each of the first electrode and the conductive layer; forming an intermediate layer that exposes at least a portion of each of the plurality of light emitting elements, by hardening the solvent and removing at least a portion of the hardened solvent through an ashing process; and forming a second electrode on the intermediate layer.

In accordance with an embodiment of the present disclosure, each of the light emitting elements may include a first end portion directly coupled to the first electrode, and a second end directly coupled to the second electrode, and be aligned in a longitudinal direction of the light emitting element.

In accordance with an embodiment of the present disclosure, the method may further include: before forming the second electrode, removing a portion of an insulating film of each of the light emitting elements; and exposing a portion of the contact electrode.

Various embodiments of the present disclosure may provide a display device capable of enhancing light output efficiency of light emitting elements, and a method of manufacturing the display device.

The effects of the present disclosure are not limited by the foregoing, and other various effects are anticipated herein.

BRIEF DESCRIPTION OF THE DRAWINGS

FIG. 15 illustrates an embodiment of the first sub-pixel of FIG. 5, and is a plan view schematically illustrating the first sub-pixel including only some components of the display element layer.

FIG. 23A is an enlarged sectional view of portion EA2 of FIG. 22.

FIG. 23B illustrates another shape of the light emitting element shown in FIG. 23A, and is an enlarged sectional view corresponding to portion EA2 of FIG. 22.

FIG. 24 is a sectional view schematically illustrating a display device including a color conversion layer in accordance with an embodiment of the present disclosure.

MODE FOR INVENTION

Figure 1A:
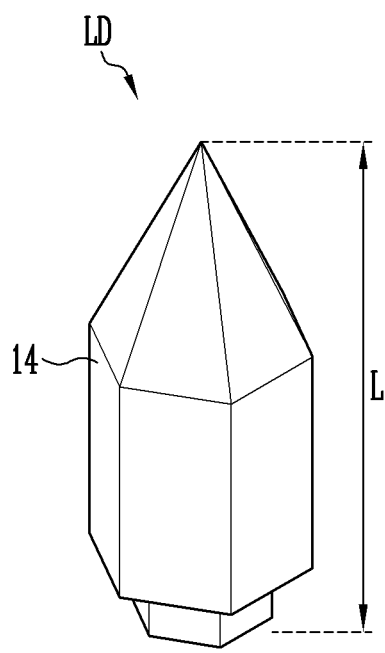
FIG. 1A is a perspective view schematically illustrating a light emitting element in accordance with an embodiment of the present disclosure.

As the present disclosure allows for various changes and numerous embodiments, particular embodiments will be illustrated in the drawings and described in detail in the written description. However, this is not intended to limit the present disclosure to particular modes of practice, and it is to be appreciated that all changes, equivalents, and substitutes that do not depart from the spirit and technical scope of the present disclosure are encompassed in the present disclosure.

Throughout the disclosure, like reference numerals refer to like parts throughout the various figures and embodiments of the present disclosure. The sizes of elements in the accompanying drawings may be exaggerated for clarity of illustration. It will be understood that, although the terms "first", "second", etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element. In the present disclosure, the singular forms are intended to include the plural forms as well, unless the context clearly indicates otherwise.

It will be further understood that the terms "comprise", "include", "have", etc. when used in this specification, specify the presence of stated features, integers, steps, operations, elements, components, and/or combinations of them but do not preclude the presence or addition of one or more other features, integers, steps, operations, elements, components, and/or combinations thereof. Furthermore, when a first part such as a layer, a film, a region, or a plate is disposed on a second part, the first part may be not only directly on the second part but a third part may intervene between them. In addition, when it is expressed that a first part such as a layer, a film, a region, or a plate is formed on a second part, the surface of the second part on which the first part is formed is not limited to an upper surface of the second part but may include other surfaces such as a side surface or a lower surface of the second part. To the contrary, when a first part such as a layer, a film, a region, or a plate is under a second part, the first part may be not only directly under the second part but a third part may intervene between them.

Embodiments and certain details of the present disclosure are described with reference to the accompanying drawings in order to describe the present disclosure in more detail so that those having ordinary knowledge in the technical field to which the present disclosure pertains can easily practice the present disclosure. Furthermore, a singular form may include a plural form as long as it is not specifically mentioned in a sentence.

Figure 1B:
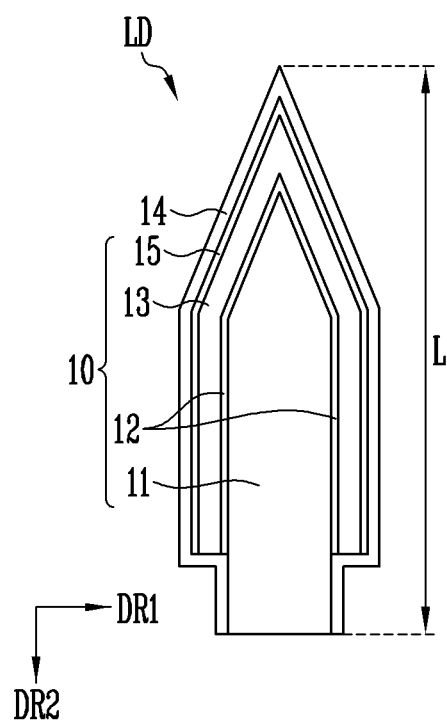
FIG. 1B is a sectional view illustrating the light emitting element of FIG. 1A.

FIG. 1A is a perspective view schematically illustrating a light emitting element in accordance with an embodiment of the present disclosure, and FIG. 1B is a sectional diagram of the light emitting element of FIG. 1A.

Referring to FIGS. 1A and 1B, a light emitting element LD in accordance with an embodiment of the present disclosure may include a first conductive semiconductor layer 11 (or a first semiconductor layer 11), a second conductive semiconductor layer 13 (or a second semiconductor layer 13), and an active layer 12 interposed between the first and second conductive semiconductor layers 11 and 13. In some embodiments, the light emitting element LD may include a light emitting pattern 10 which has a coreshell structure and includes a first conductive semiconductor layer 11 disposed in a central area, an active layer 12 which encloses at least one side of the first conductive semiconductor layer 11, a second conductive semiconductor layer 13 which encloses at least one side of the active layer 12, and an electrode layer 15 which encloses at least one side of the second conductive semiconductor layer 13.

The light emitting element LD may be formed in a polypyramid shape extending in one direction. In an embodiment of the present disclosure, the light emitting element LD may be provided in the form of a hexagonal pyramid. If the direction in which the light emitting element LD extends is defined as a longitudinal direction (L), the light emitting element LD may have a first end portion (or a lower end portion) and a second end portion (or an upper end portion) in the longitudinal direction (L). In an embodiment, any one selected from the first and second conductive semiconductor layers 11 and 13 may be disposed on the first end portion (or the lower end portion) of the light emitting element LD. The other one of the first and second conductive semiconductor layers 11 and 13 may be disposed on the second end portion (or the upper end portion) of the light emitting element LD.

In an embodiment of the present disclosure, the light emitting element LD may include a light emitting diode manufactured in a polyprism shape, for example, in a shape of a hexagonal prism opposite end portions of which protrude outward, but the present disclosure is not limited thereto. In an embodiment, the light emitting element LD may be a light emitting diode manufactured in a cylindrical shape.

In an embodiment, the light emitting element LD may have a small size corresponding to the nanoscale or the microscale, e.g., a diameter and/or a length L having a nanoscale range or a microscale range. However, in the present disclosure, the size of the light emitting element LD is not limited to this, and the size of the light emitting element LD may be changed to meet requirements of a lighting device or a self-emissive display device to which the light emitting element LD is applied.

The first conductive semiconductor layer 11 may include, for example, at least one n-type semiconductor layer. For instance, the first conductive semiconductor layer 11 may include an n-type semiconductor layer which includes any one semiconductor material selected from InAlGaN, GaN, AlGaN, InGaN, AlN, and InN, and is doped with a first conductive dopant such as Si, Ge, or Sn. However, the material forming the first conductive semiconductor layer 11 is not limited to this, and the first conductive semiconductor layer 11 may be formed of various other suitable materials.

In an embodiment, opposite end portions of the first conductive semiconductor layer 11 may have shapes protruding in the longitudinal direction (L) of the light emitting element LD. The shapes in which the opposite end portions of the first conductive semiconductor layer 11 protrude outward may differ from each other. For example, disposed at an upper position with respect to the longitudinal direction (L), a first end portion of the opposite end portions of the first conductive semiconductor layer 11 may have a conical shape the width of which is reduced upward to form one apex. Disposed at a lower position with respect to the longitudinal direction (L), a second end portion of the opposite end portions of the first conductive semiconductor layer 11 may have a square pillar shape with a constant width, as illustrated in FIG. 1B. The shapes of the opposite end portions of the first conductive semiconductor layer 11 may be changed depending on embodiments rather than being limited to that of the foregoing embodiment.

In an embodiment of the present disclosure, the first conductive semiconductor layer 11 may be disposed in a core, e.g., a central (or middle) portion of the light emitting element LD. The light emitting element LD may have a shape corresponding to the shape of the first conductive semiconductor layer 11. For instance, if the first conductive semiconductor layer 11 has a hexagonal pyramid shape, the light emitting element LD may also have a hexagonal pyramid shape.

The active layer 12 may be provided and/or formed in a shape enclosing the outer peripheral (e.g., circumferential) surface of the first conductive semiconductor layer 11 in the longitudinal direction (L) of the light emitting element LD. In more detail, the active layer 12 may be provided and/or formed in a shape enclosing an area of the first conductive semiconductor layer 11, other than the second end portion of the opposite end portions of the first conductive semiconductor layer 11 that is disposed at the lower position with respect to the longitudinal direction (L) of the light emitting element LD.

The active layer 12 may have a single or multiple quantum well structure. In an embodiment, a cladding layer doped with a conductive dopant may be formed over and/or under the active layer 12. For example, the cladding layer may be formed of an AlGaN layer or an InAlGaN layer. In an embodiment, a material such as AlGaN or AlInGaN may be used to form the active layer 12, and various other suitable materials may be used to form the active layer 12.

If an electric field of a set or predetermined voltage or more is applied to the opposite end portions of the light emitting element LD, the light emitting element LD emits light by coupling of electron-hole pairs in the active layer 12. Because light emission of the light emitting element LD can be controlled based on the foregoing principle, the light emitting element LD may be used as a light source of various suitable light emitting devices as well as a pixel of the display device.

The second conductive semiconductor layer 13 may be provided and/or formed in a shape enclosing the active layer 12 in the longitudinal direction (L) of the light emitting element LD, and may include a semiconductor layer having a type different from that of the first conductive semiconductor layer 11. For example, the second conductive semiconductor layer 13 may include at least one p-type semiconductor layer. For instance, the second conductive semiconductor layer 13 may include a p-type semiconductor layer which includes any one semiconductor material selected from InAlGaN, GaN, AlGaN, InGaN, AlN, and InN, and is doped with a second conductive dopant such as Mg. However, the material forming the second conductive semiconductor layer 13 is not limited to this, and the second conductive semiconductor layer 13 may be formed of various other suitable materials.

In an embodiment of the present disclosure, the light emitting element LD may include an electrode layer 15 that encloses at least one side of the second conductive semiconductor layer 13.

The electrode layer 15 may be an ohmic contact electrode electrically connected to the second conductive semiconductor layer 13, but the present disclosure is not limited thereto. Furthermore, the electrode layer 15 may include metal or a metal oxide, and for example, Cr, Ti, Al, Au, Ni, ITO, IZO, ITZO, and an oxide or alloy thereof may be used alone or in combination with each other. The electrode layer 15 may be substantially transparent or semitransparent. Thereby, light generated from the active layer 12 of the light emitting element LD may be emitted to the outside after passing through the electrode layer 15.

As described above, the light emitting element LD may have a hexagonal pyramid shape with the opposite end portions protruding outward, and may be implemented as the light emitting pattern 10 having a core-shell structure including the first conductive semiconductor layer 11 provided in the central portion thereof, the active layer 12 which encloses the first conductive semiconductor layer 11, the second conductive semiconductor layer 13 which encloses the active layer 12, and the electrode layer 15 which encloses the second conductive semiconductor layer 13. The first conductive semiconductor layer 11 may be disposed on the first end portion (or the lower end portion) of the light emitting element LD having a hexagonal pyramid shape, and the electrode layer 15 may be disposed on the second end portion (or the upper end portion) of the light emitting element LD.

In an embodiment, the light emitting element LD may further include an insulating film 14 provided on the outer peripheral (e.g., circumferential) surface of the light emitting pattern 10 having a core-shell structure. The insulating film 14 may include transparent insulating material. For example, the insulating film 14 may include at least one insulating material selected from the group consisting of $SiO_2$, $Si_3N_4$, $Al_2O_3$, and $TiO_2$, but it is not limited thereto. In other words, various suitable materials having insulating properties (e.g., electrically insulating properties) may be employed.

In an embodiment, the insulating film 14 may be provided to cover a portion of the outer peripheral (e.g., circumferential) surface (or the surface) of the first conductive semiconductor layer 11 and the outer peripheral (e.g., circumferential) surface (or the surface) of the electrode layer 15. In an embodiment of the present disclosure, the insulating film 14 may be provided to cover the entirety of the outer peripheral (e.g., circumferential) surface (or the surface) of the electrode layer 15 included in the light emitting element LD.

The insulating film 14 may prevent or reduce short-circuiting of the active layer 12 due to making contact with a conductive material except the first conductive semiconductor layer 11 and the second conductive semiconductor layer 13. Thanks to the insulating film 14, occurrence of a defect on the surface of the light emitting element LD may be minimized or reduced, whereby the lifetime and efficiency of the light emitting element LD may be improved. In the case where a plurality of light emitting elements LD are disposed in close contact with each other, the insulating film 14 may prevent or reduce occurrence of an undesired short-circuit between the light emitting elements LD.

In an embodiment of the present disclosure, the insulating film 14 may allow at least one end portion of the opposite end portions (the lower end portion and the upper end portion) of the light emitting element LD that have different polarities from being exposed. For example, the insulating film 14 may expose a lower surface of the first conductive semiconductor layer 11 disposed on the outermost layer of the first end portion (or the lower end portion) of the light emitting element LD with respect to the longitudinal direction (L) of the light emitting element LD, without covering the lower surface.

The light emitting element LD may be employed as a light source for various suitable display devices. The light emitting element LD may be fabricated through a surface treatment process. For example, each light emitting element LD may be surface-treated so that, when a plurality of light emitting elements LD are mixed with a fluidic solution (or solvent) and then supplied to each emission area (e.g., an emission area of each sub-pixel), the light emitting elements LD can be evenly dispersed rather than unevenly aggregating in the solution.

A light emitting device including the light emitting element LD described above may be used not only in a display device but also in various suitable devices which require a light source. For instance, in the case where a plurality of light emitting elements LD are disposed in the emission area of each sub-pixel of a display panel, the light emitting elements LD may be used as a light source of the corresponding sub-pixel. However, the application field of the light emitting element LD is not limited to the above-mentioned examples. For example, the light emitting element LD may also be used in other types of kinds of devices such as a lighting device, which requires a light source.

Figure 2A:
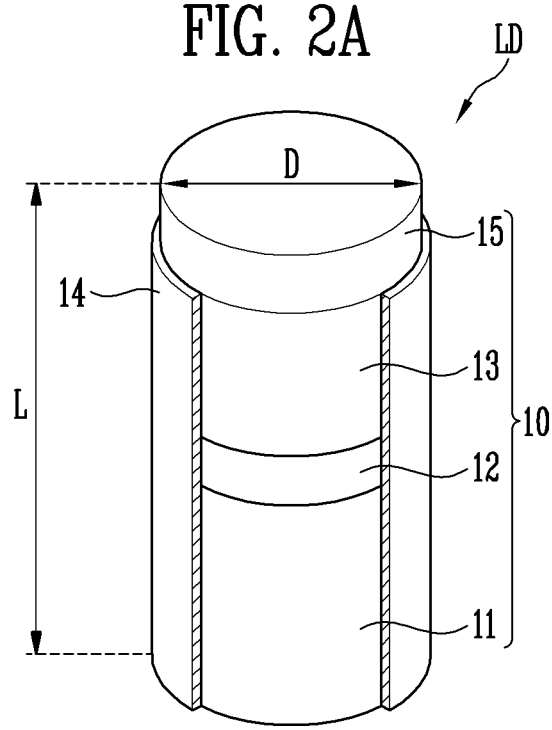
FIG. 2A is a perspective view schematically illustrating a modified embodiment of the light emitting element of FIG. 1A.
Figure 2B:
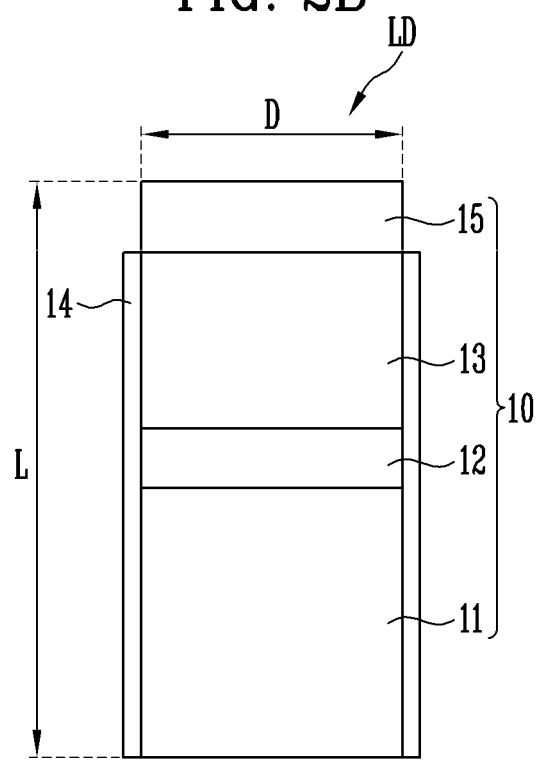
FIG. 2B is a sectional view illustrating the light emitting element of FIG. 2A.

FIG. 2A is a perspective view schematically illustrating a modified embodiment of the light emitting element of FIG. 1A, and FIG. 2B is a sectional view illustrating the light emitting element of FIG. 2A. In an embodiment, FIGS. 2A and 2B illustrate a light emitting element having a structure different from that of the light emitting element illustrated in FIGS. 1A and 1B, and for example illustrate a cylindrical light emitting element. In other words, the type, the kind, the shape, and/or the structure, etc. of the light emitting element in accordance with an embodiment of the present disclosure may be changed in various suitable ways. In descriptions of an embodiment of FIGS. 2A and 2B, like reference numerals are used to designate components similar or equal (or corresponding) to those of the embodiment of FIGS. 1A and 1B, and duplicative descriptions thereof will not be repeated here.

Referring to FIGS. 2A and 2B, a light emitting element LD in accordance with an embodiment of the present disclosure may include a first conductive semiconductor layer 11, a second conductive semiconductor layer 13, and an active layer 12 interposed between the first and second conductive semiconductor layers 11 and 13. For example, the light emitting element LD may be implemented as a stacked light emitting pattern 10 formed by successively stacking the first conductive semiconductor layer 11, the active layer 12, and the second conductive semiconductor layer 13. In other words, the stacked light emitting pattern 10 may include the first conductive semiconductor layer 11, the active layer 12 disposed on one surface of the first conductive semiconductor layer 11, and the second conductive semiconductor layer 13 disposed on one surface of the active layer 12. In some embodiments, the stacked light emitting pattern 10 may further include an electrode layer 15 provided and/or formed on one surface of the second conductive semiconductor layer 13.

In an embodiment of the present disclosure, the light emitting element LD may be formed in a rod-like shape extending in one direction. If an extension direction of the light emitting element LD is defined as a longitudinal direction (L), the light emitting element LD may have a first end portion (or a lower end portion) and a second end portion (or an upper end portion) in the extension direction. One of the first and second conductive semiconductor layers 11 and 13 may be disposed on the first end portion (or the lower end portion), and the other of the first and second conductive semiconductor layers 11 and 13 may be disposed on the second end portion (or the upper end portion).

Although the light emitting element LD may be provided in the form of a cylinder, the present disclosure is not limited thereto. The light emitting element LD may include a rod-like shape or a bar-like shape extending in the longitudinal direction (L) (e.g., to have an aspect ratio greater than 1). For example, the length L of the light emitting element LD in the longitudinal direction (L) may be greater than a diameter D thereof (or a width of the cross-section thereof). The light emitting element LD may include a light emitting diode fabricated to have a subminiature size, e.g., with a length L and/or a diameter D corresponding to the microscale or the nanoscale. In an embodiment of the present disclosure, the diameter D of the light emitting element LD may approximately range from 0.5 μm to 500 μm, and the length L thereof may approximately range from 1 μm to 1000 μm. However, the size of the light emitting element LD is not limited to this, and the size of the light emitting element LD may be changed to meet requirements of a lighting device or a self-emissive display device to which the light emitting element LD is applied.

The light emitting element LD may further include an insulating film 14 which encloses a portion of the outer peripheral (e.g., circumferential) surface (or the surface) of the stacked light emitting pattern 10.

In an embodiment of the present disclosure, the stacked light emitting pattern 10 of the light emitting element LD may further include additional components as well as the first conductive semiconductor layer 11, the active layer 12, the second conductive semiconductor layer 13, and/or the insulating film 14. For example, the stacked light emitting pattern 10 of the light emitting element LD may further include one or more electrode layers and/or fluorescent layers disposed on one side of the first conductive semiconductor layer 11 and/or the second conductive semiconductor layer 13. In some embodiments, the light emitting element LD may further include at least one or more electrode layers disposed on one side of the first conductive semiconductor layer 11. Although the above-mentioned electrode layer may be an ohmic contact electrode, the present disclosure is not limited thereto, and the electrode layer may include material equal to or different from that of the electrode layer 15 disposed on one side of the second conductive semiconductor layer 13.

Figure 3:
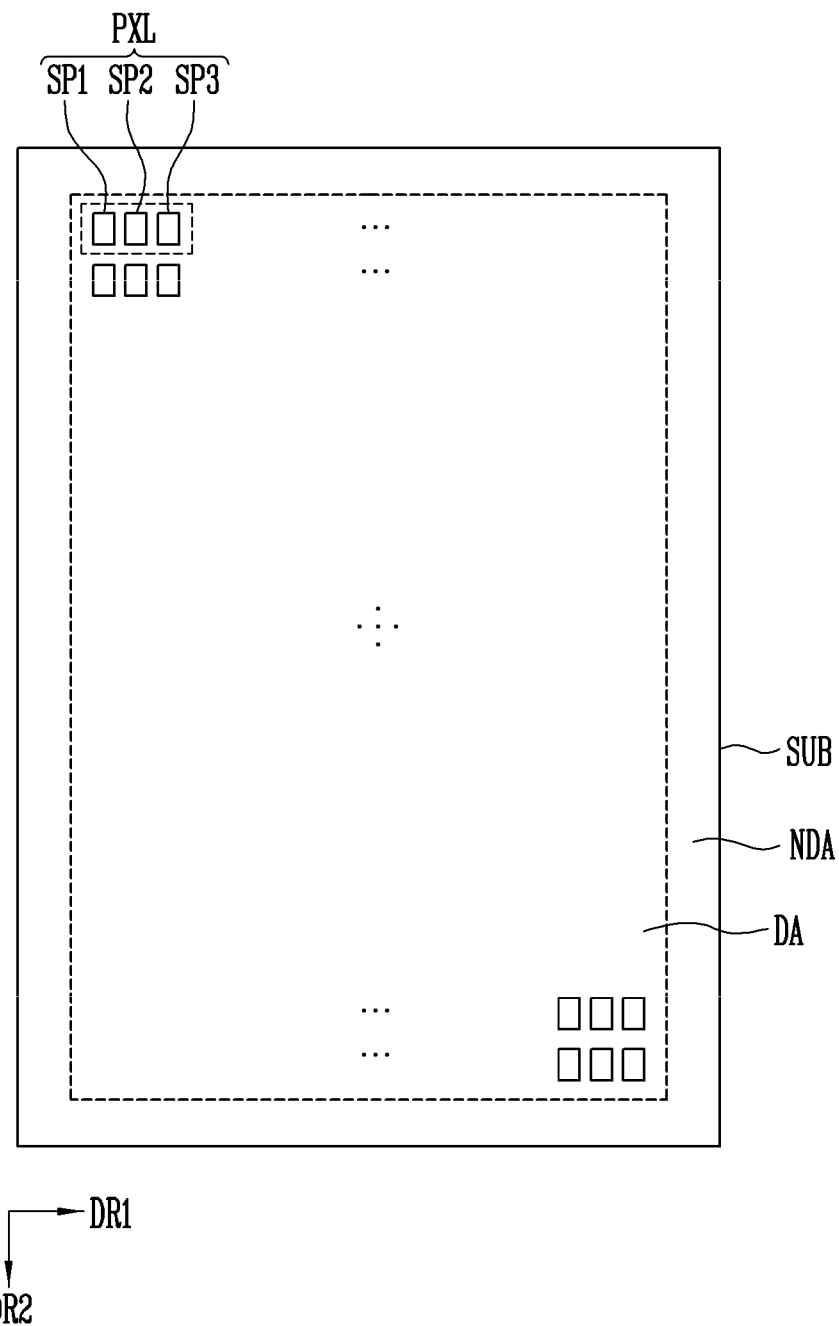
FIG. 3 illustrates a display device in accordance with an embodiment of the present disclosure, and particularly, is a schematic plan view illustrating a display device using the light emitting element illustrated in FIG. 1A as a light emitting source.

FIG. 3 illustrates a display device in accordance with an embodiment of the present disclosure, and particularly, is a schematic plan view illustrating a display device using the light emitting element illustrated in FIG. 1A as a light emitting source.

For the sake of explanation, FIG. 3 schematically illustrates the structure of the display device, focused on a display area on which an image is displayed. In some embodiments, at least one driving circuit (e.g., a scan driver and a data driver) and/or a plurality of lines may be further provided in the display device.

Referring to FIGS. 1A, 1B, and 3, the display device in accordance with the embodiment of the present disclosure may include a substrate SUB, a plurality of pixels PXL provided on the substrate SUB and each including at least one light emitting element LD, a driver provided on the substrate SUB and configured to drive the pixels PXL, and a line component provided to couple the pixels PXL with the driver.

The display device may be classified into a passive-matrix type or kind of display device and an active-matrix type of kind of display device according to a driving method. For example, in the case where the display device in accordance with an embodiment is implemented as an active-matrix type or kind, each of the pixels PXL may include a driving transistor configured to control the amount of current to be supplied to the light emitting element LD, and a switching transistor configured to transmit data signals to the driving transistor.

Recently, active-matrix type or kind of display devices capable of selectively turning on each pixel PXL taking into account the resolution, the contrast, and the working speed have been mainstreamed. However, the present disclosure is not limited thereto. For example, passive-matrix type or kind of display devices in which pixels PXL may be turned on by groups may also employ components (e.g., first and second electrodes) for driving the light emitting element LD.

The substrate SUB may include a display area DA and a non-display area NDA.

In an embodiment, the display area DA may be disposed in a central area of the display device, and the non-display area NDA may be disposed in a perimeter area of the display device in such a way as to enclose the display area DA. The locations of the display area DA and the non-display area NDA are not limited to this, and the locations thereof may be changed.

The display area DA may be an area in which the pixels PXL for displaying an image are provided. The non-display area NDA may be an area in which the driver for driving the pixels PXL and some of the line component for coupling the pixels PXL to the driver are provided.

The display area DA may have various suitable shapes. For example, the display area DA may be provided in various suitable forms such as a closed polygon including sides formed of linear lines, a circle, an ellipse and/or the like including a side formed of a curved line, and a semi-circle, a semi-ellipse or the like including sides formed of a linear line and a curved line.

The non-display area NDA may be provided on at least one side of the display area DA. In an embodiment of the present disclosure, the non-display area NDA may enclose the perimeter of the display area DA.

The substrate SUB may include transparent insulating material to allow light transmission. The substrate SUB may be a rigid substrate. For example, the substrate SUB may be one of a glass substrate, a quartz substrate, a glass ceramic substrate, and a crystalline glass substrate.

The substrate SUB may be a flexible substrate. Here, the substrate SUB may be either a film substrate or a plastic substrate which includes polymer organic material. For example, the substrate SUB may include at least one of the following: polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. However, materials constituting the substrate SUB may be changed, and include, for example, fiber reinforced plastic (FRP).

The pixels PXL may be disposed in the display area DA on the substrate SUB. Each of the pixels PXL may display an image, and a plurality of pixels may be provided.

Each pixel PXL may include a light emitting element LD configured to be driven in response to a corresponding scan signal and a corresponding data signal. The light emitting element LD may have a small size corresponding to the nanoscale or the microscale, and be coupled in parallel to light emitting elements disposed adjacent thereto. The light emitting element LD may form a light source of the corresponding pixel PXL.

Furthermore, each of the pixels PXL may include a plurality of sub-pixels. For example, each pixel PXL may include a first sub-pixel SP1, a second sub-pixel SP2, and a third sub-pixel SP3. In an embodiment, the first sub-pixel SP1, the second sub-pixel SP2, and the third sub-pixel SP3 may emit different colors of light. For instance, the first sub-pixel SP1 may be a first color sub-pixel configured to emit a first color of light, the second sub-pixel SP2 may be a second color sub-pixel configured to emit a second color of light, and the third sub-pixel SP3 may be a third color sub-pixel configured to emit a third color of light. The first color of light may be red light, the second color of light may be green light, and the third color of light may be blue light, but the present disclosure is not limited thereto. However, the colors, the types, kinds, and/or the number of sub-pixels forming each pixel PXL are not particularly limited. For example, the color of light which is emitted from each sub-pixel may be changed in various suitable ways. Although in FIG. 3 there is illustrated an embodiment where the pixels PXL are arranged in the display area DA in a stripe shape or a matrix shape, the present disclosure is not limited thereto. For instance, the display area DA of the display device may have various sitable pixel arrangement shapes generally used in the art.

The driver may provide a signal to each pixel PXL through the line component and thus control the operation of the pixel PXL. In FIG. 3, the line component is omitted for the convenience sake of explanation.

The driver may include a scan driver configured to provide scan signals to the pixels PXL through scan lines, an emission driver configured to provide emission control signals to the pixels PXL through emission control lines, a data driver configured to provide data signals to the pixels PXL through data lines, and a timing controller. The timing controller may control the scan driver, the emission driver, and the data driver.

Figure 4A:
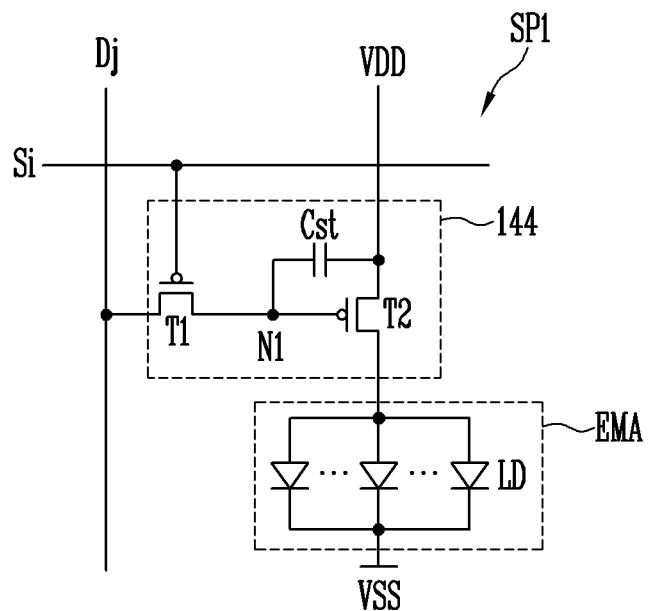
FIGS. 4A to 4C are circuit diagrams illustrating various embodiments of a pixel area of a first sub-pixel included in one of the pixels illustrated in FIG. 3.
Figure 4B:
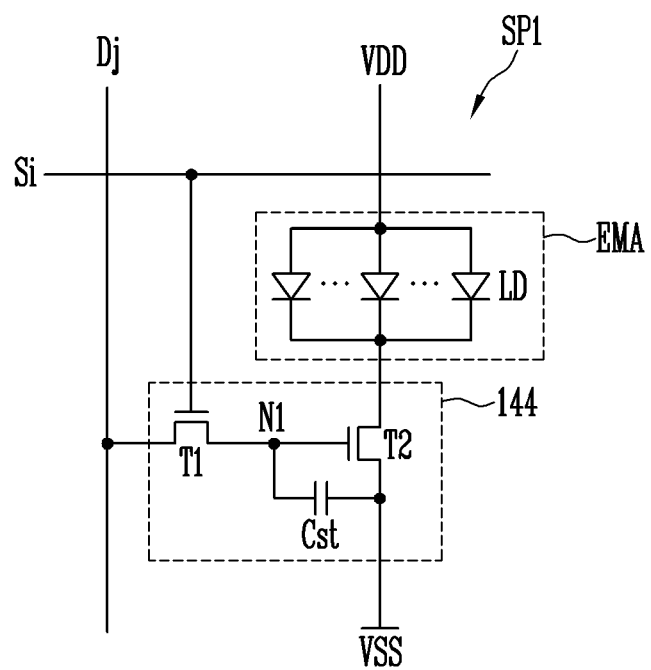
Figure 4C:
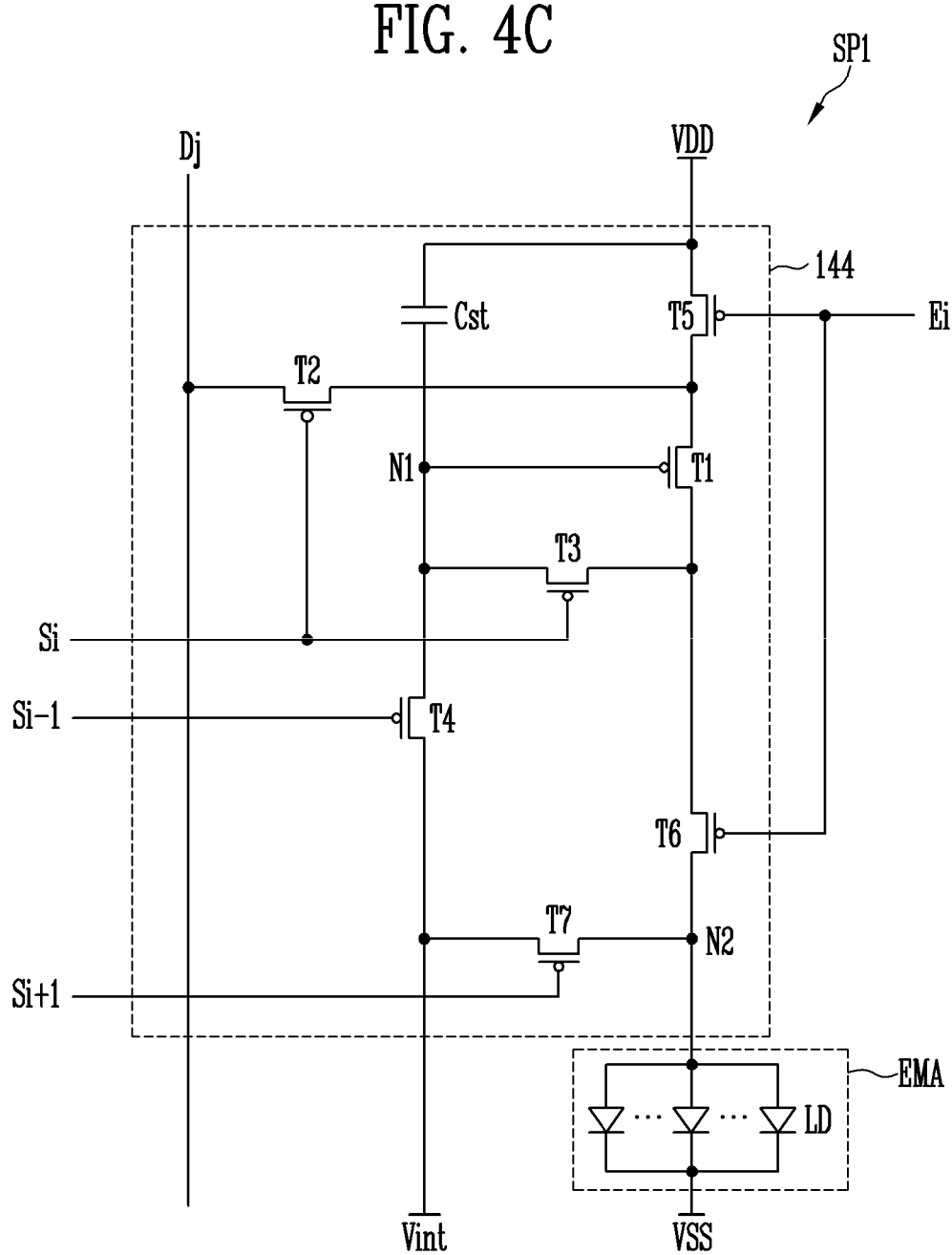

FIGS. 4A to 4C are circuit diagrams illustrating various embodiments of a pixel area of a first sub-pixel included in one of the pixels illustrated in FIG. 3.

Referring to FIGS. 4A to 4C, each of the first to third sub-pixels included in one pixel may be configured of an active pixel. However, the type, the kind, the configuration, and/or the driving method of each of the first to third sub-pixels is not particularly limited. For example, each of the first to third sub-pixels may be configured of a pixel of a passive or active display device which can have various suitable structures generally used in the art.

Furthermore, referring to FIGS. 4A to 4C, the first to third sub-pixels included in one pixel may have substantially the same structure or similar structures. Hereinafter, for convenience sake, the first sub-pixel of the first to third sub-pixels will be described as a representative example.

Referring to FIGS. 1A, 3, and 4A, the first sub-pixel SP1 may include an emission circuit EMA configured to generate light having a luminance corresponding to a data signal, and a pixel driving circuit 144 configured to drive the emission circuit EMA.

In an embodiment, the emission circuit EMA may include a plurality of light emitting elements LD coupled in parallel to each other between a line to which a first driving power supply VDD is to be applied and a line to which a second driving power supply VSS is to be applied. The first driving power supply VDD and the second driving power supply VSS may have different potentials. For example, the first driving power supply VDD may be set as a high-potential power supply, and the second driving power supply VSS may be set as a low-potential power supply. Here, a difference in potential between the first and second driving power supplies VDD and VSS may be set to a threshold voltage of the light emitting elements LD or more during an emission period of the first sub-pixel SP1. A first electrode (e.g., an anode electrode) of each of the light emitting elements LD may be connected to the first driving power supply VDD via the pixel driving circuit 144. A second electrode (e.g., a cathode electrode) of each of the light emitting elements LD may be connected to the second driving power supply VSS.

Each of the light emitting elements LD may emit light at a luminance corresponding to a driving current which is controlled by the pixel driving circuit 144.

Although FIGS. 4A to 4C illustrate embodiments in which the light emitting elements LD are coupled in parallel to each other in the same direction (e.g., a forward direction) between the first and second driving power supplies VDD and VSS, the present disclosure is not limited thereto. For example, in an embodiment, some of the light emitting elements LD may be coupled to each other in the forward direction between the first and second driving power supplies VDD and VSS, and the other light emitting elements LD may be coupled to each other in the reverse direction. One of the first and second driving power supplies VDD and VSS may be supplied in the form of an AC voltage. In this case, the light emitting elements LD may alternately emit light by the same connection direction groups. In some embodiments, the first sub-pixel SP1 may include only a single light emitting element LD.

In an embodiment of the present disclosure, the pixel driving circuit 144 may include first and second transistors T1 and T2, and a storage capacitor Cst. The structure of the pixel driving circuit 144 is not limited to that of the embodiment illustrated in FIG. 4A.

A first terminal of the first transistor (T1; switching transistor) is connected to a data line Dj, and a second terminal thereof is connected to a first node N1. Here, the first terminal and the second terminal of the first transistor T1 are different from each other, and, for example, if the first terminal is a source electrode, and the second terminal is a drain electrode. A gate electrode of the first transistor T1 is connected to the scan line Si.

When a scan signal having a voltage (e.g., a low-level voltage) capable of turning on the first transistor T1 is supplied from the scan line Si, the first transistor T1 is turned on to electrically connect the data line Dj with the first node N1. Here, a data signal of a corresponding frame is supplied to the data line Dj, whereby the data signal is transmitted to the first node N1. The data signal transmitted to the first node N1 may be charged to the storage capacitor Cst.

A first terminal of the second transistor (T2; driving transistor) is connected to the first driving power supply VDD, and a second terminal thereof is electrically connected to the first electrode of each of the light emitting elements LD. A gate electrode of the second transistor T2 is connected to the first node N1. As such, the second transistor T2 may control the amount of driving current to be supplied to the light emitting elements LD in response to the voltage of the first node N1.

One electrode of the storage capacitor Cst is connected to the first driving power supply VDD, and the other electrode thereof is connected to the first node N1. The storage capacitor Cst is charged with a voltage corresponding to a data signal supplied to the first node N1, and maintains the charged voltage until a data signal of a subsequent frame is supplied.

For the sake of explanation, FIG. 4A illustrates the pixel driving circuit 144 having a relatively simple structure including the first transistor T1 configured to transmit the data signal to the first sub-pixel SP1, the storage capacitor Cst configured to store the data signal, and the second transistor T2 configured to supply driving current corresponding to the data signal to the light emitting elements LD.

However, the present disclosure is not limited thereto, and the structure of the pixel driving circuit 144 may be changed in various suitable ways. For example, the pixel driving circuit 144 may further include at least one transistor element such as a transistor element configured to compensate for the threshold voltage of the second transistor T2, a transistor element configured to initialize the first node N1, and/or a transistor element configured to control an emission time of the light emitting elements LD, or other circuit elements such as a boosting capacitor for boosting the voltage of the first node N1.

Furthermore, although in FIG. 4A the transistors, e.g., the first and second transistors T1 and T2, included in the pixel driving circuit 144 have been illustrated as being formed of P-type transistors, the present disclosure is not limited to this. In other words, at least one of the first and second transistors T1 and T2 included in the pixel driving circuit 144 may be changed to an N-type transistor.

Referring to FIGS. 1A, 1B, 3, and 4B, the first and second transistors T1 and T2 in accordance with an embodiment of the present disclosure may be formed of N-type transistors. The configuration and operation of the pixel driving circuit 144 illustrated in FIG. 4B, other than a change in connection positions of some components due to a change in the type or kind of transistor, are similar to those of the pixel driving circuit 144 of FIG. 4A. Therefore, duplicative descriptions pertaining to this will not be repeated here.

In an embodiment of the present disclosure, the configuration of the pixel driving circuit 144 is not limited to the embodiments illustrated in FIGS. 4A and 4B. For example, the pixel driving circuit 144 may be configured in the same manner as that of an embodiment illustrated in FIG. 4C.

Referring to FIGS. 1A, 1B, 3, and 4C, the pixel driving circuit 144 may be connected to the scan line Si and the data line Dj of the first sub-pixel SP1. For example, if the first sub-pixel SP1 is disposed on an ith row and a jth column of the display area DA, the pixel driving circuit 144 of the first sub-pixel SP1 may be connected to an ith scan line Si and a jth data line Dj of the display area DA.

In an embodiment, the pixel driving circuit 144 may also be connected to at least one other scan line. For example, the first sub-pixel SP1 disposed on the ith row of the display area DA may be further connected to an i−1th scan line Si−1 and/or an i+1th scan line Si+1.

In an embodiment, the pixel driving circuit 144 may be connected not only to the first and second driving power supplies VDD and VSS but also to a third power supply. For example, the pixel driving circuit 144 may also be connected to an initialization power supply Vint.

The pixel driving circuit 144 may include first to seventh transistors T1 to T7, and a storage capacitor Cst.

A first terminal of the first transistor (T1; driving transistor), e.g., a source electrode, may be connected to the first driving power supply VDD via the fifth transistor T5, and a second terminal thereof, e.g., a drain electrode, may be connected to one end portions of light emitting elements LD via the sixth transistor T6. A gate electrode of the first transistor T1 may be connected to a first node N1. The first transistor T1 may control driving current flowing between the first driving power supply VDD and the second driving power supply VSS via the light emitting elements LD in response to the voltage of the first node N1.

The second transistor (T2; switching transistor) may be coupled between the jth data line Dj connected to the first sub-pixel SP1 and the first terminal of the first transistor T1. A gate electrode of the second transistor T2 is connected to the ith scan line Si connected to the first sub-pixel SP1. When a scan signal having a gate-on voltage (e.g., a low-level voltage) is supplied from the ith scan line Si, the second transistor T2 is turned on to electrically connect the jth data line Dj to the first terminal of the first transistor T1. Hence, if the second transistor T2 is turned on, a data signal supplied from the jth data line Dj may be transmitted to the first transistor T1.

The third transistor T3 is coupled between the second terminal of the first transistor T1 and the first node N1. A gate electrode of the third transistor T3 is connected to the ith scan line Si. When a scan signal having a gate-on voltage is supplied from the ith scan line Si, the third transistor T3 is turned on to electrically connect the drain electrode of the first transistor T1 to the first node N1. Therefore, when the third transistor T3 is turned on, the first transistor T1 may be connected in the form of a diode.

The fourth transistor T4 may be coupled between the first node N1 and an initialization power supply Vint. A gate electrode of the fourth transistor T4 is connected to a preceding scan line, e.g., an i−1th scan line Si−1. When a scan signal of a gate-on voltage is supplied to the i−1th scan line Si−1, the fourth transistor T4 is turned on so that the voltage of the initialization power supply Vint may be transmitted to the first node N1. Here, the initialization power supply Vint may have a voltage equal to or less than the minimum voltage of the data signal.

The fifth transistor T5 is coupled between the first driving power supply VDD and the first transistor T1. A gate electrode of the fifth transistor T5 is connected to a corresponding emission control line, e.g., an ith emission control line Ei. The fifth transistor T5 may be turned off when an emission control signal having a gate-off voltage is supplied to the ith emission control line Ei, and may be turned on in other cases.

The sixth transistor T6 is coupled between the first transistor T1 and a second node N2, which is electrically connected to first end portions of the light emitting elements LD. A gate electrode of the sixth transistor T6 may be connected to the ith emission control line Ei. The sixth transistor T6 may be turned off when an emission control signal having a gate-off voltage is supplied to the ith emission control line Ei, and may be turned on in other cases.

The seventh transistor T7 is coupled between the second node N2, which is electrically connected to the first end portions of the light emitting elements LD and the initialization power supply Vint. A gate electrode of the seventh transistor T7 is connected to any one of the scan lines of a subsequent stage, e.g., to the i+1th scan line Si+1. When a scan signal of a gate-on voltage is supplied to the i+1th scan line Si+1, the seventh transistor T7 may be turned on so that the voltage of the initialization power supply Vint may be supplied to the first end portions of the light emitting elements LD.

The storage capacitor Cst is coupled between the first driving power supply VDD and the first node N1. The storage capacitor Cst may store a voltage corresponding both to the data signal applied to the first node N1 during each frame period and to the threshold voltage of the first transistor T1.

For convenience sake, FIG. 4C illustrates that all of the first to seventh transistors T1 to T7 are formed of P-type transistors, but the present disclosure is not limited thereto. For example, at least one of the first to seventh transistors T1 to T7 included in the pixel driving circuit 144 may be formed of an N-type transistor, or all of the first to seventh transistors T1 to T7 may be formed of N-type transistors.

Furthermore, the structure of the first sub-pixel SP1 which may be applied to the present disclosure is not limited to the embodiments shown in FIGS. 4A to 4C, and each sub-pixel may have various suitable structures generally used in the art. For example, the pixel driving circuit 144 included in each sub-pixel may be formed of a any suitable pixel circuit which may have various suitable structures and/or be operated by various suitable driving schemes. In an embodiment of the present disclosure, each sub-pixel may be configured in a passive light emitting display device, or the like. In this case, the pixel driving circuit 144 may be omitted, and the opposite end portions of the light emitting elements LD included in the emission area EMA each may be directly connected to the scan line Si, the data line Dj, a line to which the first driving power supply VDD is to be applied, a line to which the second driving power supply VSS is to be applied, and/or a set or predetermined control line.

Figure 5:
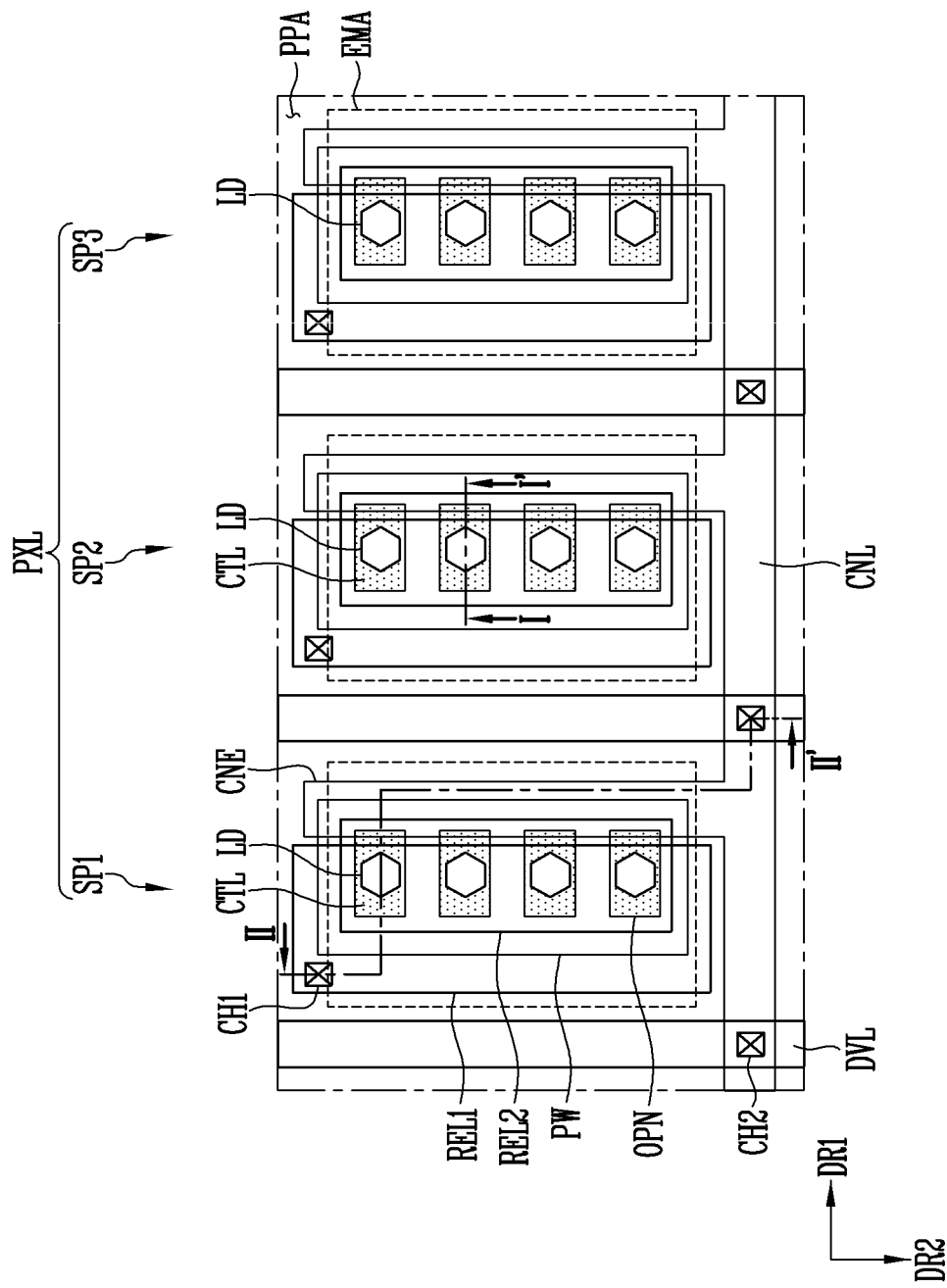
FIG. 5 is a plan view schematically illustrating first to third sub-pixels included in one of the pixels illustrated in FIG. 3.
Figure 6:
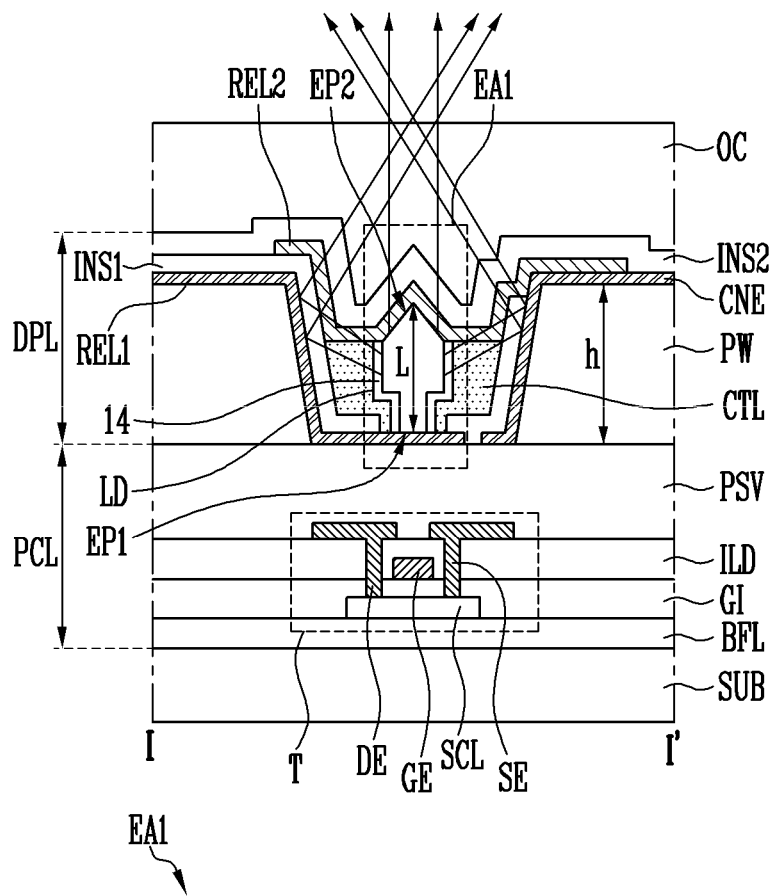
FIG. 6 is a sectional view taken along line I-I' of FIG. 5.
Figure 7:
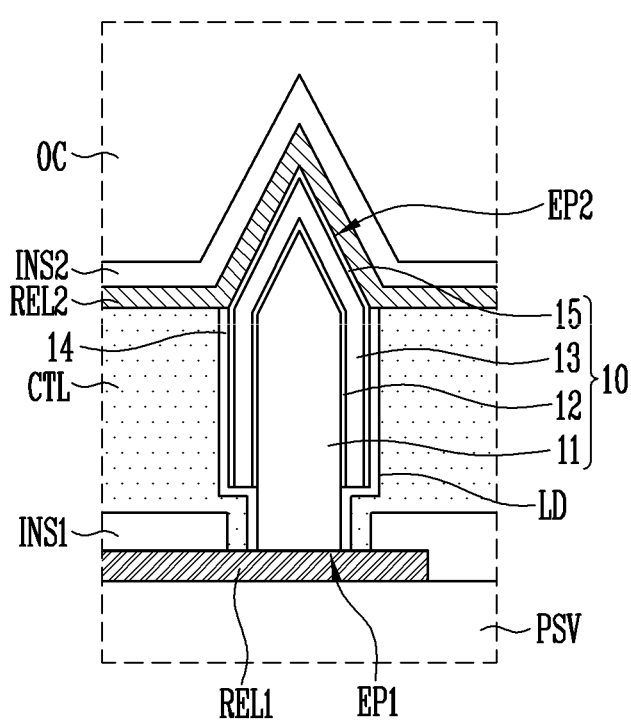
FIG. 7 is an enlarged sectional view of portion EA1 of FIG. 6.
Figure 8:
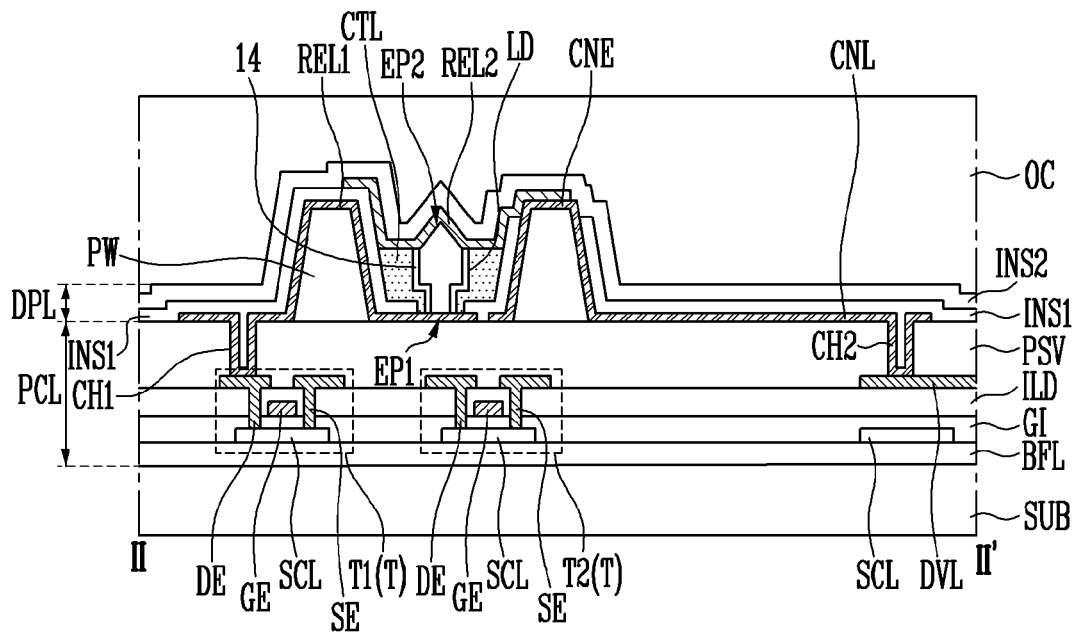
FIG. 8 is a sectional view taken along line II-II' of FIG. 5.
Figure 9:
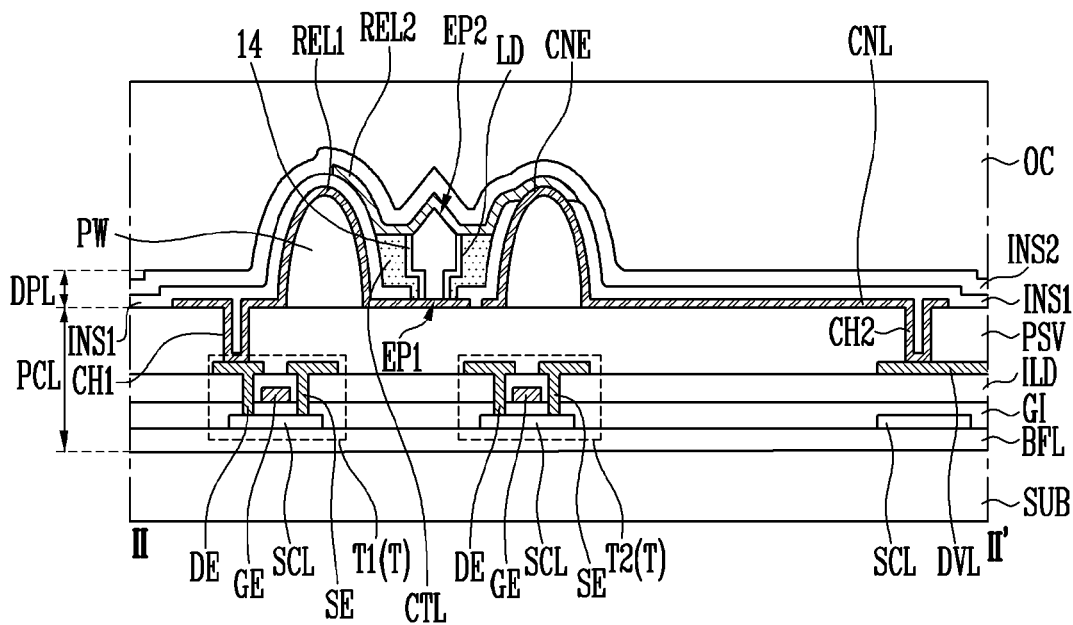
FIG. 9 illustrates another shape of a partition wall illustrated in FIG. 8, and is a sectional view taken along line II-II' of FIG. 5.

FIG. 5 is a plan view schematically illustrating first to third sub-pixels included in one of the pixels illustrated in FIG. 3. FIG. 6 is a sectional view taken along line I-I' of FIG. 5. FIG. 7 is an enlarged sectional view of portion EA1 of FIG. 6. FIG. 8 is a sectional view taken along line II-II' of FIG. 5. FIG. 9 illustrates another shape of a partition wall illustrated in FIG. 8, and is a sectional view taken along line II-II' of FIG. 5.

For the sake of explanation, illustration of transistors connected to the light emitting elements, and signal lines connected to the transistors has been omitted in FIG. 5.

Moreover, although FIGS. 5 to 9 illustrate a simplified structure of one pixel, e.g., showing that each electrode has only a single electrode layer, and each insulating layer has only a single insulating layer, the present disclosure is not limited thereto.

Referring to FIGS. 1A, 1B, 3, and 5 to 9, the display device in accordance with an embodiment of the present disclosure may include a substrate SUB on which a plurality of pixels PXL are provided.

Each of the pixels PXL may include a first sub-pixel SP1, a second sub-pixel SP2, and a third sub-pixel SP3 which are provided on the substrate SUB. In an embodiment of the present disclosure, the first sub-pixel SP1 may be a red sub-pixel, the second sub-pixel SP2 may be a green sub-pixel, and the third sub-pixel SP3 may be a blue sub-pixel. However, the present disclosure is not limited thereto. In an embodiment, the first sub-pixel SP1 may be a green sub-pixel or a blue sub-pixel, the second sub-pixel SP2 may be a blue sub-pixel or a red sub-pixel, and the third sub-pixel SP3 may be a red sub-pixel or a green sub-pixel.

Each of the first to third sub-pixels SP1 to SP3 may include an emission area EMA configured to emit light, and a peripheral area PPA disposed around a perimeter of the emission area EMA. The emission area EMA may refer to an area in which light is emitted from the light emitting elements LD aligned (or disposed) in each sub-pixel, and the peripheral area PPA may refer to an area from which the light is not emitted.

In an embodiment of the present disclosure, a pixel area of each of the first to third sub-pixels SP1 to SP3 may include an emission area EMA and a peripheral area PPA of the corresponding sub-pixel. In more detail, the pixel area of the first sub-pixel SP1 may include an emission area EMA of the first sub-pixel SP1, and a peripheral area PPA disposed around a perimeter of the emission area EMA. The pixel area of the second sub-pixel SP2 may include an emission area EMA of the second sub-pixel SP2, and a peripheral area PPA disposed around a perimeter of the emission area EMA. The pixel area of the third sub-pixel SP3 may include an emission area EMA of the third sub-pixel SP3, and a peripheral area PPA disposed around a perimeter of the emission area EMA.

A substrate SUB, a pixel circuit layer PCL, and a display element layer DPL may be provided in the pixel area of each of the first to third sub-pixel SP1 to SP3.

The pixel circuit layer PCL of each of the first to third sub-pixels SP1 to SP3 may include a buffer layer BFL disposed on the substrate SUB, at least one transistor T disposed on the buffer layer BFL, and a driving voltage line DVL. Furthermore, the pixel circuit layer PCL of each of the first to third sub-pixels SP1 to SP3 may further include a passivation layer PSV which is provided on the transistor T and the driving voltage line DVL.

The substrate SUB may include transparent insulating material to allow light transmission.

The substrate SUB may be a rigid substrate. For example, the substrate SUB may be one of a glass substrate, a quartz substrate, a glass ceramic substrate, and a crystalline glass substrate.

The substrate SUB may be a flexible substrate. Here, the substrate SUB may be either a film substrate or a plastic substrate which includes polymer organic material. For example, the substrate SUB may include at least one of the following: polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. However, the material for forming the substrate SUB is not limited to that of the foregoing embodiments, and may be changed in various ways.

The buffer layer BFL may be provided on the substrate SUB and prevent or reduce diffusion of impurities into the transistor T. The buffer layer BFL may be omitted depending on the material of the substrate SUB or processing conditions.

The transistor T may include a driving transistor T1 (T) which is electrically connected to some of the light emitting elements LD provided on the display element layer DPL of each sub-pixel and configured to drive the light emitting elements LD, and a switching transistor T2 (T) which may switch the driving transistor T1 (T).

Each of the driving transistor T1 (T) and the switching transistor T2 (T) may include a semiconductor layer SCL, a gate electrode GE, a first terminal SE, and a second terminal DE. The first terminal SE may be either a source electrode or a drain electrode, and the second terminal DE may be the other electrode. For example, in the case where the first terminal SE is the source electrode, the second terminal DE may be the drain electrode.

The semiconductor layer SCL may be disposed on the buffer layer BFL. The semiconductor layer SCL may include a first area which comes into contact with the first terminal SE, and a second area which comes into contact with the second terminal DE. An area between the first area and the second area may be a channel area.

The semiconductor layer SCL may be a semiconductor pattern formed of polysilicon, amorphous silicon, an oxide semiconductor, etc. The channel area may be an intrinsic semiconductor, which is an undoped semiconductor pattern. Each of the first area and the second area may be a semiconductor pattern doped with an impurity.

The gate electrode GE may be provided on the semiconductor layer SCL with a gate insulating layer GI interposed therebetween.

Each of the first terminal SE and the second terminal DE may respectively come into contact with the first area and the second area of the semiconductor layer SCL through corresponding contact holes that pass through an interlayer insulating layer ILD and the gate insulating layer GI.

In an embodiment of the present disclosure, at least one transistor T included in the pixel circuit layer PCL of each sub-pixel may be formed of a low temperature polycrystalline silicon (LTPS) thin-film transistor, but the present disclosure is not limited thereto. In some embodiments, the at least one transistor T may be formed of an oxide semiconductor thin-film transistor. Furthermore, in the present embodiment of the present disclosure, there has been illustrated the case where the transistor T is a thin film transistor having a top gate structure, but the present disclosure is not limited to this. In an embodiment, the transistor T may be a thin film transistor having a bottom gate structure.

The driving voltage line DVL may be provided on the interlayer insulating layer ILD, but the present disclosure is not limited thereto. In some embodiments, the driving voltage line DVL may be provided on any one of the insulating layers included in the pixel circuit layer PCL. The second driving power supply (refer to VSS of FIG. 4A) may be applied to the driving voltage line DVL.

The passivation layer PSV may include a first contact hole CH1 which exposes a portion of the second terminal DE of the driving transistor T1 (T), and a second contact hole CH2 which exposes a portion of the driving voltage line DVL.

The display element layer DPL of each sub-pixel may include a partition wall PW (or a bank pattern), a first electrode REL1, a connection line CNL, a contact electrode CNE, a second electrode REL2, and a plurality of light emitting elements LD. In addition, the display element layer DPL of each sub-pixel may further include an intermediate layer CTL disposed between the first electrode REL1 and the second electrode REL2.

The partition wall PW may be provided on the passivation layer PSV of the emission area EMA of each sub-pixel. In some embodiments, a pixel defining layer (or a bank) formed of the same material as that of the partition wall PW may be formed and/or provided in the peripheral area PPA between adjacent sub-pixels to define the emission area EMA of each sub-pixel.

The partition wall PW may include an inorganic insulating layer formed of inorganic material or an organic insulating layer formed of organic material. In an embodiment, the partition wall PW may include a single organic insulating layer and/or a single inorganic insulating layer, but the present disclosure is not limited thereto. For example, the partition wall PW may have a multi-layer structure formed by stacking at least one or more organic insulating layers and at least one or more inorganic insulating layers.

Although the partition wall PW may have a trapezoidal cross-section which is reduced in width upward from one surface of the passivation layer PSV, as illustrated in FIG. 8, the present disclosure is not limited thereto. In an embodiment, the partition wall PW may include a curved surface having a semi-elliptical cross-section, a semi-circular cross-section, etc., which is reduced in width upward from one surface of the passivation layer PSV, as illustrated in FIG. 9. In a sectional view, the shape of the partition wall PW is not limited to the foregoing examples, and may be changed in various suitable ways within a range in which the efficiency of light emitted from each of the light emitting elements LD can be enhanced.

The partition wall PW may be provided in the emission area EMA of each sub-pixel in the form of enclosing each light emitting element LD. Although the partition wall PW is provided in the form of enclosing the entirety of the perimeter of each light emitting element LD, the present disclosure is not limited thereto. In some embodiments, the partition wall PW may be provided in the form of enclosing only a portion of the perimeter of each light emitting element LD. The partition wall PW may have a height h (or a thickness) equal to a length L of each light emitting element LD, or a height h (or a thickness) greater than the length L of each light emitting element LD. In an embodiment of the present disclosure, the partition wall PW may have a height h (or a thickness) greater than the length L of each light emitting element L reflect light emitted from each light emitting element LD in the frontal direction of the display device (or in a direction in which an image is displayed) by the first electrode REL1 and the contact electrode CNE disposed on the partition wall PW.

The partition wall PW may include a first portion extending in a first direction DR1 and a second portion extending in a second direction DR2 intersecting with the first direction DR1. Furthermore, the partition wall PW may include at least one opening OPN corresponding to an area formed by intersecting the first portion and the second portion. The opening OPN may expose at least one area of the first electrode REL1 in the emission area EMA of each sub-pixel so that alignment positions of the light emitting elements LD can be determined. In the emission area EMA of each sub-pixel, the partition wall PW may be provided and/or formed in a mesh shape in a plan view.

The connection line CNL may extend in the first direction DR1 (e.g., 'horizontal direction'). The connection line CNL may be provided in common to the first to third sub-pixels SP1 to SP3. Therefore, the first to third sub-pixels SP1 to SP3 may be coupled in common to the connection line CNL.

The contact electrode CNE may be connected to the connection line CNL. In more detail, the contact electrode CNE may be integrally connected to the connection line CNL. In an embodiment of the present disclosure, the contact electrode CNE may diverge from the connection line CNL in the second direction DR2 (e.g., 'vertical direction'). Hence, the contact electrode CNE and the connection line CNL may be integrally provided and electrically and/or physically connected to each other. In the case where the contact electrode CNE and the connection line CNL are integrally formed and/or provided with each other, the contact electrode CNE may be regarded as one area of the connection line CNL. However, the present disclosure is not limited thereto. In some embodiments, the contact electrode CNE and the connection line CNL may be individually formed, and electrically connected to each other through a contact hole, a via hole, and/or the like.

The contact electrode CNE may be provided and/or formed on the partition wall PW and have a surface profile corresponding to the shape of the partition wall PW. In other words, the partition wall PW is disposed under the contact electrode CNE, and the contact electrode CNE may have a shape protruding upward in an area in which the partition wall PW is disposed. In this case, light emitted from the active layers 12 of the light emitting elements LD may more reliably travel in the frontal direction of the display device so that the efficiency of light emitted from each light emitting element LD can be enhanced.

In an embodiment of the present disclosure, the contact electrode CNE may be electrically and/or physically connected with the second electrode REL2.

The first electrode REL1 may be provided and/or formed on the passivation layer PSV including the partition wall PW. The first electrode REL1 may be provided in the emission area EMA of each sub-pixel and extend in the second direction DR2. The first electrode REL1 may come into contact with a first end portion EP1 of opposite end portions of each light emitting element LD. In other words, the first electrode REL1 may be electrically and/or physically connected to the first end portion EP1 of each light emitting element LD.

In an embodiment of the present disclosure, the first electrode REL1, the contact electrode CNE, and the connection line CNL may be provided and/or formed on the same surface. The first electrode REL1 may be spaced apart from each of the contact electrode CNE and the connection line CNL, and be electrically insulated from each of the contact electrode CNE and the connection line CNL.

Each of the first electrode REL1, the contact electrode CNE, and the connection line CNL may include material having a set or predetermined reflectivity to enable light emitted from each of the light emitting elements LD to travel in the front direction of the display device (or in the direction in which an image is displayed). The first electrode REL1, the contact electrode CNE, and the connection line CNL may have the same material.

The first electrode REL1, the contact electrode CNE, and the connection line CNL may be made of conductive material having a set or predetermined reflectivity. For example, the conductive material may include metal such as Ag, Mg, Al, Pt, Pd, Au, Ni, Nd, Ir, Cr, or an alloy of them, a conductive oxide such as an indium tin oxide (ITO), an indium zinc oxide (IZO), a zinc oxide (ZnO), or an indium tin zinc oxide (ITZO), and a conductive polymer such as PEDOT. The material of the first electrode REL1, the contact electrode CNE, and the connection line CNL is not limited to the foregoing materials.

Furthermore, the first electrode REL1, the contact electrode CNE, and the connection line CNL each may have a single layer structure, but the present disclosure is not limited thereto, for example, it may have a multi-layer structure formed by stacking two or more materials of metals, alloys, conductive oxides, and conductive polymers. The first electrode REL1, the contact electrode CNE, and the connection line CNL each may have a multi-layer structure including at least double layers to minimize or reduce voltage drop due to a signal delay when signals are transmitted to the opposite end portions EP1 and EP2 of each of the light emitting elements LD.

In an embodiment of the present disclosure, because the first electrode REL1 and the contact electrode CNE each have a shape corresponding to the shape of the partition wall PW, light emitted from each of the light emitting elements LD may be reflected by the first electrode REL1 and the contact electrode CNE and more reliably travel in the frontal direction of the display device. Consequently, the efficiency of light emitted from the light emitting elements LD may be enhanced. In an embodiment of the present disclosure, the partition wall PW, the first electrode REL1, and the contact electrode CNE may function as reflectors enabling light emitted from each of the light emitting elements LD to travel in the frontal direction of the display device, thus enhancing the light output efficiency of the light emitting elements LD.

The first electrode REL1 may function as a first alignment electrode for aligning the light emitting elements LD in the emission area EMA of each sub-pixel. When the light emitting elements LD are aligned in the emission area EMA of each sub-pixel, a transparent base substrate may be disposed over the substrate SUB including the first electrode REL1. A conductive layer for forming an electric field with the first electrode REL1 may be disposed on one surface of the transparent base substrate. The conductive layer may function as a second alignment electrode configured to form an electric field with the first electrode REL1 and align the light emitting elements LD in the emission area EMA of each sub-pixel.

After the light emitting elements LD are input into the emission area EMA of each sub-pixel, a first alignment voltage may be applied to the first electrode REL1, and a second alignment voltage may be applied to the conductive layer. In an embodiment of the present disclosure, the first alignment voltage and the second alignment voltage may have different voltage levels. As set or predetermined alignment voltages having different voltage levels are respectively applied to the first electrode REL1 and the conductive layer, a vertical electric field may be formed between the first electrode REL1 and the conductive layer. The light emitting elements LD may be aligned in the longitudinal direction (L) (or, a vertical direction in a sectional view) between the first electrode REL1 and the conductive layer by the vertical electric field. Here, the first end portion EP1 of each of the light emitting elements LD may come into direct contact with or be coupled with the first electrode REL1. After the light emitting elements LD are aligned (or disposed) in the emission area EMA of each sub-pixel, the conductive layer may be removed. A method of aligning (or disposing) the light emitting elements LD in the emission area EMA of each sub-pixel will be described below.

After the light emitting elements LD are aligned (or disposed) in the emission area EMA of each sub-pixel, the first electrode REL1 may function as a first driving electrode for driving the light emitting elements LD.

The first electrode REL1 may be electrically connected to the first terminal SE or the second terminal DE of the driving transistor T1 (T) through the first contact hole CH1 of the passivation layer PSV. For the sake of explanation, although the first electrode REL1 is illustrated as being connected to the second terminal DE of the driving transistor T1 (T), the first electrode REL1 may be connected to the first terminal SE of the driving transistor T1 (T) in some embodiments.

Because the first electrode REL1 is connected to the second terminal DE of the driving transistor T1 (T), a signal applied to the second terminal DE of the driving transistor T1 (T) may be transmitted to the first electrode REL1. The signal transmitted to the first electrode REL1 may be eventually transmitted to the first end portion EP1 of the opposite end portions EP1 and EP2 of each of the light emitting elements LD.

The first insulating layer INS1 may be provided on the first electrode REL1 and the contact electrode CNE. The first insulating layer INS1 may be formed of any one insulating layer of an inorganic insulating layer including inorganic material or an organic insulating layer including organic material.

The first insulating layer INS1 may prevent or reduce exposure of one area of the first electrode REL1, e.g., an area other than an area coupled (or brought into contact) with the first end portion EP1 of each of the light emitting elements LD, to the outside, thus protecting the first electrode REL1. Furthermore, the first insulating layer INS1 may cover one area of the contact electrode CNE, e.g., an area other than an area coupled with the second electrode REL2, and prevent or reduce exposure of the one area of the contact electrode CNE to the outside, thus protecting the contact electrode CNE.

The second electrode REL2 may extend in the second direction DR2 and overlap with the contact electrode CNE, in a plan view. The second electrode REL2 may be electrically and/or physically connected with the contact electrode CNE that is not covered with the first insulating layer INS1, in a sectional view. Hence, the voltage of the second driving power supply VSS that is applied to the connection line CNL may be transmitted to the second electrode REL2 through the contact electrode CNE.

The second electrode REL2 may overlap with the light emitting elements LD and be coupled (or brought into contact) with any one end portion of the opposite end portions EP1 and EP2 of each light emitting element LD, e.g., the second end portion EP2. Hence, the voltage of the second driving power supply VSS applied to the second electrode REL2 may be transmitted to the second end portion EP2 of each of the light emitting elements LD. As described above, because the second electrode REL2 applies a set or predetermined voltage, e.g., the voltage of the second driving power supply VSS, to the second end portion EP2 of each of the light emitting elements LD, the second electrode REL2 along with the first electrode REL1 may function as a driving electrode for driving the light emitting elements LD.

The second electrode REL2 may be formed of transparent conductive material to allow light emitted from each of the light emitting elements LD and reflected by the first electrode REL1 in the frontal direction of the display device (or in the direction in which an image is displayed) to travel in the frontal direction without loss. The transparent conductive material may include, e.g., ITO, IZO, ITZO, etc., but the present disclosure is not limited thereto. The transparent conductive material may include all materials which minimize or reduce loss of light and have conductivity (e.g., electrical conductivity). In an embodiment of the present disclosure, the second electrode REL2 is formed of material different from that of the first electrode REL1, but the present disclosure is not limited thereto. In an embodiment, the second electrode REL2 may be formed of the same material as that of the first electrode REL1.

The second electrode REL2 overlaps with the first electrode REL1 and may overlap with the light emitting elements LD. Furthermore, the second electrode REL2 may overlap with the partition wall PW. In an embodiment of the present disclosure, the second electrode REL2 may be provided and/or formed over the first electrode REL1 with the light emitting elements LD interposed therebetween. In other words, the first electrode REL1 may be provided and/or formed on the first end portion EP1 (or 'lower end portion') of each of the light emitting elements LD, and the second electrode REL2 may be provided and/or formed on the second end portion EP2 (or 'upper end portion') of each of the light emitting elements LD.

Any one electrode of the first electrode REL1 and the second electrode REL2 provided on the first electrode REL1 may be an anode electrode, and the other may be a cathode electrode. In an embodiment of the present disclosure, the first electrode REL1 may be an anode electrode, and the second electrode REL2 may be a cathode electrode.

Each of the light emitting elements LD may be formed of a light emitting diode which is made of material having an inorganic crystal structure and has a subminiature size, e.g., corresponding to the nanoscale or the microscale.

At least two or several tens of light emitting elements LD may be provided in the emission area EMA of each sub-pixel, but the present disclosure is not limited thereto. In an embodiment, the number of light emitting elements LD provided in each sub-pixel may be changed in various suitable ways.

In some embodiments, each of the light emitting elements LD may include a light emitting pattern 10 which has a core-shell structure and includes a first conductive semiconductor layer 11 disposed in a central area with respect to the longitudinal direction (L) of the light emitting element LD, an active layer 12 which encloses at least one side of the first conductive semiconductor layer 11, a second conductive semiconductor layer 13 which encloses the active layer 12, and an electrode layer 15 which encloses the second conductive semiconductor layer 13. Each of the light emitting elements LD may further include an insulating film 14 which encloses a portion of the outer peripheral (e.g., circumferential) surface (or the surface) of the light emitting pattern 10 having a core-shell structure.

Each of the light emitting elements LD may have a first end portion EP1 and a second end portion EP2 each of which has a shape protruding outward in the longitudinal direction (L). In an embodiment of the present disclosure, the first conductive semiconductor layer 11 may be disposed on the first end portion EP1 of each light emitting element LD, and the electrode layer 15 or the second conductive semiconductor layer 13 may be disposed on the second end portion EP2 thereof. The present disclosure is not limited thereto. In some embodiments, the electrode layer 15 or the second conductive semiconductor layer 13 may be disposed on the first end portion EP1 of each light emitting element LD, and the first conductive semiconductor layer 11 may be disposed on the second end portion EP2 thereof. In an embodiment of the present disclosure, at least a portion of the first conductive semiconductor layer 11, e.g., a lower surface thereof, may be directly coupled (or come into contact) with the first electrode REL1. At least a portion of the electrode layer 15, e.g., an upper surface thereof, may be directly coupled (or come into contact) with the second electrode REL2.

The first end portion EP1 and the second end portion EP2 of each of the light emitting elements LD may have different shapes protruding outward in the longitudinal direction (L) of each light emitting element LD. For example, each of the light emitting elements LD may have a shape corresponding to the shape of the first conductive semiconductor layer 11. In an embodiment of the present disclosure, opposite end portions of the first conductive semiconductor layer 11 may have shapes protruding in the longitudinal direction (L) of each light emitting element LD. Disposed at an upper position with respect to the longitudinal direction (L), a first end portion of the opposite end portions of the first conductive semiconductor layer 11 may have a conical shape the width of which is reduced upward to form one apex, and a second end portion thereof disposed at a lower position with respect to the longitudinal direction (L) may have a square pillar shape with a constant width.

As described above, in the case where the first end portion of the first conductive semiconductor layer 11 has a hexagonal pyramid shape, and the second end portion thereof has a square pillar shape, one end portion of the opposite end portions EP1 and EP2 of each of the light emitting elements LD may have a hexagonal pyramid shape, and the other end portion thereof may have a square pillar shape. For example, the first end portion EP1 of each of the light emitting elements LD may have a square pillar shape, and the second end portion EP2 may have a conical shape, which forms an apex with respect to the longitudinal direction (L). In an embodiment, the first end portion EP1 of each light emitting element LD may have a polygonal pillar shape the width of which is reduced downward with respect to the longitudinal direction (L) of each light emitting element LD or, on the contrary, may have a polygonal pillar shape the width of which is reduced upward. In other words, the shape of the first end portion EP1 of each light emitting element LD is not limited to that of the foregoing embodiments.

Figure 20A:
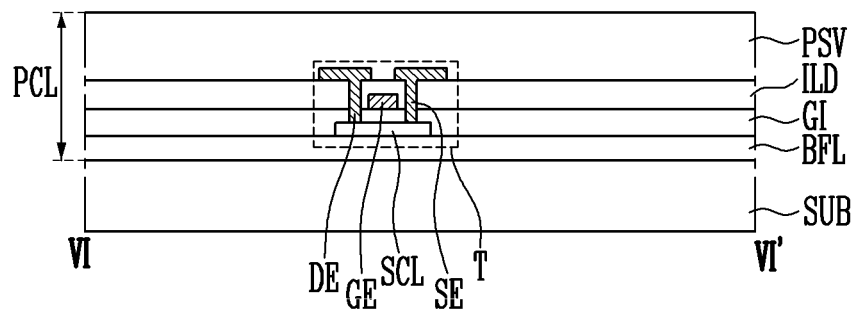
FIGS. 20A to 20K are sectional diagrams sequentially illustrating a method of manufacturing the display device illustrated in FIG. 18.
Figure 20B:
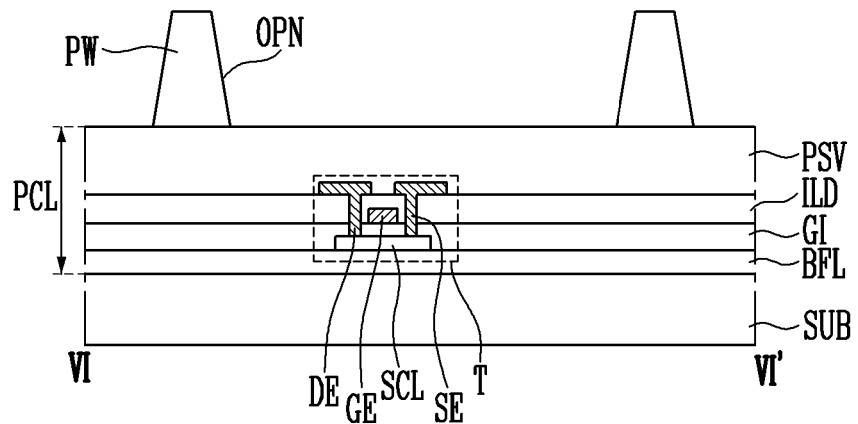
Figure 20C:
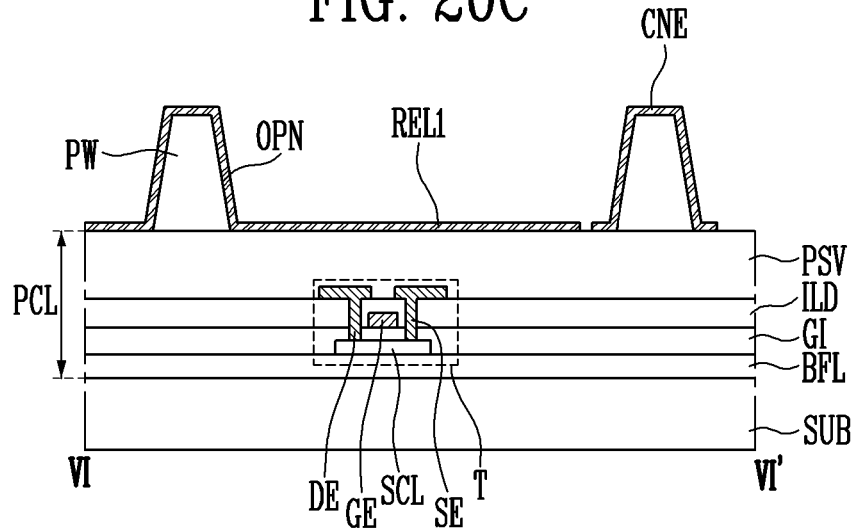
Figure 20D:
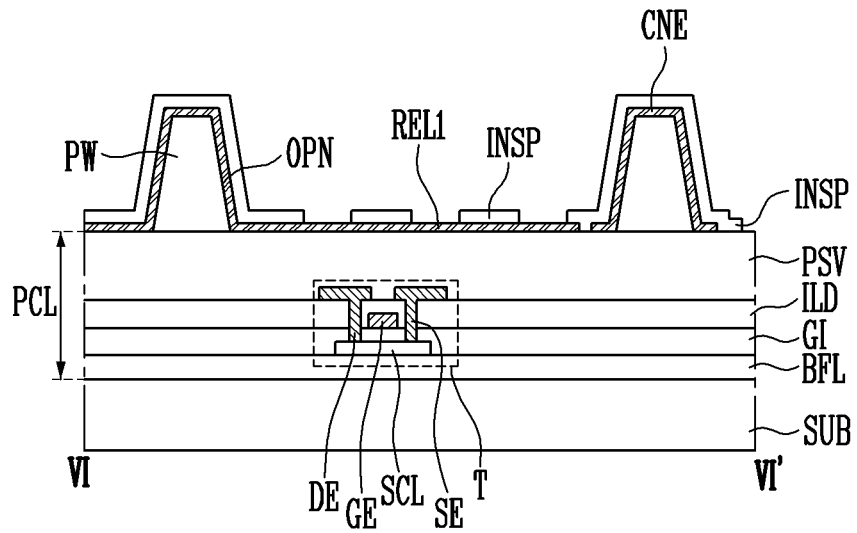
Figure 20E:
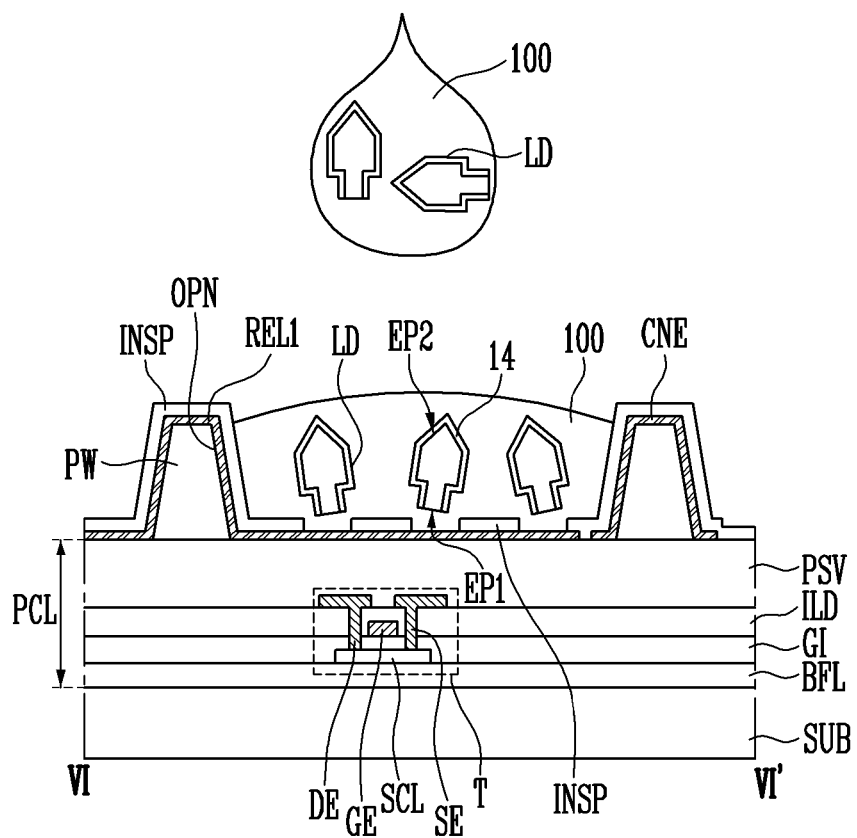
Figure 20F:
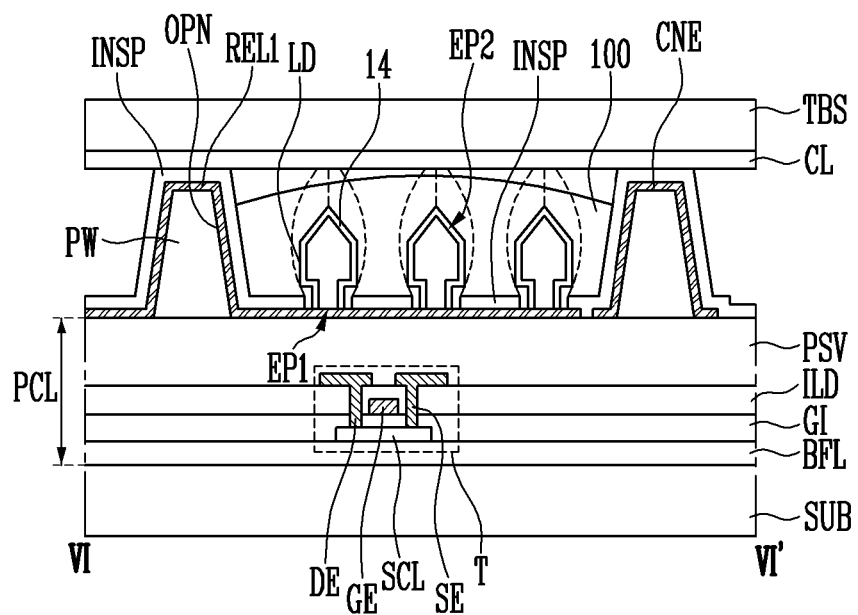
Figure 20G:
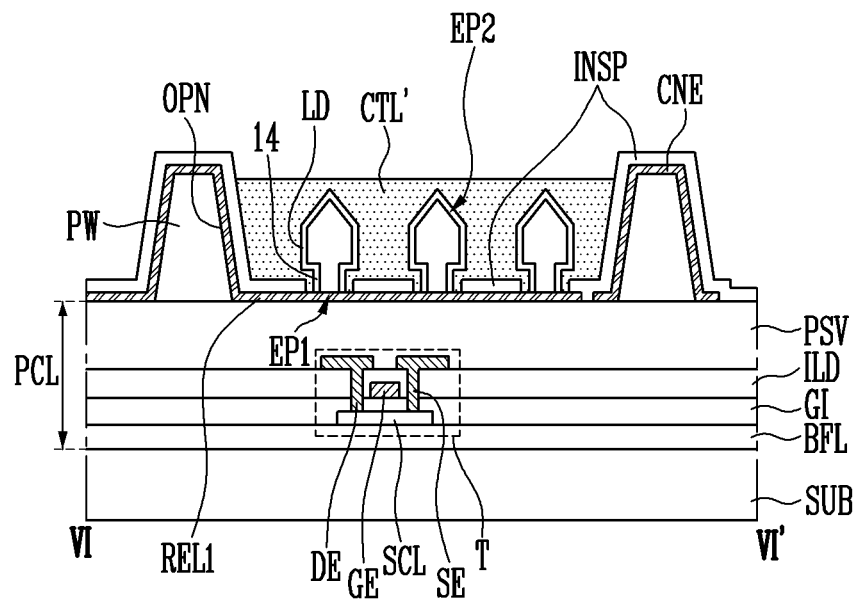
Figure 20H:
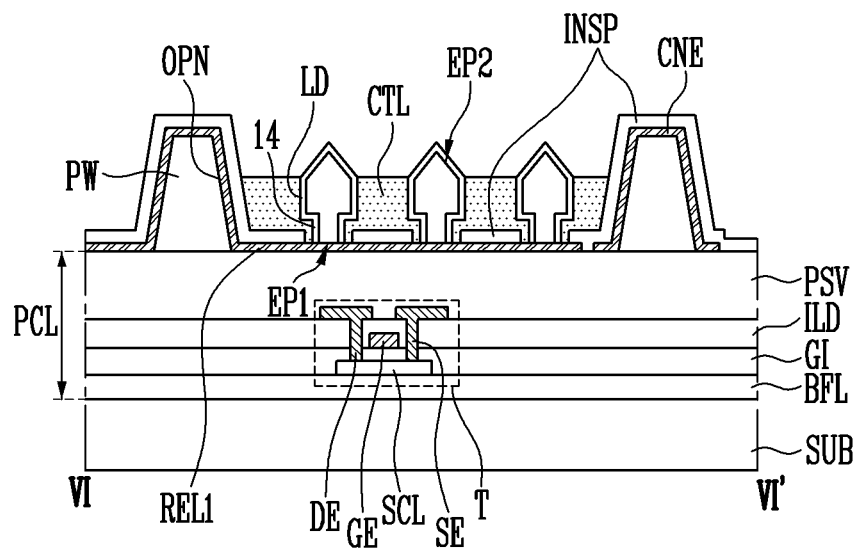
Figure 20I:
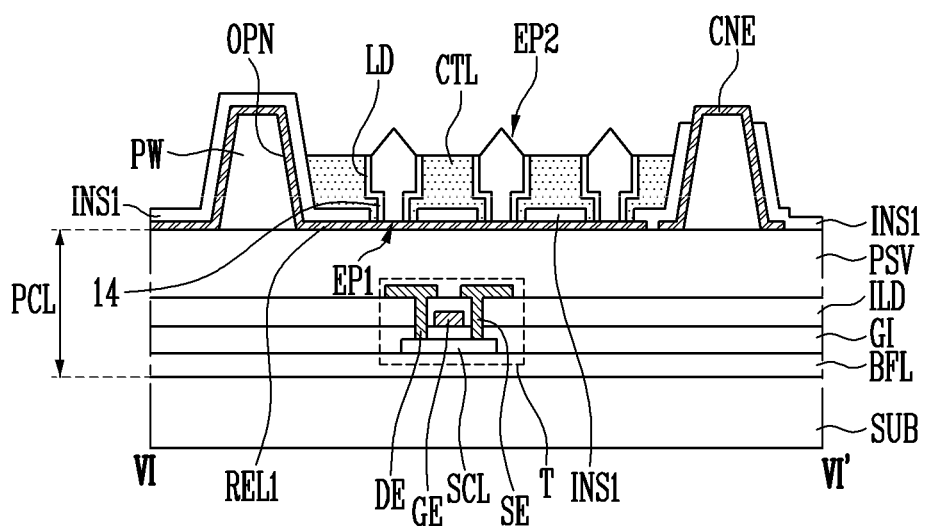
Figure 20J:
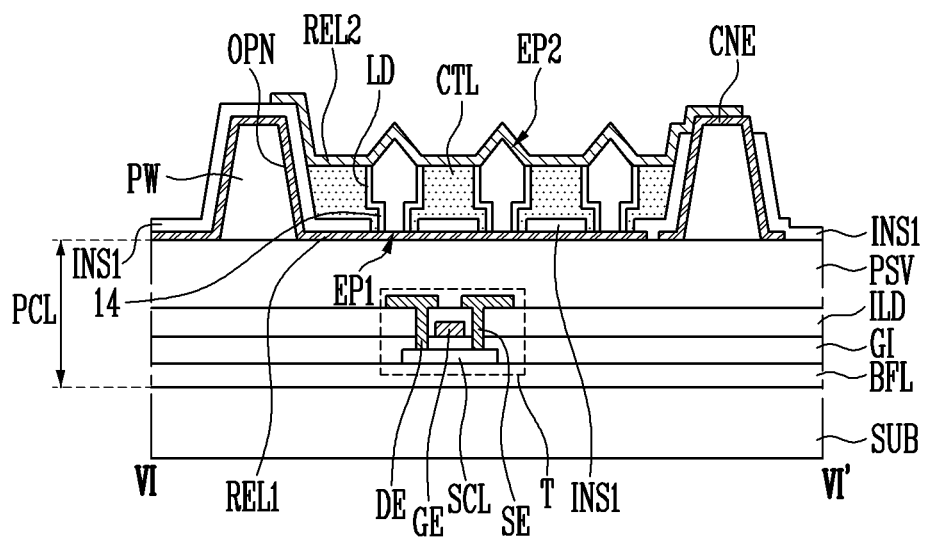
Figure 20K:
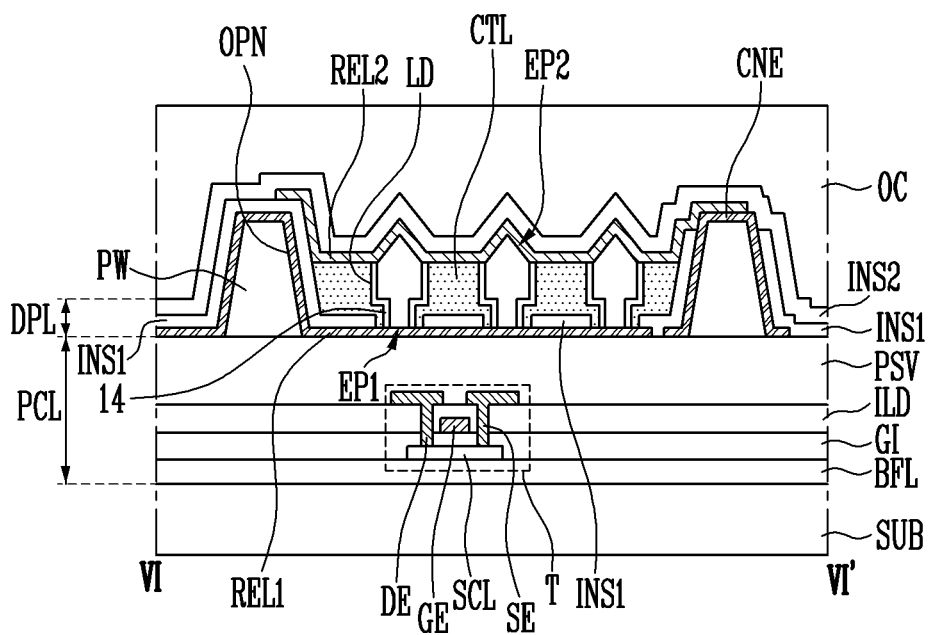

In an embodiment of the present disclosure, the electrode layer 15 that is not covered with the insulating film 14 may be provided on the second end portion EP2 of each of the light emitting elements LD. In other words, at least a portion of the electrode layer 15 of each of the light emitting elements LD may not be covered with the insulating film 14. The electrode layer 15 may be directly coupled (or brought into contact) with the second electrode REL2 rather than being covered with the insulating film 14, and thus be electrically and/or physically coupled with the second electrode REL2. During a process of forming the display element layer DPL of each sub-pixel, at least a portion of the electrode layer 15 may be exposed by removing a portion of the insulating film 14. Further description of this process will be provided below with reference to FIG. 20*l*.

A portion of the light emitting element LD, other than the lower surface of the first conductive semiconductor layer 11 that is directly coupled (or brought into direct contact) with the first electrode REL1 and at least a portion of the electrode layer 15 that is directly coupled (or brought into contact) with the second electrode REL2, may be covered with the insulating film 14. However, the present disclosure is not limited thereto. In some embodiments, the active layer 12 in each light emitting element LD may be covered with the insulating film 14.

In an embodiment of the present disclosure, in each light emitting element LD, the first conductive semiconductor layer 11 disposed at a lower position with respect to the longitudinal direction (L) is directly coupled (or brought into direct contact) with the first electrode REL1, and the electrode layer 15 disposed thereover is directly coupled (or brought into direct contact) with the second electrode REL2. Hence, each of the light emitting elements LD in the emission area EMA of each sub-pixel may be disposed between the first electrode REL1 and the second electrode REL2 with respect to the longitudinal direction L. In other words, each of the light emitting elements LD may be aligned (or disposed) in the vertical direction in a sectional view, as illustrated in FIG. 6.

A set or predetermined voltage may be applied to the first conductive semiconductor layer 11 disposed on the first end portion EP1 of each of the light emitting elements LD through the first electrode REL1. A set or predetermined voltage may be applied to the electrode layer 15 disposed on the second end portion EP2 through the second electrode REL2. Hence, each of the light emitting elements LD may emit light by coupling of electron-hole pairs in the active layer 12 of each of the light emitting elements LD.

In an embodiment of the present disclosure, because the active layer 12 of each of the light emitting elements LD may be provided in the form of enclosing the outer peripheral (e.g., circumferential) surface (or the surface) of the first conductive semiconductor layer 11, light may be emitted from each of the light emitting elements LD along an area in which the active layer 12 is disposed. In other words, each of the light emitting elements LD may emit light from all areas in which the active layer 12 is disposed. Consequently, because each of the light emitting elements LD includes the light emitting pattern 10 having a core-shell including the active layer 12 that encloses the first conductive semiconductor layer 11 disposed in a central area, a surface area with which light is emitted from each light emitting element LD may be further increased.

In the emission area EMA of each sub-pixel, the light emitting elements LD may be aligned (or disposed) in the opening OPN of the partition wall PW and be enclosed by the partition wall PW. Hence, each of the light emitting elements LD may be enclosed by the first electrode REL1 and the contact electrode CNE that are provided on the partition wall PW. Light emitted from each of the light emitting elements LD may be reflected by the first electrode REL1 and the contact electrode CNE and travel in the frontal direction of the display device (or the direction in which an image is displayed).

In an embodiment of the present disclosure, because each of the light emitting elements LD is aligned (or disposed) in the longitudinal direction (L) of the light emitting element LD (or in the vertical direction in a sectional view), and the active layer 12 is provided in the form of enclosing the outer peripheral (e.g., circumferential) surface of the first conductive semiconductor layer 11, each light emitting element LD may emit light from all areas in which the active layer 12 is disposed. For example, because each of the light emitting elements LD is aligned (or disposed) in the longitudinal direction (L) (or in the vertical direction in a sectional view), the active layer 12 of each light emitting element LD may be enclosed by a structure for reflecting light and, e.g., may be spaced apart from the pixel circuit layer PCL by a set or predetermined distance and enclosed by the first electrode REL1 and the contact electrode CNE. Hence, light emitted from the active layer 12 of each of the light emitting elements LD may travel in the frontal direction of the display device by the first electrode REL1 and the contact electrode CNE rather than traveling to the pixel circuit layer PCL.

Light emitted from the active layer 12 disposed on the second end portion EP2 of each light emitting element LD may directly travel in the frontal direction of the display device after passing through the second electrode REL2. Furthermore, light emitted from the active layer 12 that is disposed in an area other than the first and second end portions EP1 and EP2 of each light emitting element LD may travel to the first electrode REL1 and the contact electrode CNE that enclose each light emitting element LD and be reflected in the frontal direction of the display device by the first electrode REL1 and the contact electrode CNE.

In the case where the light emitting elements LD are aligned (or disposed) in one direction (or a horizontal direction in a sectional view) intersecting with the longitudinal direction (L) of the light emitting element LD, at least one area of the active layer 12 that is provided in the form of enclosing the first conductive semiconductor layer 11 may closely face the pixel circuit layer PCL. In this case, some of the light emitted from the active layer 12 may travel to the pixel circuit layer PCL, e.g., the passivation layer PSV, and be absorbed by the passivation layer PSV and not be reflected by the first electrode REL1 and the contact electrode CNE, thus not traveling in the frontal direction of the display device. Hence, in the case where the light emitting elements LD are aligned (or disposed) in one direction (or in the horizontal direction in a sectional view) intersecting with the longitudinal direction (L) of the light emitting element LD, the efficiency of light emitted from each light emitting element LD may be reduced.

Given this, in an embodiment of the present disclosure, the light emitting elements LD are aligned in the longitudinal direction (L) (or the vertical direction in a sectional view) so that light emitted from each light emitting element LD can travel in the frontal direction of the display device without loss, whereby the light output efficiency of each light emitting element LD can be enhanced.

The above-mentioned light emitting elements LD may be stably fixed by the intermediate layer CTL in the emission area EMA of each sub-pixel. The intermediate layer CTL may be made of transparent material to minimize or reduce loss of light emitted from each of the light emitting elements LD. The intermediate layer CTL may be formed of insulating material and have flexibility.

The intermediate layer CTL may be formed and/or provided in such a way that it is hardened during a process of aligning (or disposing) light emitting elements LD after a fluidic solution (or a solvent) including the light emitting elements LD has been input into the emission area EMA of each sub-pixel. The intermediate layer CTL may be formed of organic material. The organic material may be, for example, optically or thermally hardened and be selected from various suitable organic polymers. For instance, the organic material may include an acrylic acid ester polymer. In some embodiments, the organic material may include epoxy resin. The epoxy resin may include bisphenol A-type or kind of resin, bisphenol F-type or kind of resin, bisphenol AD-type or kind of resin, bisphenol S-type or kind of resin, xylenol type or kind of resin, phenol novolac type or kind of resin, cresol novolac type or kind of resin, polyfunctional type or kind of resin, tetraphenylolmethane type or kind of resin, polyethylene glycol type or kind of resin, polypropylene glycol type or kind of resin, hexandiol type or kind of resin, trimethylol propane type or kind of resin, propylene oxide bisphenol A-type or kind of resin, or a compound thereof.

The intermediate layer CTL may be hardened by heat or light such as UV after the light emitting elements LD are aligned (or disposed) in the vertical direction in the emission area EMA of each sub-pixel. Hence, the intermediate layer CTL may stably fix the light emitting elements LD aligned (or disposed) in the vertical direction, and prevent or reduce removal of each light emitting element LD. In an embodiment of the present disclosure, the intermediate layer CTL may be formed of material capable of being processed through an exposure process.

The intermediate layer CTL may have an appropriate thickness and be provided in the form of being charged into the opening OPN of the partition wall PW in the emission area EMA of each sub-pixel. In an embodiment of the present disclosure, the intermediate layer CTL may be provided in the form of enclosing a portion of the insulating film 14 of each of the light emitting elements LD. In other words, the intermediate layer CTL may not cover the second end portion EP2 of each of the light emitting elements LD.

A second insulating layer INS2 for covering the second electrode REL2 may be provided on the second electrode REL2. The second insulating layer INS2 may prevent or reduce exposure of the second electrode REL2 to the outside, thus preventing or reducing corrosion of the second electrode REL2. The second insulating layer INS2 may be formed of either an inorganic insulating layer or an organic insulating layer.

An overcoat layer OC may be provided on the second insulating layer INS2. The overcoat layer OC may be an encapsulation layer, configured to mitigate a step difference formed by the partition wall PW, the first electrode REL1, and the second electrode REL2 that are disposed under the overcoat layer OC, and prevent or reduce permeation of oxygen and/or water to the light emitting elements LD.

As described above, set or predetermined voltages may be applied, through the first electrode REL1 and the second electrode REL2, to the opposite end portions EP1 and EP2 of each of the light emitting elements LD aligned (or disposed) in the longitudinal direction (L) (or the vertical direction in a sectional view) in the emission area EMA of each sub-pixel. Hence, each of the light emitting elements LD may emit light having a wavelength range from 400 nm to 900 nm by coupling of electron-hole pairs in the active layer 12 of each of the light emitting elements LD.

Figure 10:
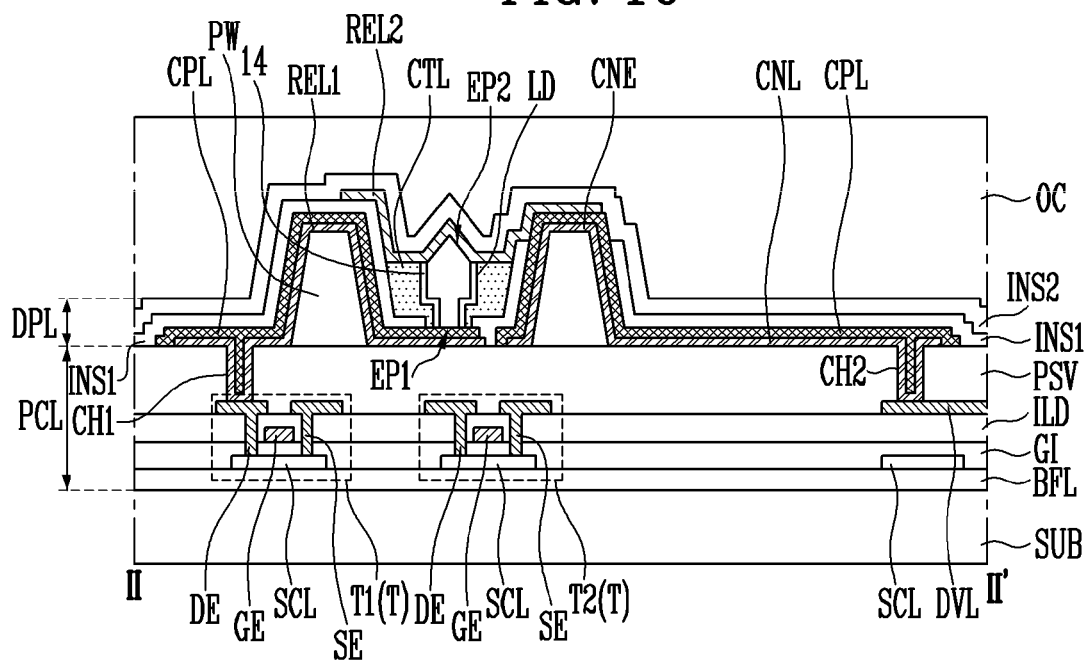
FIG. 10 illustrates a display device in which a capping layer is formed on a first electrode shown in FIG. 8, and is a sectional view taken along line II-II' of FIG. 5.

FIG. 10 illustrates a display device in which a capping layer is formed on a first electrode shown in FIG. 8, and is a sectional view taken along line II-II' of FIG. 5.

The configuration of the display device illustrated in FIG. 10, other than the fact that a capping layer is formed and/or provided on a first electrode and a contact electrode, may be substantially equal or similar to that of the display device of FIG. 8.

Therefore, with regard to the display device of FIG. 10, the following description will be focused on differences from that of the foregoing embodiments, to avoid redundant explanation. Components which are not separately explained in the following description of the present embodiment comply with that of the foregoing embodiments. The same reference numeral will be used to designate the same component, and a similar reference numeral will be used to designate a similar component.

Referring to FIGS. 1A, 1B, 5, and 10, the display device in accordance with an embodiment of the present disclosure may include a substrate SUB on which a plurality of pixels PXL are provided. Each of the pixels PXL may include first to third sub-pixels SP1 to SP3.

Each sub-pixel may include an emission area EMA which emits light, and a peripheral area PPA disposed in a perimeter of the emission area EMA. Furthermore, each sub-pixel may include a pixel circuit layer PCL and a display element layer DPL.

The pixel circuit layer PCL of each sub-pixel may include at least one transistor T, a driving voltage line DVL, and a passivation layer PSV.

The display element layer DPL of each sub-pixel may include a partition wall PW, light emitting elements LD, a first electrode REL1, a contact electrode CNE, and a second electrode REL2. Furthermore, the display element layer DPL of each sub-pixel may further include a capping layer CPL provided between the first electrode REL1 and the first insulating layer INS1 and between the contact electrode CNE and the first insulating layer INS1.

The capping layer CPL may prevent or reduce damage to the first electrode REL1 and the contact electrode CNE due to defects which may occur during a process of manufacturing the display device, and further reinforce adhesive force (or coupling force) between the first electrode REL1 and the passivation layer PSV and between the contact electrode CNE and the passivation layer PSV. The capping layer CPL may be formed of transparent conductive material such as indium zinc oxide (IZO) to minimize or reduce loss of light emitted from each of the light emitting elements LD and reflected by the corresponding electrode in the frontal direction of the display device.

In the case where the capping layer CPL is formed and/or provided on the first electrode REL1, the first insulating layer INS1 may expose one area of the capping layer CPL to the outside and cover the other area except the one area. The one area of the capping layer CPL exposed to the outside may be directly coupled (or brought into direct contact) with the first end portion EP1 of each light emitting element LD. In the case where the capping layer CPL is formed and/or provided on the contact electrode CNE, the first insulating layer INS1 may expose one area of the capping layer CPL to the outside and cover the other area except the one area. One area of the capping layer CPL on the contact electrode CNE that is exposed to the outside may be directly coupled (or brought into direct contact) with the second electrode REL2.

Figure 11:
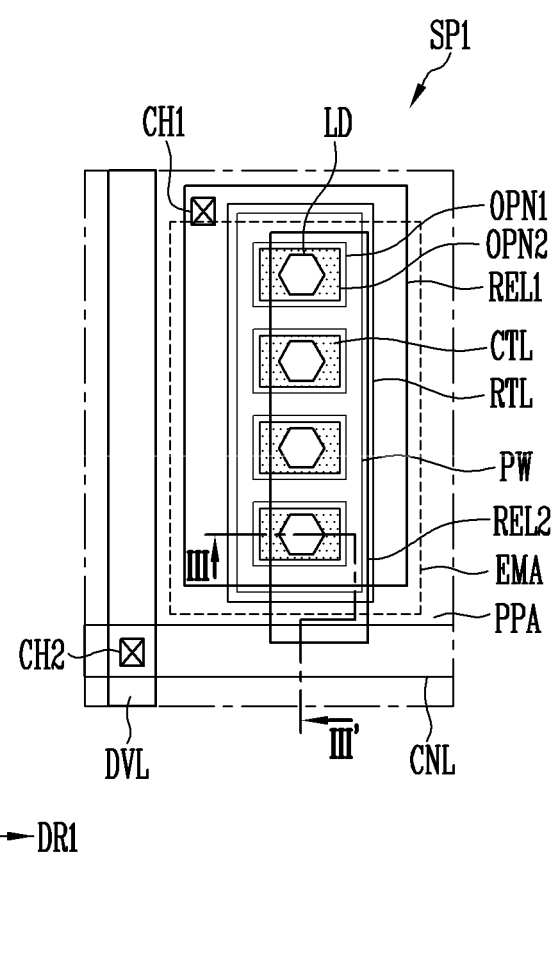
FIG. 11 is a plan view illustrating an embodiment of the first sub-pixel of FIG. 5.
Figure 12:
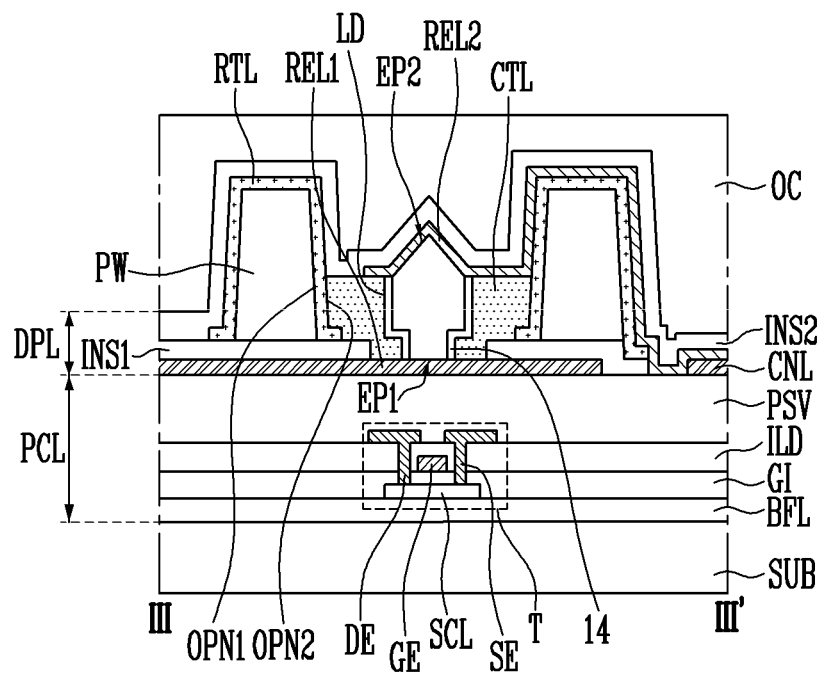
FIG. 12 is a sectional diagram taken along line III-III' of FIG. 11.

FIG. 11 is a plan view illustrating an embodiment of the first sub-pixel of FIG. 5. FIG. 12 is a sectional view taken along line III-III' of FIG. 11.

For the sake of explanation, illustration of transistors connected to the light emitting elements, and signal lines connected to the transistors has been omitted in FIG. 11.

Moreover, although FIGS. 11 and 12 illustrate a simplified structure of the first sub-pixel, e.g., showing that each electrode has only a single electrode layer, and each insulating layer has only a single insulating layer, the present disclosure is not limited thereto.

The configuration of the first sub-pixel illustrated in FIG. 11, other than the fact that a partition wall is disposed on the first electrode and a reflective layer is formed and/or provided on the partition wall, may be substantially equal or similar to that of the first sub-pixel of FIG. 5.

Therefore, to avoid redundant explanation, the description of the first sub-pixel of FIG. 11 will be focused on differences from that of the foregoing embodiments. Components which are not separately explained in the following description of the present embodiment comply with that of the foregoing embodiments. The same reference numeral will be used to designate the same component, and a similar reference numeral will be used to designate a similar component.

Referring to FIGS. 1A, 1B, 11, and 12, the first sub-pixel SP1 may include an emission area EMA, and a peripheral area PPA disposed around the emission area EMA. The first sub-pixel SP1 may include a substrate SUB, a pixel circuit layer PCL, and a display element layer DPL.

The pixel circuit layer PCL may include at least one transistor T, a driving voltage line DVL, and a passivation layer PSV.

The display element layer DPL may include a first electrode REL1 and a connection line CNL which are provided on the passivation layer PSV, a partition wall PW which is provided on the first electrode REL1 and includes a first opening OPN1, a reflective layer RTL which is provided on the partition wall PW and includes a second opening OPN2, light emitting elements LD configured to emit light, an intermediate layer CTL provided to fix the light emitting elements LD, and a second electrode REL2 provided on the light emitting elements LD.

The first electrode REL1 may be provided and/or formed on the passivation layer PSV. The first electrode REL1 may be provided in the emission area EMA of the first sub-pixel SP1 and extend in a second direction DR2 (e.g., 'vertical direction'). The first electrode REL1 may be electrically and/or physically connected to the first end portion EP1 of the light emitting element LD. The first electrode REL1 may be electrically connected to the transistor T of the pixel circuit layer PCL through a first contact hole CH1 of the passivation layer PSV. Hence, a signal (or a voltage) applied to the transistor T may be transmitted to the first electrode REL1. The signal (or the voltage) transmitted to the first electrode REL1 may be eventually transmitted to the first end portion EP1 of each light emitting element LD.

The connection line CNL may be provided on the same surface as that of the first electrode REL1, for example, on the passivation layer PSV, and be spaced apart from the first electrode REL1. In a plan view, the connection line CNL may be provided in the peripheral area PPA of the first sub-pixel SP1 and extend in a first direction DR1 (e.g., 'horizontal direction') intersecting with the second direction DR2. The connection line CNL may partially overlap with the second electrode REL2 and be electrically and/or physically connected to the second electrode REL2.

The first insulating layer INS1 may be provided and/or formed on the first electrode REL1 and the connection line CNL.

The partition wall PW may be formed and/or provided on the first insulating layer INS1 formed on the first electrode REL1. The partition wall PW may be provided in the form of enclosing each light emitting element LD in the emission area EMA of the first sub-pixel SP1, and include a first opening OPN1 which exposes at least one area of the first electrode REL1 to determine alignment positions of the light emitting elements LD. In an embodiment of the present disclosure, the partition wall PW may have a height (or a thickness) greater than a length L of the light emitting elements LD.

The reflective layer RTL may be provided on the partition wall PW including the first opening OPN1. The reflective layer RTL may be provided and/or formed on the partition wall PW and have a surface profile corresponding to the shape of the partition wall PW. The reflective layer RTL may be disposed on the partition wall PW provided in the form of enclosing each of the light emitting elements LD and function as a reflector configured to reflect light emitted from each light emitting element LD in the frontal direction of the display device (e.g., in a direction in which an image is displayed).

The reflective layer RTL may be formed of conductive material having a set or predetermined reflectivity. For instance, the conductive material may include at least one of gold (Au), magnesium (Mg), aluminum (Al), silver (Ag), chromium (Cr), molybdenum (Mo), platinum (Pt), nickel (Ni), palladium (Pd), calcium (Ca), neodymium (Nd), iridium (Ir), lithium (Li), and an alloy thereof. A film, a sheet, or a substrate made of the foregoing conductive material, or a substrate on which a layer made of the foregoing material is formed may be selectively used as the reflective layer RTL.

In an embodiment, the reflective layer RTL may include the same material as that of the first electrode REL1. However, the present disclosure is not limited thereto. In some embodiments, the reflective layer RTL may be formed of a dielectric mirror or an interference mirror formed by alternately depositing dielectric thin-films having different refractive indexes.

The reflective layer RTL may include a second opening OPN2 which corresponds to the first opening OPN1 and exposes at least a portion of the first electrode REL1. The reflective layer RTL may be electrically insulated from the first electrode REL1 with the first insulating layer INS1 interposed therebetween. The reflective layer RTL may completely cover the partition wall PW and completely overlap with the partition wall PW.

The second electrode REL2 may be provided and/or formed on the reflective layer RTL, the light emitting elements LD, and the connection line CNL. The second electrode REL2 may be coupled (or brought into contact) with the second end portion EP2 of each of the light emitting elements LD and electrically and/or physically connected to the connection line CNL. Because the connection line CNL is connected to the driving voltage line DVL through the second contact hole CH2 of the passivation layer PSV, the voltage of the second driving power supply (refer to VSS of FIG. 4A) that is applied to the driving voltage line DVL may be transmitted to the connection line CNL. Furthermore, the voltage of the second driving power supply VSS that is transmitted to the connection line CNL may be transmitted to the second electrode REL2 and eventually supplied to the second end portion EP2 of each light emitting element LD.

Each of the light emitting elements LD may include a first end portion EP1 disposed in a lower portion thereof with respect to the longitudinal direction (L), and a second end portion EP2 disposed in an upper portion thereof. The first conductive semiconductor layer 11 may be disposed on the first end portion EP1 of each light emitting element LD. The electrode layer 15 may be disposed on the second end portion EP2 of each light emitting element LD or, if the electrode layer 15 is not present, the second conductive semiconductor layer 13 may be disposed thereon. Each of the light emitting elements LD may be aligned (or disposed) in the longitudinal direction (L) between the first electrode REL1 and the second electrode REL2, in a sectional view. Here, the longitudinal direction (L) may refer to a vertical direction in a sectional view.

Each of the light emitting elements LD may be fixed by the intermediate layer CTL provided in the form of being charged into the second opening OPN2 of the reflective layer RTL between the first electrode REL1 and the second electrode REL2. The intermediate layer CTL may function as a fixer for fixing the positions of the light emitting elements LD after the first end portion EP1 of each of the light emitting elements LD is brought into contact with (or coupled with) the first electrode REL1 when the light emitting elements LD are aligned in the emission area EMA of the first sub-pixel SP1. The intermediate layer CTL may directly touch (or come into contact with) at least one area of the reflective layer RTL formed and/or provided on the partition wall PW. In more detail, the intermediate layer CTL may directly touch (or come into direct contact with) at least one area of the reflective layer RTL formed and/or provided on one side surface of the partition wall PW, e.g., a side surface of the partition wall PW that faces each light emitting element LD.

In an embodiment of the present disclosure, the intermediate layer CTL may directly touch (or come into direct contact with) each of at least one area of the reflective layer RTL, a portion of the outer peripheral (e.g., circumferential) surface (or the surface) of each light emitting element LD, the first electrode REL1, and the second electrode REL2, and be enclosed by the reflective layer RTL, each of the light emitting elements LD, and the first and second electrodes REL1 and REL2. The above-mentioned portion of the outer peripheral (e.g., circumferential) surface (or the surface) of each light emitting element LD may include a portion other than the second end portion EP2 that is directly coupled (or brought into contact) with the second electrode REL2.

The intermediate layer CTL may be hardened by light or heat and then partially removed through an ashing process so that the second end portion EP2 of each of the light emitting elements LD may be exposed. The exposed second end portion EP2 of each light emitting element LD may be electrically and/or physically connected to the second electrode REL2 disposed thereover and be applied with the voltage of the second driving power supply VSS from the second electrode REL2.

In an embodiment of the present disclosure, each of the light emitting elements LD may include a light emitting pattern 10 which has a core-shell structure and includes a first conductive semiconductor layer 11 disposed in a central area, an active layer 12 which encloses the first conductive semiconductor layer 11, a second conductive semiconductor layer 13 which encloses the active layer 12, and an electrode layer 15 which encloses the second conductive semiconductor layer 13. Because each of the light emitting elements LD includes the light emitting pattern 10 having a core-shell structure, each light emitting element LD may emit light in all areas in which the active layer 12 is disposed.

Figure 13:
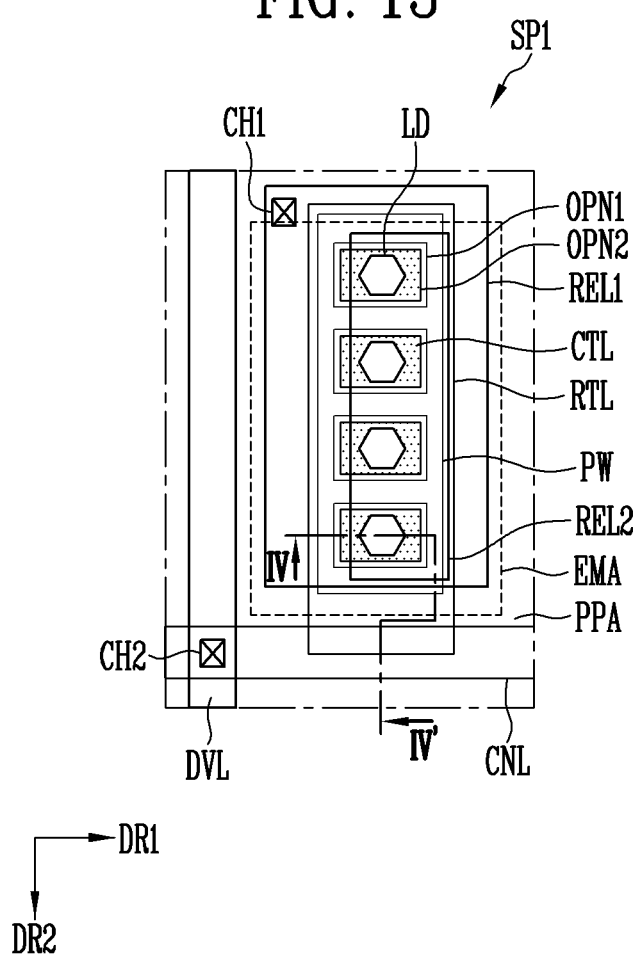
FIG. 13 is a plan view illustrating an embodiment of the first sub-pixel of FIG. 11.
Figure 14:
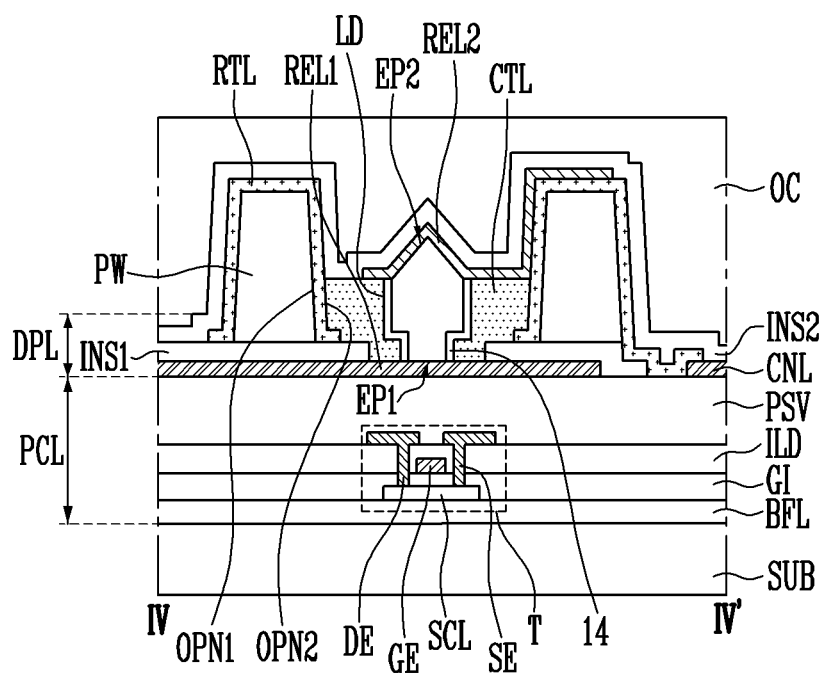
FIG. 14 is a sectional diagram taken along line IV-IV' of FIG. 13.

FIG. 13 is a plan view illustrating an embodiment of the first sub-pixel of FIG. 11. FIG. 14 is a sectional view taken along line IV-IV' of FIG. 13.

For the sake of explanation, illustration of transistors connected to the light emitting elements, and signal lines connected to the transistors has been omitted in FIG. 13.

Moreover, although FIGS. 13 and 14 illustrate a simplified structure of the first sub-pixel, e.g., showing that each electrode has only a single electrode layer, and each insulating layer has only a single insulating layer, the present disclosure is not limited thereto.

The configuration of the first sub-pixel shown in FIG. 13, other than the fact that a connection line is electrically connected to the second electrode through the reflective layer, may be substantially equal or similar to that of the first sub-pixel of FIG. 11.

Therefore, to avoid redundant explanation, the description of the first sub-pixel of FIG. 13 will be focused on differences from that of the foregoing embodiments. Components which are not separately explained in the following description of the present embodiment comply with that of the foregoing embodiments. The same reference numeral will be used to designate the same component, and a similar reference numeral will be used to designate a similar component.

Referring to FIGS. 1A, 1B, 13, and 14, the first sub-pixel SP1 may include a substrate SUB, a pixel circuit layer PCL, and a display element layer DPL.

The display element layer DPL may include a first electrode REL1, a connection line CNL, a partition wall PW, a reflective layer RTL, light emitting elements LD, an intermediate layer CTL, and a second electrode REL2.

The connection line CNL may extend in the first direction DR1 and be electrically and/or physically connected to the driving voltage line DVL through the second contact hole CH2 included in the passivation layer PSV of the pixel circuit layer PCL. Hence, the voltage of the second driving power supply (refer to VSS of FIG. 4A) of the driving voltage line DVL may be transmitted to the connection line CNL.

The reflective layer RTL may be provided and/or formed on the partition wall PW and have a surface profile corresponding to the shape of the partition wall PW. For example, because the partition wall PW is provided in a shape having a height (or a thickness) greater than the length L of the light emitting elements LD, the reflective layer RTL may have a shape corresponding thereto. The reflective layer RTL along with the partition wall PW may enclose the perimeter of each of the light emitting elements LD and reflect light emitted from each light emitting element LD so that the light can travel in the frontal direction of the display device.

In an embodiment of the present disclosure, the reflective layer RTL may be formed of conductive material having a set or predetermined reflectivity, and may overlap with at least a portion of the connection line CNL and be electrically and/or physically connected to the connection line CNL. Because the second electrode REL2 is provided and/or formed on the reflective layer RTL, the reflective layer RTL may be electrically and/or physically connected to the second electrode REL2. Consequently, the connection line CNL and the second electrode REL2 may be electrically connected to each other through the reflective layer RTL. Hence, the voltage of the second driving power supply VSS that is transmitted to the connection line CNL may be transmitted to the second electrode REL2 through the reflective layer RTL and eventually supplied to the second end portion EP2 of each of the light emitting elements LD.

Figure 16A:
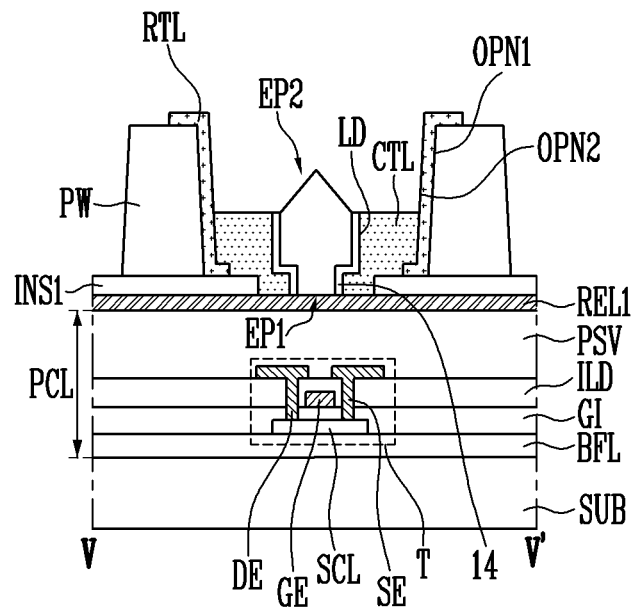
FIG. 16A is a sectional diagram taken along line V-V' of FIG. 15.
Figure 16B:
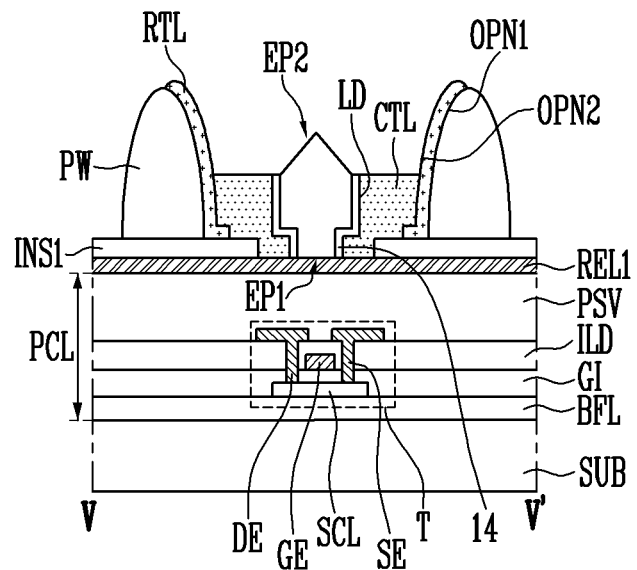
FIG. 16B illustrates another shape of a partition wall illustrated in FIG. 16A, and is a sectional view taken along line V-V' of FIG. 15.

FIG. 15 illustrates an embodiment of the first sub-pixel of FIG. 5, and is a plan view schematically illustrating the first sub-pixel including only some components of the display element layer. FIG. 16A is a sectional diagram taken along line V-V' of FIG. 15. FIG. 16B illustrates another shape of a partition wall illustrated in FIG. 16A, and is a sectional view taken along line V-V' of FIG. 15.

For the sake of illustration, FIG. 15 illustrates only a driving voltage line, a first electrode, a partition wall, a reflective layer, light emitting elements, and an intermediate layer.

Moreover, although FIGS. 15, 16A, and 16B illustrate a simplified structure of the first sub-pixel, e.g., showing that each electrode has only a single electrode layer, and each insulating layer has only a single insulating layer, the present disclosure is not limited thereto.

To avoid redundant explanation, the description of the first sub-pixel of FIG. 15 will be focused on differences from that of the foregoing embodiments. Components which are not separately explained in the following description of the present embodiment comply with that of the foregoing embodiments. The same reference numeral will be used to designate the same component, and a similar reference numeral will be used to designate a similar component.

Referring to FIGS. 1A, 1B, 15, 16A, and 16B, the first sub-pixel SP1 in accordance with an embodiment of the present disclosure may include a substrate SUB including an emission area EMA and a peripheral area PPA. Furthermore, the first sub-pixel SP1 may include a pixel circuit layer PCL provided on the substrate SUB, and a display element layer DPL provided on the pixel circuit layer PCL.

The display element layer DPL may include a first electrode REL1, a partition wall PW, a reflective layer RTL, light emitting elements LD, and an intermediate layer CTL.

The first electrode REL1 may be provided on the passivation layer PSV of the pixel circuit layer PCL and brought into direct contact with (or coupled with) the first end portion EP1 of the opposite end portions EP1 and EP2 of each of the light emitting elements LD. Hence, the first electrode REL1 may be electrically and/or physically connected to the first end portion EP1 of each light emitting element LD.

The partition wall PW may be provided and/or formed on the first electrode REL1 with the first insulating layer INS1 interposed therebetween. Furthermore, the partition wall PW may include a first opening OPN1 which exposes at least one area of the first electrode REL1 disposed under the partition wall PW. The partition wall PW may enclose each of the light emitting elements LD in the emission area EMA of the first sub-pixel SP1.

For example, the partition wall PW may be provided in a shape having a height (or a thickness) greater than the length L of each of the light emitting elements LD. In an embodiment of the present disclosure, although the partition wall PW may have a trapezoidal cross-section which is reduced in width upward from one surface of the first insulating layer INS1, as illustrated in FIG. 16A, the present disclosure is not limited thereto. In an embodiment, the partition wall PW may include a curved surface having a semi-elliptical cross-section, a semi-circular cross-section, etc., which is reduced in width upward from one surface of the first insulating layer INS1, as illustrated in FIG. 16B.

The reflective layer RTL may be provided and/or formed on the partition wall PW and enclose the perimeter of each of the light emitting elements LD. The reflective layer RTL may reflect light emitted from the active layer 12 of each of the light emitting elements LD in the frontal direction of the display device (e.g., in a direction in which an image is displayed) and thus further enhance the efficiency of light emitted from each of the light emitting elements LD. In an embodiment of the present disclosure, the reflective layer RTL may overlap with at least a portion of the partition wall PW, e.g., one side surface of the partition wall PW adjacent to the light emitting elements LD, and include a second opening OPN2 which exposes each of a portion of the first insulating layer INS1 and a portion of the first electrode REL1. Furthermore, the second opening OPN2 may expose the second end portion EP2 of each of the light emitting elements LD and the intermediate layer CTL. In an embodiment of the present disclosure, the second opening OPN2 of the reflective layer RTL may correspond to the first opening OPN1 of the partition wall PW and have a width less than that of the first opening OPN1 in at least one direction.

In an embodiment of the present disclosure, in the case where the reflective layer RTL is provided and/or formed on at least a portion of the partition wall PW, e.g., one side surface of the partition wall PW that is adjacent to each of the light emitting elements LD, the reflective layer RTL may reflect light emitted from each of the light emitting elements LD in the frontal direction of the display device by a set or predetermined level or more (or without loss) and enhance the efficiency of light emitted from the light emitting elements LD.

Figure 17:
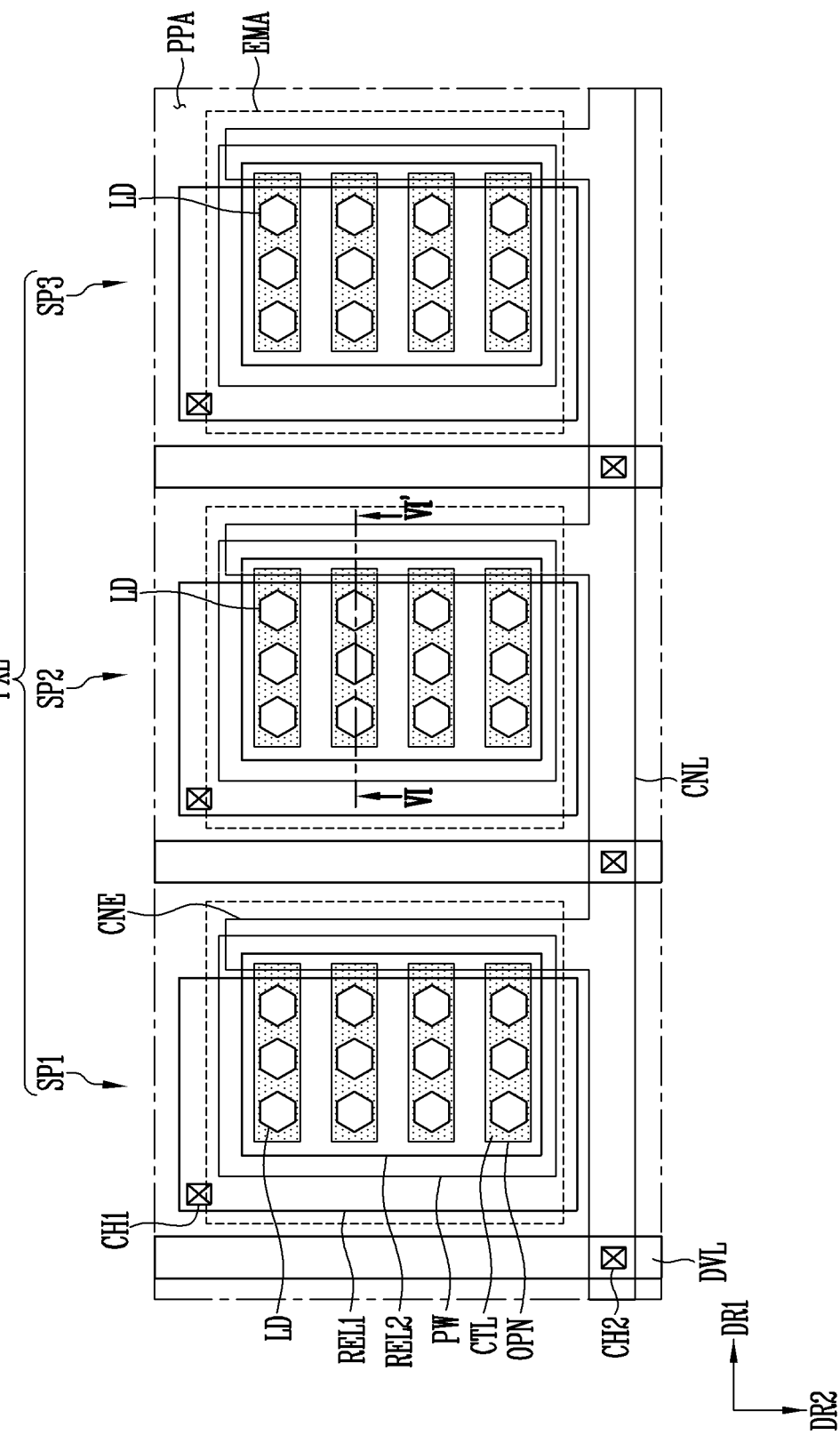
FIG. 17 is a plan diagram schematically illustrating first to third sub-pixels included in one of the pixels illustrated in FIG. 3.
Figure 18:
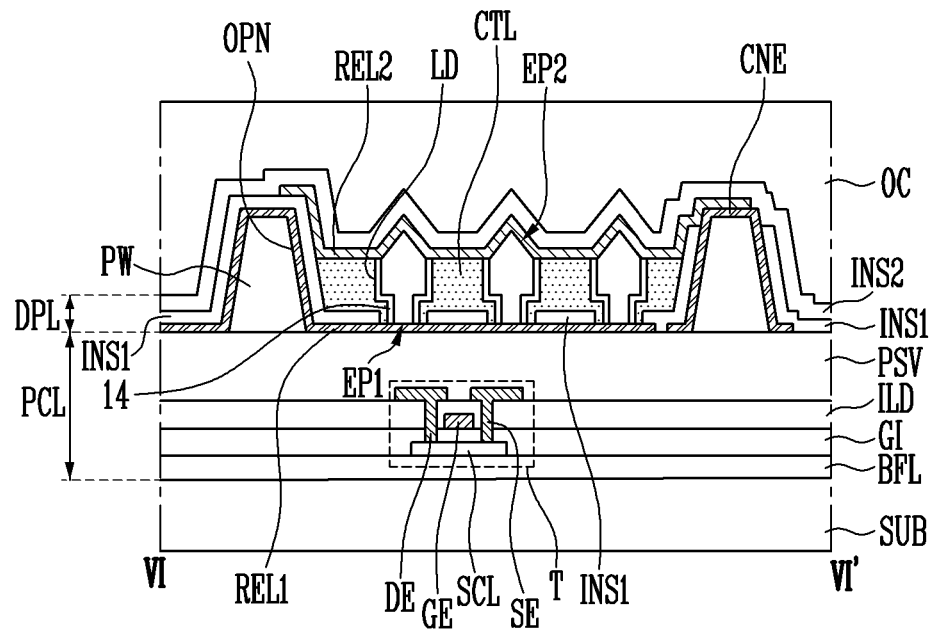
FIG. 18 is a sectional view taken along line VI-VI' of FIG. 17.
Figure 19:
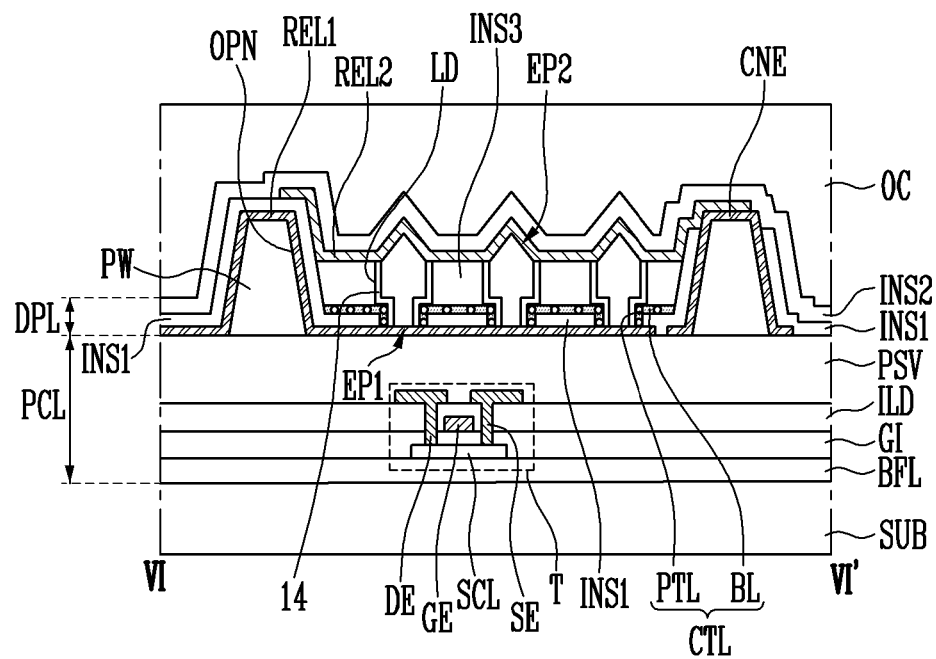
FIG. 19 illustrates another shape of an intermediate layer illustrated in FIG. 18, and is a sectional view taken along line VI-VI' of FIG. 17.

FIG. 17 is a plan view schematically illustrating first to third sub-pixels included in one of the pixels illustrated in FIG. 3. FIG. 18 is a sectional view taken along line VI-VI' of FIG. 17. FIG. 19 illustrates an embodiment of the intermediate layer shown in FIG. 18, and is a sectional view corresponding to line VI-VI' of FIG. 17.

For the sake of explanation, illustration of transistors connected to the light emitting elements, and signal lines connected to the transistors has been omitted in FIG. 17.

The configuration of the pixel illustrated in FIG. 17, other than the fact that three light emitting elements are disposed on the same row in the emission area of each sub-pixel, may be substantially equal or similar to that of the pixel of FIG. 5.

Therefore, with regard to the pixel of FIG. 17, the following description will be focused on differences from that of the foregoing embodiments, to avoid redundant explanation. Components which are not separately explained in the following description of the present embodiment comply with that of the foregoing embodiments. The same reference numeral will be used to designate the same component, and a similar reference numeral will be used to designate a similar component.

Referring to FIGS. 1A, 1B, 17, 18, and 19, the display device in accordance with an embodiment of the present disclosure may include a substrate SUB on which a plurality of pixels PXL are provided. Each pixel PXL may include first to third sub-pixels SP1 to SP3. Each sub-pixel may include a pixel circuit layer PCL provided on the substrate SUB, and a display element layer DPL provided on the pixel circuit layer PCL.

The display element layer DPL of each of the first to third sub-pixels SP1 to SP3 may include a first electrode REL1, a contact electrode CNE, a connection line CNL, a partition wall PW, light emitting elements LD, an intermediate layer CTL, and a second electrode REL2.

The partition wall PW may be provided in a shape enclosing each of the light emitting elements LD in the emission area EMA of each sub-pixel and include at least one or more openings OPN which expose the light emitting elements LD and the intermediate layer CTL in a plan view. The openings OPN included in the partition wall PW in the emission area EMA of each sub-pixel may extend in a first direction DR1 (e.g., 'horizontal direction'), but the present disclosure is not limited thereto. In an embodiment, the openings OPN may extend in a second direction DR2 (e.g., 'vertical direction') intersecting with the first direction DR1.

The first electrode REL1, the contact electrode CNE, and the connection line CNL may be provided and/or formed on the same surface, e.g., on the passivation layer PSV. The first electrode REL1 may be spaced apart from and electrically separated from each of the contact electrode CNE and the connection line CNL. The contact electrode CNE may be integrally provided with the connection line CNL, and electrically and/or physically connected with the connection line CNL. The connection line CNL may be electrically connected to the driving voltage line DVL through the second contact hole CH2 included in the passivation layer PSV of the pixel circuit layer PCL of each sub-pixel.

Each of the light emitting elements LD may include a light emitting pattern 10 which has a core-shell structure and includes a first conductive semiconductor layer 11 disposed in a central area with respect to the longitudinal direction (L), an active layer 12 which encloses the first conductive semiconductor layer 11, a second conductive semiconductor layer 13 which encloses the active layer 12, and an electrode layer 15 which encloses the second conductive semiconductor layer 13. Each of the light emitting elements LD may further include an insulating film 14 which encloses a portion of the outer peripheral (e.g., circumferential) surface (or the surface) of the light emitting pattern 10 having a core-shell structure. In an embodiment of the present disclosure, in each of the light emitting elements LD, the first conductive semiconductor layer 11 disposed at a lower position with respect to the longitudinal direction (L) may be directly coupled (or brought into direct contact) with the first electrode REL1, and the electrode layer 15 disposed thereover may be directly coupled (or brought into direct contact) with the second electrode REL2. Hence, each of the light emitting elements LD in the emission area EMA of each sub-pixel may be disposed between the first electrode REL1 and the second electrode REL2 with respect to the longitudinal direction (L). In other words, each of the light emitting elements LD may be aligned (or disposed) in the vertical direction in a sectional view.

In an embodiment of the present disclosure, in the emission area EMA of each sub-pixel, three light emitting elements LD may be aligned (or disposed) in the same opening OPN among the openings OPN of the partition wall PW. In an embodiment, the number of light emitting elements LD aligned (or disposed) in the same opening OPN of the partition wall PW may be at least one or more. In the following embodiments, as illustrated in FIG. 17, among the three light emitting elements LD aligned (or disposed) in the same opening OPN of the openings OPN included in the partition wall PW in the emission area EMA of each sub-pixel, a light emitting element LD disposed at the center will be referred to as a second light emitting element LD. A light emitting element LD disposed between the second light emitting element LD and the driving voltage line DVL will be referred to as a first light emitting element LD. A light emitting element LD disposed between the second light emitting element LD and the contact electrode CNE will be referred to as a third light emitting element LD.

The first light emitting element LD, the second light emitting element LD, and the third light emitting element LD may be aligned (or disposed) in the same opening OPN of the partition wall PW. The first end portion EP1 of each of the first light emitting element LD, the second light emitting element LD, and the third light emitting element LD may be brought into direct contact with (or directly coupled with) the first electrode REL1 and electrically and/or physically coupled with the first electrode REL1.

A first insulating layer INS1 may be provided and/or formed between the first light emitting element LD and the second light emitting element LD and between the second light emitting element LD and the third light emitting element LD. When at least two light emitting elements LD are aligned in the same opening OPN of the partition wall PW, the first insulating layer INS1 may minimize or reduce contact (or connection) between adjacent light emitting elements LD, thus preventing or reducing defects due to electrical short-circuit, and guiding each of the light emitting elements LD to a corresponding position.

The intermediate layer CTL may stably fix each of the first light emitting element LD, the second light emitting element LD, and the third light emitting element LD that are aligned (or disposed) in the same opening OPN of the partition wall PW and prevent or reduce removal of each light emitting element LD from the aligned (or disposed) position. In other words, to align (or dispose) the first light emitting element LD, the second light emitting element LD, and the third light emitting element LD in the emission area EMA of each sub-pixel, the intermediate layer CTL may function as a fixer for fixing each light emitting element LD.

To this end, the intermediate layer CTL may be formed of material capable of being hardened by heat or light during a process of aligning each light emitting element LD. In an embodiment, one area of each light emitting element LD, e.g., the second end portion EP2, may be exposed by removing a portion of the intermediate layer CTL. The exposed second end portion EP2 of each light emitting element LD may be electrically and/or physically connected with the second electrode REL2 provided and/or formed over the second end portion EP2. The voltage of the second driving power supply VSS applied to the driving voltage line DVL may be supplied to the second end portion EP2 of each light emitting element LD through the second electrode REL2, the contact electrode CNE, and the connection line CNL.

In an embodiment, as illustrated in FIG. 19, the intermediate layer CTL may be formed in a shape in which a plurality of conductive particles PTL are sprayed on a base layer BL formed of transparent resin. The conductive particles PTL may include, for example, conductive oxide particles or conductive nitride particles of metals, or a conductive polymer. For example, the metal may include zinc (Zn), aluminum (AI), scandium (Sc), chromium (Cr), manganese (Mn), iron (Fe), cobalt (Co), nickel (Ni), copper (Cu), indium (In), tin (Sn), yttrium (Y), zirconium (Zr), niobium (Nb), molybdenum (Mo), ruthenium (Ru), rhodium (Rh), palladium (Pd), gold (Au), silver (Ag), platinum (Pt), strontium (Sr), tungsten (W), cadmium (Cd), tantalum (Ta), titanium (Ti), or an alloy thereof. The conductive oxide may include, for example, indium tin oxide (ITO), indium zinc oxide (IZO), aluminum-doped zinc oxide (AZO), gallium indium zinc oxide (GIZO), zinc oxide (ZnO), or a compound thereof. The conductive polymer may be, for example, any one selected from poly-3, 4-ethylenedioxythiophene/poly-styrene sulfonate (PEDOT/PSS), polyaniline, polyacetylene, and polyphenylene vinylene, but the present disclosure is not limited thereto. In an embodiment of the present disclosure, the intermediate layer CTL may include silver dots or be provided in the form of silver paste.

In the case where the intermediate layer CTL includes the conductive particles PTL, the intermediate layer CTL may cover only the first end portion EP1 of the opposite end portions EP1 and EP2 of each light emitting element LD and make electrical connection between the first end portion EP1 and the first electrode REL1 more reliable. As described above, in the case where the intermediate layer CTL includes conductive particles PTL, the intermediate layer CTL may cover only the first end portion EP1 of each light emitting element LD to prevent or reduce short-circuiting of the active layer 12 of each light emitting element LD due to making contact with conductive material except the first and second conductive semiconductor layers 11 and 13. In other words, the intermediate layer CTL may not cover an area of each light emitting element LD where the active layer 12 is disposed, and may cover only one end portion of the first conductive semiconductor layer 11 having the same width along the longitudinal direction (L) of each light emitting element LD.

A third insulating layer INS3 may be formed and/or provided on the intermediate layer CTL. The third insulating layer INS3 may cover the active layer 12 of each light emitting element LD and minimize or reduce electrical interference of the intermediate layer CTL including the conductive particles PTL. The third insulating layer INS3 may be formed of an inorganic insulating layer to protect each light emitting element LD from the intermediate layer CTL, but the present disclosure is not limited thereto. In an embodiment, the third insulating layer INS3 may be formed of an organic insulating layer to planarize the alignment position of each of the light emitting elements LD and stably supporting each of the light emitting elements LD. In an embodiment of the present disclosure, the third insulating layer INS3 may allow the second end portion EP2 of each light emitting element LD to be exposed. The exposed second end portion EP2 of each light emitting element LD may be electrically and/or physically connected with the second electrode REL2 provided and/or formed over the second end portion EP2.

FIGS. 20A to 20K are sectional diagrams sequentially illustrating a method of manufacturing the display device illustrated in FIG. 18.

Referring to FIGS. 1A, 1B, 17, 18, and 20A, the pixel circuit layer PCL of each of the first to third sub-pixels SP1, SP2, and SP3 is formed. The pixel circuit layer PCL may include at least one or more transistors T, a driving voltage line DVL, and a passivation layer PSV. Here, the passivation layer PSV may include a first contact hole CH1 which exposes the second terminal DE of the driving transistor (refer to T1 of FIG. 8) of the transistors T, and a second contact hole CH2 which exposes the driving voltage line DVL.

Referring to FIGS. 1A, 1B, 17, 18, 20A, and 20B, the partition wall PW is formed on the passivation layer PSV of the emission area EMA of each sub-pixel.

The partition wall PW may include, in the emission area EMA of each sub-pixel, at least one opening OPN corresponding to an area in which the light emitting elements LD are aligned (or disposed). The partition wall PW may include an inorganic insulating layer formed of inorganic material or an organic insulating layer formed of organic material. In an embodiment, the partition wall PW may include a single organic insulating layer and/or a single inorganic insulating layer, but the present disclosure is not limited thereto. For example, the partition wall PW may have a multi-layer structure formed by stacking at least one or more organic insulating layers and at least one or more inorganic insulating layers.

Referring to FIGS. 1A, 1B, 17, 18, and 20A to 20C, the first electrode REL1, the contact electrode CNE, and the connection line CNL that include conductive material having a high reflectivity are formed on the passivation layer PSV of each sub-pixel including the partition wall PW.

Each of the first electrode REL1 and the contact electrode CNE may be formed on the partition wall PW in the emission area EMA of each sub-pixel. The contact electrode CNE may be integrally provided with the connection line CNL, and electrically and/or physically connected with the connection line CNL. The first electrode REL1 may be spaced apart from the contact electrode CNE by a set or predetermined distance and electrically and/or physically separated from the contact electrode CNE. Furthermore, the first electrode REL1 may be electrically connected to the second terminal DE of at least one transistor T included in the pixel circuit layer PCL of each sub-pixel, e.g., the driving transistor (refer to T1, T of FIG. 8).

Referring to FIGS. 1A, 1B, 17, 18, and 20A to 20D, after an insulating material layer is formed on the first electrode REL1, the contact electrode CNE, and the connection line CNL, the insulating pattern INSP allowing one area of the first electrode REL1 to be exposed is formed using a mask. The insulating pattern INSP may be formed of an inorganic insulating layer including inorganic material, or an organic insulating layer including organic material.

Referring to FIGS. 1A, 1B, 17, 18, and 20A to 20E, a plurality of light emitting elements LD are input into the emission area EMA of each sub-pixel by an inkjet printing scheme or the like. For example, the light emitting elements LD may be input into the emission area EMA of each sub-pixel by disposing a nozzle over the passivation layer PSV included in the pixel circuit layer PCL of each sub-pixel and dropping a fluidic solution 100 (or a solvent) including the light emitting elements LD through the nozzle. Here, the fluidic solution 100 (or the solvent) may be formed of organic material capable of being hardened by heat or light. The fluidic solution 100 (or the solvent) including the plurality of light emitting elements LD may be provided in such a way that it is charged into each opening OPN of the partition wall PW in the emission area EMA of each sub-pixel.

In an embodiment of the present disclosure, each of the light emitting elements LD may include a light emitting pattern 10 which has a core-shell structure and includes a first conductive semiconductor layer 11 disposed in a central area, an active layer 12 which encloses the first conductive semiconductor layer 11, a second conductive semiconductor layer 13 which encloses the active layer 12, and an electrode layer 15 which encloses the second conductive semiconductor layer 13. Each of the light emitting elements LD may further include an insulating film 14 which encloses the outer peripheral (e.g., circumferential) surface (or the surface) of the light emitting pattern 10 having a core-shell structure. Here, the bottom surface of the first conductive semiconductor layer 11 that is disposed on the first end portion EP1 of each light emitting element LD may not be covered with the insulating film 14.

Referring to FIGS. 1A, 1B, 17, 18, and 20A to 20F, a transparent base substrate TBS is disposed over the partition wall PW of each sub-pixel.

Here, a conductive layer CL is formed and/or disposed on one surface of the transparent base substrate TBS. For example, the transparent base substrate TBS may be disposed over the passivation layer PSV such that the conductive layer CL formed on the one surface of the transparent base substrate TBS faces the partition wall PW. Thereafter, the first electrodes REL1 and the conductive layer CL are respectively applied with corresponding alignment voltages through alignment lines so that an electric field is formed between the first electrode REL1 and the conductive layer CL. In the case where AC power or DC power having set or predetermined voltage and cycle is repeatedly applied several times to each of the first electrode REL1 and the conductive layer CL, an electric field may be formed between the first electrode REL1 and the conductive layer CL by a difference in potential between the first electrode REL1 and the conductive layer CL. Here, because the first electrode REL1 is disposed under the conductive layer CL with the partition wall PW interposed therebetween, a vertical electric field may be formed between the first electrode REL1 and the conductive layer CL.

Each of the light emitting elements LD included in the fluidic solution 100 (or the solvent) may be aligned (or disposed) in the longitudinal direction (L) by the vertical electric field formed between the first electrode REL1 and the conductive layer CL. Here, the longitudinal direction (L) may refer to a vertical direction in a sectional view.

The first end portion EP1 of each of the light emitting elements LD, e.g., the lower surface of the first conductive semiconductor layer 11 that is not covered with the insulating film 14, may be directly coupled (or connected) to the first electrode REL1 that is not covered with the insulating pattern INSP. Each of the light emitting elements LD may be spaced apart from an adjacent light emitting element LD by a set or predetermined distance with the insulating pattern INSP interposed therebetween.

Subsequently, after the light emitting elements LD are aligned (or disposed) in the emission area EMA of each sub-pixel, the transparent base substrate TBS on which the conductive layer CL is disposed is removed.

Referring to FIGS. 1A, 1B, 17, 18, and 20A to 20G, the fluidic solution 100 (or the solvent) is hardened by applying light or heat to the fluidic solution 100 (or the solvent) that is provided in the form of being charged into the opening OPN of the partition wall PW in the emission area EMA of each sub-pixel, whereby an intermediate material layer CTL' is formed. The intermediate material layer CTL' formed by hardening the fluidic solution 100 (or the solvent) may further stably fix the light emitting elements LD aligned (or disposed) in the vertical direction. Here, the intermediate material layer CTL' covers the entirety of the outer peripheral (e.g., circumferential) surface (or the surface) of each of the light emitting elements LD to prevent or reduce exposure of each light emitting element LD to the outside.

Referring to FIGS. 1A, 1B, 17, 18, and 20A to 20H, the intermediate layer CTL that allows the respective second end portions EP2 of the light emitting elements LD to be exposed is formed by removing a portion of the intermediate material layer CTL' using a mask.

The electrode layer 15 enclosed by the insulating film 14 may be provided on the second end portion EP2 of each of the light emitting elements LD that is exposed rather than being covered with the intermediate layer CTL.

Referring to FIGS. 1A, 1B, 17, 18, and 20A to 20I, after photosensitive material is applied onto the substrate SUB including the intermediate layer CTL and a mask is disposed thereon, a photosensitive pattern which covers the intermediate layer CTL and the insulating pattern INSP on the first electrode REL1 is formed.

Thereafter, the insulating film 14 that is disposed on the respective second end portion EP2 of the light emitting elements LD and is not covered with the photosensitive pattern is removed using the photosensitive pattern as an etching mask. Concurrently or simultaneously, the first insulating layer INS1 that allows one area of the contact electrode CNE to be exposed to the outside may be eventually formed by removing the insulating pattern INSP on the contact electrode CNE. The exposed one area of the contact electrode CNE may be electrically and/or physically connected with the second electrode REL2 to be formed through a process to be described below.

The photosensitive pattern used as an etching mask may be removed by any suitable wet or dry etching method, but the present disclosure is not limited thereto, and it may be removed by any other suitable removal methods.

Referring to FIGS. 1A, 1B, 17, 18, and 20A to 20J, after the respective second end portions EP2 of the light emitting elements LD are exposed to the outside and a conductive material layer is formed on the passivation layer PSV, the second electrode REL2 is formed by patterning the conductive material layer using a mask.

The second electrode REL2 is formed on the respective exposed second end portions EP2 of the light emitting elements LD and electrically and/or physically connected with the second end portion EP2 of each light emitting element LD. The second electrode REL2 may be directly coupled (or connect) to the second end portion EP2 of each of the light emitting elements LD.

In addition, the second electrode REL2 is formed on the exposed contact electrode CNE and electrically and/or physically connected with the contact electrode CNE.

Referring to FIGS. 1A, 1B, 17, 18, and 20A to 20K, the second insulating layer INS2 is formed on the second electrode REL2.

The second insulating layer INS2 may be formed of an inorganic insulating layer including inorganic material, or an organic insulating layer including organic material. Although the second insulating layer INS2 may have a single layer structure as shown in the drawing, the present disclosure is not limited thereto. For example, the second insulating layer INS2 may have a multi-layer structure.

Subsequently, the overcoat layer OC is formed on the second insulating layer INS2.

In the display device eventually manufactured through the above-mentioned manufacturing process, the light emitting elements LD are aligned (or disposed) in the longitudinal direction (L) (or in the vertical direction in a sectional view) in the emission area EMA of each sub-pixel during a process of manufacturing the display element layer DPL, so that light emitted from each light emitting element LD may travel in the frontal direction of the display device without loss. Consequently, the display device in accordance with an embodiment of the present disclosure may further enhance the efficiency of light emitted from each of the light emitting elements LD.

Furthermore, in the above-described display device, the first electrode REL1 and the first end portion EP1 of each light emitting element LD are directly coupled (or brought into direct contact) with each other, and the second end portion EP2 of each light emitting element LD and the second electrode REL2 are directly coupled (or brought into direct contact) with each other. Therefore, a valid contact surface area of the first and second electrodes REL1 and REL2 and each light emitting element LD may be further increased.

The increase in the valid contact surface area of each light emitting element LD may minimize or reduce contact defects of the corresponding light emitting element LD and reduce contact resistance of each of the first and second electrodes REL1 and REL2. Hence, the characteristics of each light emitting element LD are enhanced, so that the output efficiency of light emitted from each light emitting element LD can be further enhanced.

Figure 21:
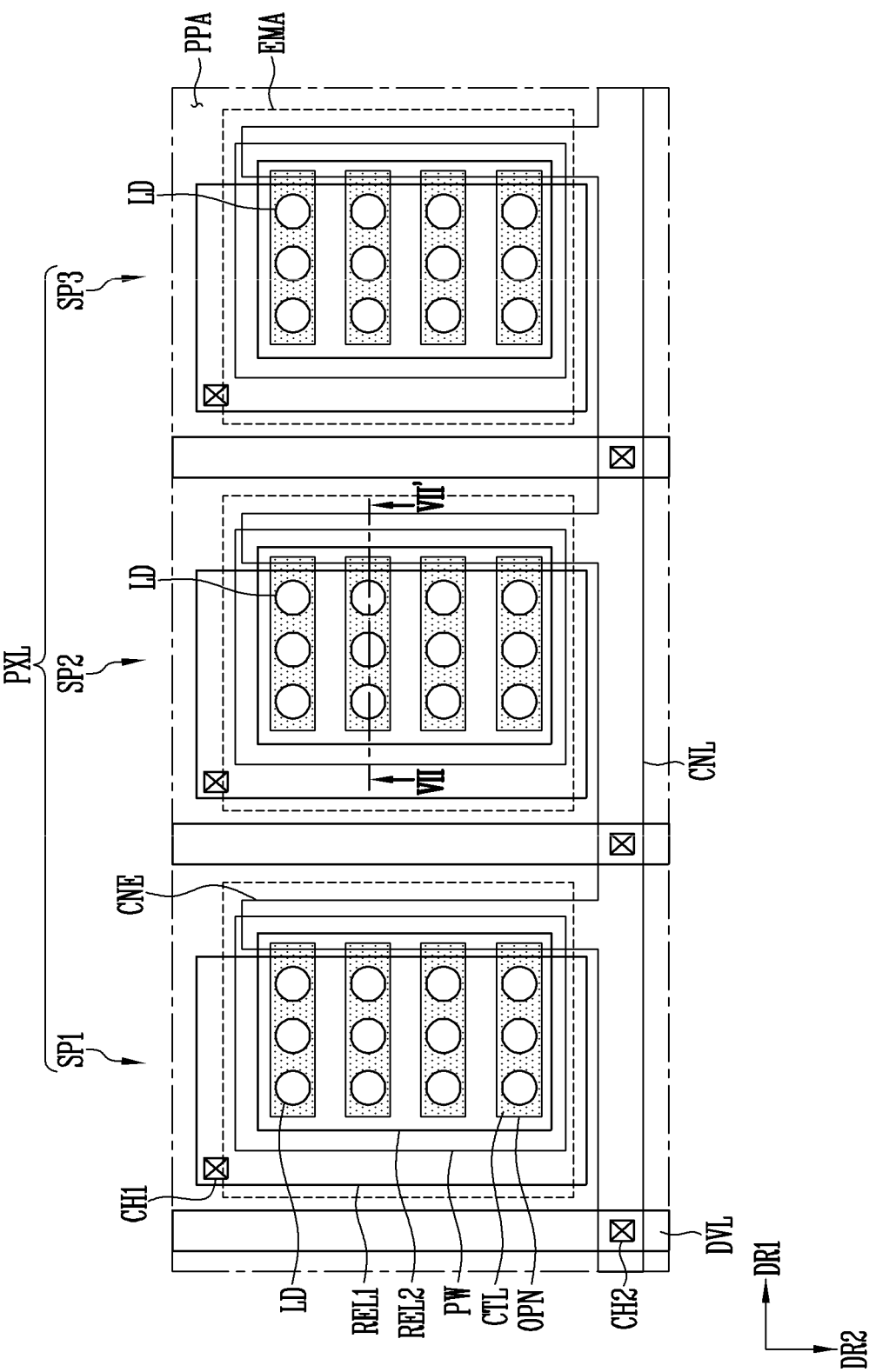
FIG. 21 is a plan diagram schematically illustrating first to third sub-pixels included in one pixel of a display device in accordance with an embodiment of the present disclosure.
Figure 22:
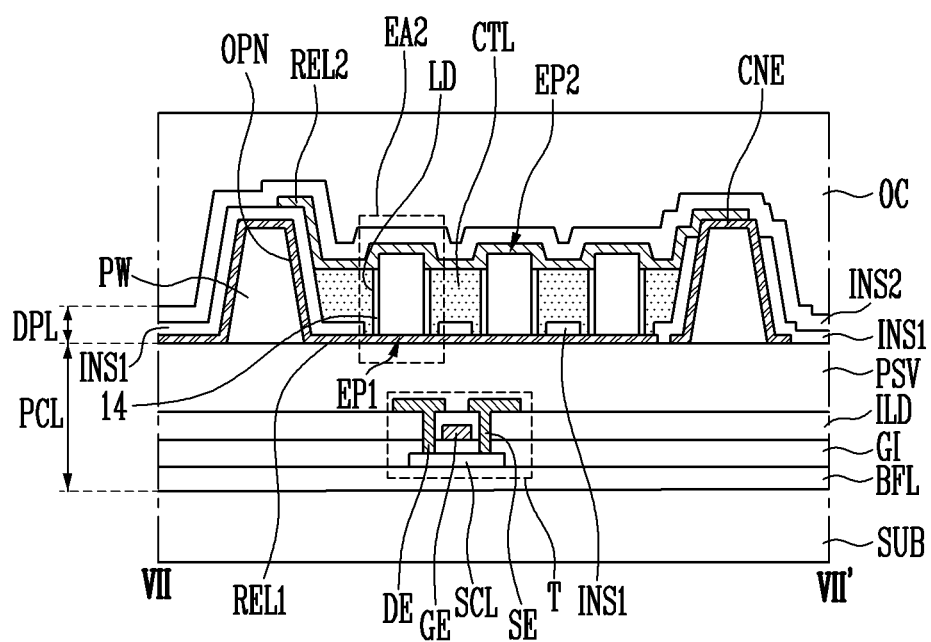
FIG. 22 is a sectional view taken along line VII-VII' of FIG. 21.

FIG. 21 is a plan diagram schematically illustrating first to third sub-pixels included in one pixel of a display device in accordance with an embodiment of the present disclosure. FIG. 22 is a sectional view taken along line VII-VII' of FIG. 21. FIG. 23A is an enlarged sectional view of portion EA2 of FIG. 22. FIG. 23B illustrates another shape of the light emitting element shown in FIG. 23A, and is an enlarged sectional view corresponding to portion EA2 of FIG. 22.

For the sake of explanation, illustration of transistors connected to the light emitting elements, and signal lines connected to the transistors has been omitted in FIG. 21. The configuration of the pixel illustrated in FIG. 21, other than the fact that each of the light emitting elements has a cylindrical shape, may be substantially equal or similar to that of the pixel of FIG. 17.

Therefore, with regard to the pixel of FIG. 21, the following description will be focused on differences from that of the foregoing embodiments, to avoid redundant explanation. Components which are not separately explained in the following description of the present embodiment comply with that of the foregoing embodiments. The same reference numeral will be used to designate the same component, and a similar reference numeral will be used to designate a similar component.

Referring to FIGS. 2A, 2B, 21, 22, 23A, and 23B, the display device in accordance with an embodiment of the present disclosure may include a substrate SUB on which a plurality of pixels PXL are provided. Each pixel PXL may include first to third sub-pixels SP1 to SP3. Each sub-pixel may include a pixel circuit layer PCL provided on the substrate SUB, and a display element layer DPL provided on the pixel circuit layer PCL.

The display element layer DPL of each of the first to third sub-pixels SP1 to SP3 may include a first electrode REL1, a contact electrode CNE, a connection line CNL, a partition wall PW, light emitting elements LD, an intermediate layer CTL, and a second electrode REL2.

The partition wall PW may be provided in a shape enclosing each of the light emitting elements LD in the emission area EMA of each sub-pixel and include at least one opening OPN which exposes the light emitting elements LD and the intermediate layer CTL in a plan view.

Each of the light emitting elements LD may include a stacked light emitting pattern 10 which includes, with respect to the longitudinal direction (L), a first conductive semiconductor layer 11, an active layer 12 disposed on the first conductive semiconductor layer 11, a second conductive semiconductor layer 13 disposed on the active layer 12, and an electrode layer 15 disposed on the second conductive semiconductor layer 13. Each of the light emitting elements LD may further include an insulating film 14 which encloses the outer peripheral (e.g., circumferential) surface (or the surface) of the stacked light emitting pattern 10.

The insulating film 14 may enclose the entirety or a portion of the outer peripheral (e.g., circumferential) surface (the surface) of the stacked light emitting pattern 10. For example, as illustrated in FIG. 23A, the insulating film 14 may enclose the outer peripheral (e.g., circumferential) surfaces (or the surfaces) of components of the stacked light emitting pattern 10 other than the electrode layer 15 disposed at an upper side in the stacked light emitting pattern 10 with respect to the longitudinal direction (L) of each light emitting element LD. In other words, the insulating film 14 may enclose the outer peripheral (e.g., circumferential) surface (or the surface) of each of the first conductive semiconductor layer 11, the active layer 12, and the second conductive semiconductor layer 13 that are disposed at a lower side in the stacked light emitting pattern 10 with respect to the longitudinal direction (L) of each light emitting element LD, and may not enclose the outer peripheral (e.g., circumferential) surface (or the surface) of the electrode layer 15. In other words, the electrode layer 15 of each of the light emitting elements LD may not be covered with the insulating film 14.

In an embodiment, as illustrated in FIG. 23B, the insulating film 14 may enclose the outer peripheral (e.g., circumferential) surfaces (or the surfaces) of components of the stacked light emitting pattern 10, other than the electrode layer 15 disposed at an upper side in the stacked light emitting pattern 10 with respect to the longitudinal direction (L) of each light emitting element LD and one area of the first conductive semiconductor layer 11 disposed under the electrode layer 15.

In an embodiment of the present disclosure, in each of the light emitting elements LD, the first conductive semiconductor layer 11 disposed at a lower position with respect to the longitudinal direction (L) of the light emitting element LD may be directly coupled (or brought into direct contact) with the first electrode REL1, and the electrode layer 15 disposed thereover may be directly coupled (or brought into direct contact) with the second electrode REL2. Hence, each of the light emitting elements LD in the emission area EMA of each sub-pixel may be disposed between the first electrode REL1 and the second electrode REL2 with respect to the longitudinal direction (L). In other words, each of the light emitting elements LD may be aligned (or disposed) in the vertical direction in a sectional view.

A set or predetermined voltage may be applied to the first conductive semiconductor layer 11 disposed on the first end portion EP1 of each of the light emitting elements LD through the first electrode REL1. A set or predetermined voltage may be applied to the electrode layer 15 disposed on the second end portion EP2 through the second electrode REL2. Hence, each of the light emitting elements LD may emit light by coupling of electron-hole pairs in the active layer 12 of each of the light emitting elements LD.

In an embodiment of the present disclosure, because each of the light emitting elements LD is aligned (or disposed) in the longitudinal direction (L) (or in the vertical direction in a sectional view), the entirety of the active layer 12 of each light emitting element LD may be enclosed by the first electrode REL1 and the contact electrode CNE without facing pixel circuit layer PCL. Hence, light emitted from each light emitting element LD may be reflected by the first electrode REL1 and the contact electrode CNE in the frontal direction of the display device (e.g., in the direction in which an image is displayed) without loss. Consequently, the efficiency of light emitted from each light emitting element LD may be enhanced.

Each of the light emitting elements LD may be fixed by the intermediate layer CTL provided in the form of being charged into the opening OPN of the partition wall PW between the first electrode REL1 and the second electrode REL2. The intermediate layer CTL may be formed and/or provided in such a way that it is hardened by heat or light during a process of aligning light emitting elements LD after a fluidic solution (or a solvent) including the light emitting elements LD has been input into the emission area EMA of each sub-pixel.

Each of the light emitting elements LD aligned (or disposed) in one opening OPN of the partition wall PW in the emission area EMA of each sub-pixel may be minimized or reduced by the first insulating layer INS1 from being directly electrically and/or physically brought into contact (or coupled) with an adjacent light emitting element LD. In detail, the first insulating layer INS1 may be disposed between adjacent light emitting elements LD, thus preventing or reducing an undesired short-circuit which may occur between the light emitting elements LD when a plurality of light emitting elements LD are closely disposed, and guiding an alignment (or disposition) position of each light emitting element LD.

FIG. 24 is a sectional view schematically illustrating a display device including a color conversion layer in accordance with an embodiment of the present disclosure.

FIG. 24 schematically illustrates a pixel area of one pixel of a plurality of pixels included in the display device, for the convenience sake of explanation. Furthermore, for the convenience sake, in FIG. 24, structures of some components equal to those of the display device that are described in more detail with reference to FIGS. 5 to 23B are schematically illustrated, and duplicative detailed explanation thereof will not be repeated here.

Referring to FIGS. 1A, 1B, 17, 18, and 24, the display device in accordance with an embodiment of the present disclosure may include a display panel that includes a first substrate SUB1 on which at least one pixel PXL (hereinafter, referred to as 'pixel') including first to third sub-pixels SP1, SP2, and SP3 is provided, and a second substrate SUB2 coupled with the first substrate SUB1.

In an embodiment of the present disclosure, the pixel PXL is formed and/or provided in the pixel area PXA defined and/or provided on the first substrate SUB1. The pixel area PXA may include sub-pixel areas SPA, that is, the pixel area PXA may include a first sub-pixel area SPA1 on which a first sub-pixel SP1 is formed and/or provided, a second sub-pixel area SPA2 on which a second sub-pixel SP2 is formed and/or provided, and a third sub-pixel area SPA3 on which a third sub-pixel SP3 is formed and/or provided.

In an embodiment of the present disclosure, the first sub-pixel SP1 may be a first color sub-pixel, the second sub-pixel SP2 may be a second color sub-pixel, and the third sub-pixel SP3 may be a third color sub-pixel. Here, the first color may include any one color selected from red, green, and blue, the second color may include one of the other two colors, and the third color may include the other one color. For example, in the case where the first color includes red, the second color may include one color of green and blue, and the third color may include the other one color of green and blue.

In an embodiment of the present disclosure, the first substrate SUB1 may include a substrate SUB, and a pixel circuit layer PCL provided on the substrate SUB. The display element layer DPL may be provided on the first substrate SUB1.

The display element layer DPL may include a partition wall PW, a first electrode REL1, a contact electrode CNE, a plurality of light emitting elements LD, an intermediate layer CTL, and a second electrode REL2, in the emission area EMA of each sub-pixel. Furthermore, the display element layer DPL may include a bank BNK disposed in a boundary area (e.g., the peripheral area PPA) provided between the emission area EMA of each of the first to third sub-pixels SP1, SP2, and SP3 and an emission area EMA of a sub-pixel adjacent thereto.

The bank BNK may be disposed around the display area DA to enclose the display area (refer to DA of FIG. 3) in which the first to third sub-pixels SP1, SP2, and SP3 are disposed. In other words, the bank BNK may be disposed in the non-display area NDA which encloses the perimeter of the display area DA.

The bank BNK may be a structure which defines the emission area EMA of each sub-pixel, and for example be a pixel defining layer. The bank BNK may include at least one light shielding material and/or reflective material and thus prevent or reduce a light leakage phenomenon, in which light leaks between adjacent pixels, from occurring. In an embodiment, a reflective material layer may be formed on the bank BNK to further enhance the efficiency of light emitted from each sub-pixel. The bank BNK may be formed and/or provided on the same surface as that of some components included in the display element layer DPL, e.g., that of the partition wall PW. In other words, the bank BNK may be formed and/or provided on the first substrate SUB1. In an embodiment, the bank BNK may be formed on a layer different from that of the partition wall PW. In the case where the bank BNK is formed and/or provided on the same surface as that of the partition wall PW, the bank BNK and the partition wall PW may include the same material, but the present disclosure is not limited thereto. In an embodiment, the bank BNK and the partition wall PW may include different materials.

The second substrate SUB2 may be disposed over the first substrate SUB1 to cover the display area DA in which the first to third sub-pixels SP1, SP2, and SP3 are disposed. The second substrate SUB2 may form an upper substrate (e.g., an encapsulation substrate or a thin-film encapsulation layer) of the display panel and/or a window component. In an embodiment, the second substrate SUB2 may be a rigid substrate or a flexible substrate, and the material or properties thereof are not particularly limited. Furthermore, the second substrate SUB2 may be formed of the same material as that included in the first substrate SUB1, or may be formed of material different from that of the first substrate SUB1.

Furthermore, the display panel may include a light conversion pattern layer LCP disposed on one surface of the second substrate SUB2 to face the first to third sub-pixels SP1 to SP3 on the first substrate SUB1.

In an embodiment, the light conversion pattern layer LCP may include a first light conversion pattern layer LCP1 disposed to face the first sub-pixel SP1, a second light conversion pattern layer LCP2 disposed to face the second sub-pixel SP2, and a third light conversion pattern layer LCP3 disposed to face the third sub-pixel SP3. In an embodiment, at least some of the first to third light conversion pattern layers LCP1, LCP2, and LCP3 may include a color conversion layer CCL and/or a color filter CF corresponding to a set or predetermined color.

For example, the first light conversion pattern layer LCP1 may include a first color conversion layer CCL1 including first color conversion particles corresponding to a first color, and a first color filter CF1 configured to allow the first color of light to selectively pass therethrough. Likewise, the second light conversion pattern layer LCP2 may include a second color conversion layer CCL2 including second color conversion particles corresponding to a second color, and a second color filter CF2 configured to allow the second color of light to selectively pass therethrough. The third light conversion pattern layer LCP3 may include at least one of a light scattering layer LSL including light scattering particles SCT, and a third color filter CF3 configured to allow the third color of light to selectively pass therethrough.

In an embodiment of the present disclosure, the light emitting elements LD aligned (or disposed) in the emission area EMA of each of the first to third sub-pixels SP1 to SP3 may emit the same color light. For example, the light emitting elements LD aligned (or disposed) in the emission area EMA of each of the first to third sub-pixels SP1 to SP3 may emit blue light. A color conversion layer CCL may be disposed on at least some sub-pixels of the first to third sub-pixels SP1 to SP3. For example, the first color conversion layer CCL1 may be disposed over the first sub-pixel SP1, and the second color conversion layer CCL2 may be disposed over the second sub-pixel SP2. Consequently, the display device in accordance with an embodiment of the present disclosure may display a full-color image.

In an embodiment, the first color conversion layer CCL1 may be disposed on one surface of the second substrate SUB2 to face the first sub-pixel SP1 and include first color conversion particles which convert the color of light emitted from light emitting elements LD provided on the corresponding sub-pixel to a first color of light. For example, in the case where the first sub-pixel SP1 is a red sub-pixel, the first color conversion layer CCL1 may include red quantum dots QDr which convert blue light emitted from the light emitting elements LD aligned (or disposed) in the emission area EMA of the first sub-pixel SP1 to red light. If blue light is drawn into the first color conversion layer CCL1 including the red quantum dots QDr, the first color conversion layer CCL1 may absorb the blue light, shift the wavelength of the light by an energy transition, and emit red light having a wavelength in a range from approximately 620 nm to approximately 680 nm.

In an embodiment, the second color conversion layer CCL2 may be disposed on one surface of the second substrate SUB2 to face the second sub-pixel SP2 and include second color conversion particles which convert the color of light emitted from light emitting elements LD provided on the corresponding sub-pixel to a second color of light. For example, in the case where the second sub-pixel SP2 is a green sub-pixel, the second color conversion layer CCL2 may include green quantum dots QDg which convert blue light emitted from the light emitting elements LD aligned (or disposed) in the emission area EMA of the second sub-pixel SP2 to green light. If blue light is drawn into the second color conversion layer CCL2 including the green quantum dots QDg, the second color conversion layer CCL2 may absorb the blue light, shift the wavelength of the light by an energy transition, and emit green light having a wavelength in a range from approximately 500 nm to approximately 560 nm.

In an embodiment of the present disclosure, the red quantum dots QDr and the green quantum dots QDg may be selected from among a group III-V compound, a group IV-VI compound, a group IV element, a group IV compound, and a combination thereof.

The light scattering layer LSL may be disposed on one surface of the second substrate SUB2 to face the third sub-pixel SP3. For example, the light scattering layer LSL may be disposed between the third sub-pixel SP3 and the third color filter CF3.

The first color filter CF1 may be disposed between the first color conversion layer CCL1 and the second substrate SUB2 and include color filter material which allows the first color of light converted by the first color conversion layer CCL1 to selectively pass therethrough. For example, the first color filter CF1 may be a red color filter.

The second color filter CF2 may be disposed between the second color conversion layer CCL2 and the second substrate SUB2 and include color filter material which allows the second color of light converted by the second color conversion layer CCL2 to selectively pass therethrough. For example, the second color filter CF2 may be a green color filter.

The third color filter CF3 may be disposed on one surface of the second substrate SUB2 to face the third sub-pixel SP3 and include color filter material which allows the light emitted from the light emitting elements LD aligned (or disposed) in the emission area EMA of the corresponding sub-pixel to selectively pass therethrough. For example, the third color filter CF3 may be a blue color filter.

A black matrix BM may be disposed each between the first color filter CF1 and the second color filter CF2 and between the second color filter CF2 and the third color filter CF3. For example, the black matrix BM may be disposed on the second substrate SUB2 to overlap with the bank BNK on the first substrate SUB1.

In an embodiment of the present disclosure, when blue light having a comparatively short wavelength in a visible ray area is incident on each of the red and green quantum dots QDr and QDg, the absorption coefficient of the red and green quantum dots QDr and QDg may be increased. Thereby, eventually, the efficiency of light emitted from each of the first sub-pixel SP1 and the second sub-pixel SP2 may be enhanced, and suitable or satisfactory color reproducibility may be secured.

Furthermore, in an embodiment of the present disclosure, each pixel PXL using the light emitting elements LD for emitting the same color light and the display device including the same may be easily manufactured. Because the color conversion layer CCL is disposed on at least some sub-pixels, a display device including full-color pixels PXL may be manufactured.

Each of the light emitting elements LD aligned (or disposed) in the emission area EMA of each sub-pixel may have opposite end portions EP1 and EP2 each having a shape protruding in the longitudinal direction (L). Each of the light emitting elements LD may be aligned (or disposed) in the longitudinal direction (L) (e.g., in the vertical direction in a sectional view) in the emission area EMA of each sub-pixel. For example, each of the light emitting elements LD may be aligned (or disposed) between the first electrode REL1 and the second electrode REL2 in the opening OPN included in the partition wall PW. In each of the light emitting elements LD, the first end portion EP1 disposed at a lower side in the longitudinal direction (L) may be brought into direct contact with (or directly coupled with) the first electrode REL1, and the second end portion EP2 disposed at an upper side may be brought into direct contact with (or directly coupled with) the second electrode REL2.

The light emitting elements LD may be stably fixed in the longitudinal direction (L) (or in the vertical direction in a sectional view) by the intermediate layer CTL provided in the form of being charged into the opening OPN of the partition wall PW. In the case where each of the light emitting elements LD is aligned in the vertical direction, light emitted from all areas in which the active layer 12 of each light emitting element LD is disposed may travel in the frontal direction of the display device (e.g., in the direction in which an image is displayed) without being absorbed or lost by a light absorption structure such as the pixel circuit layer PCL. Hence, the light output efficiency of the light emitting elements LD aligned (or disposed) in the emission area EMA of each sub-pixel may be enhanced.

While various embodiments have been described above, those skilled in the art will appreciate that various modifications, additions and substitutions are possible, without departing from the scope and spirit of the present disclosure.

Therefore, the embodiments disclosed in this specification are only for illustrative purposes rather than limiting the technical spirit of the present disclosure. The scope of the present disclosure must be defined by the accompanying claims.

The invention claimed is:
1. A display device comprising:
   a substrate comprising a display area and a non-display area; and
   a plurality of pixels in the display area, and each comprising a plurality of sub-pixels,
   wherein each of the sub-pixels comprises a pixel circuit layer, and a display element layer comprising at least one light emitting element to emit light,
   wherein the display element layer comprises:
      a first electrode on the pixel circuit layer;
      a second electrode on the first electrode and electrically insulated from the first electrode;
      the light emitting element comprising a first end portion coupled to the first electrode and a second end portion coupled to the second electrode, and between the first electrode and the second electrode;
      an intermediate layer enclosing at least one area of the light emitting element, and on the first electrode; and
      a connection line on an identical surface with the first electrode and electrically connected to the second electrode,
   wherein the second electrode is on the intermediate layer.
2. The display device according to claim 1,
   wherein the first end portion of the light emitting element is on a lower end portion of the light emitting element with respect to a longitudinal direction of the light emitting element, and
   wherein the second end portion of the light emitting element is on an upper end portion of the light emitting element with respect to the longitudinal direction of the light emitting element.
3. The display device according to claim 2, wherein the first end portion of the light emitting element is in direct contact with the first electrode, and the second end portion of the light emitting element is in direct contact with the second electrode.
4. The display device according to claim 3, wherein the light emitting element is aligned in an emission area of each of the plurality of sub-pixels with respect to the longitudinal direction of the light emitting element.
5. The display device according to claim 3, wherein the second electrode overlaps with the first electrode, in a plan view.
6. The display device according to claim 5, wherein the intermediate layer comprises a hardening material, and exposes the second end portion of the light emitting element.
7. The display device according to claim 6, wherein the light emitting element comprises:
   a core-shell light emitting pattern comprising a first semiconductor layer, an active layer enclosing at least a portion of the first semiconductor layer, a second semiconductor layer configured to enclose at least a portion of the active layer, and an electrode layer enclosing at least a portion of the second semiconductor layer; and an insulating film enclosing a portion of an outer peripheral surface of the core-shell light emitting pattern, and wherein a portion of the electrode layer is in direct contact with the second electrode rather than being covered with the insulating film.

8. The display device according to claim 7, wherein the intermediate layer comprises a plurality of conductive particles.

9. The display device according to claim 8, further comprising an insulating pattern between the intermediate layer and the second electrode.

10. The display device according to claim 3, wherein the display element layer further comprises a contact electrode on an identical surface with the connection line and provided integrally with the connection line.

11. The display device according to claim 10, further comprising a bank pattern between the pixel circuit layer and the first electrode and between the pixel circuit layer and the contact electrode, the bank pattern having an opening that exposes one area of the first electrode.

12. The display device according to claim 11, wherein the intermediate layer is charged into the opening of the bank pattern.

13. The display device according to claim 12, wherein the bank pattern has a height greater than a length of the light emitting element.

14. The display device according to claim 13, further comprising an insulating layer covering each of at least a portion of the first electrode on the bank pattern and at least a portion of the contact electrode on the bank pattern.

15. The display device according to claim 12, wherein the display element layer further comprises a reflective layer on the bank pattern and overlapping with the first electrode.

16. The display device according to claim 15, wherein the intermediate layer is in contact with at least one area of the reflective layer.

17. The display device according to claim 16, wherein the reflective layer comprises any one selected from conductive material having a set reflectivity, and a dielectric mirror comprising a plurality of dielectric thin-films having different refractive indexes.

18. A method of manufacturing a display device, comprising:
    forming, on a substrate, a bank pattern having an opening that exposes at least a portion of the substrate;
    forming a first electrode and a contact electrode spaced apart from the first electrode on the bank pattern;
    supplying a solvent comprising a plurality of light emitting elements into the opening;
    preparing a base substrate having one surface on which a conductive layer is located, and locating the base substrate over the substrate such that the conductive layer faces the wall bank pattern;
    aligning the plurality of light emitting elements between the first electrode and the conductive layer by applying a corresponding alignment voltage to each of the first electrode and the conductive layer;
    forming an intermediate layer that exposes at least a portion of each of the plurality of light emitting elements, by hardening the solvent and removing at least a portion of the hardened solvent through an ashing process; and
    forming a second electrode on the intermediate layer.

19. The method according to claim 18, wherein each of the light emitting elements comprises a first end portion directly coupled to the first electrode, and a second end portion directly coupled to the second electrode, and is aligned in a longitudinal direction of the light emitting element.

20. The method according to claim 19, further comprising: before forming the second electrode, removing a portion of an insulating film of each of the light emitting elements; and exposing a portion of the contact electrode.

* * * * *

UNITED STATES PATENT AND TRADEMARK OFFICE
CERTIFICATE OF CORRECTION

PATENT NO. : 11,935,986 B2
APPLICATION NO. : 17/298445
DATED : March 19, 2024
INVENTOR(S) : Dong Uk Kim et al.

It is certified that error appears in the above-identified patent and that said Letters Patent is hereby corrected as shown below:

In the Claims

In Column 48, Line 17, in Claim 18, delete "wall bank" and insert -- bank --.

Signed and Sealed this
Second Day of July, 2024

Katherine Kelly Vidal
*Director of the United States Patent and Trademark Office*